(12) United States Patent
Lin et al.

(10) Patent No.: US 8,324,723 B2
(45) Date of Patent: Dec. 4, 2012

(54) SEMICONDUCTOR CHIP ASSEMBLY WITH BUMP/BASE HEAT SPREADER AND DUAL-ANGLE CAVITY IN BUMP

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 249 days.

(21) Appl. No.: 12/950,999

(22) Filed: Nov. 20, 2010

(65) Prior Publication Data

US 2011/0079811 A1 Apr. 7, 2011

Related U.S. Application Data

(63) Continuation-in-part of application No. 12/911,729, filed on Oct. 26, 2010, which is a continuation-in-part of application No. 12/616,773, filed on Nov. 11, 2009, now Pat. No. 8,067,784, and a continuation-in-part of application No. 12/616,775, filed on Nov. 11, 2009, said application No. 12/616,773 is a continuation-in-part of application No. 12/557,540, filed on Sep. 11, 2009, which is a continuation-in-part of application No. 12/406,510, filed on Mar. 18, 2009, and a continuation-in-part of application No. 12/557,541, filed on Sep. 11, 2009, now Pat. No. 7,948,076, which is a continuation-in-part of application No. 12/406,510, filed on Mar. 18, 2009, said application No. 12/616,775 is a continuation-in-part of application No. 12/557,540, filed on Sep. 11, 2009, which is a continuation-in-part of application No. 12/406,510, filed on Mar. 18, 2009, and a continuation-in-part of application No. 12/557,541, filed on Sep. 11, 2009, now Pat. No. 7,948,076, which is a continuation-in-part of application No. 12/406,510, filed on Mar. 18, 2009.

(60) Provisional application No. 61/380,201, filed on Sep. 4, 2010, provisional application No. 61/330,318, filed on May 1, 2010, provisional application No. 61/071,589, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009, provisional application No. 61/071,588, filed on May 7, 2008.

(51) Int. Cl.
H01L 23/34 (2006.01)
H01L 21/00 (2006.01)
H05K 7/20 (2006.01)

(52) U.S. Cl. ........ 257/707; 257/713; 257/717; 257/720; 257/E23.051; 257/E23.101; 438/122; 361/710

(58) Field of Classification Search ........................ None
See application file for complete search history.

(56) References Cited

U.S. PATENT DOCUMENTS 3,689,993 A 9/1972 Tolar .............................. 438/380
(Continued)

FOREIGN PATENT DOCUMENTS

JP 2005-166775 6/2005

*Primary Examiner* — Alonzo Chambliss
(74) *Attorney, Agent, or Firm* — Jackson IPG PLLC

(57) ABSTRACT

A semiconductor chip assembly includes a semiconductor device, a heat spreader, a conductive trace and an adhesive. The heat spreader includes a bump that includes first, second and third bent corners that shape a cavity. The conductive trace includes a pad and a terminal. The semiconductor device is located within the cavity, is electrically connected to the conductive trace and is thermally connected to the bump. The bump extends into an opening in the adhesive and provides a recessed die paddle and a reflector for the semiconductor device. The conductive trace provides signal routing between the pad and the terminal.

65 Claims, 49 Drawing Sheets

U.S. PATENT DOCUMENTS

| | | | | |
|---|---|---|---|---|
| 3,969,199 | A | 7/1976 | Berdan et al. | 205/177 |
| 4,420,767 | A | 12/1983 | Hodge et al. | 257/713 |
| 4,509,096 | A | 4/1985 | Baldwin et al. | 257/706 |
| 5,012,386 | A | 4/1991 | McShane et al. | 361/386 |
| 5,102,829 | A | 4/1992 | Cohn | 437/217 |
| 5,379,187 | A | 1/1995 | Lee et al. | 361/707 |
| 5,457,605 | A | 10/1995 | Wagner et al. | 361/720 |
| 5,543,586 | A | 8/1996 | Crane, Jr. et al. | 174/262 |
| 5,644,163 | A | 7/1997 | Tsuji | 257/706 |
| 5,991,156 | A | 11/1999 | Bond et al. | 361/707 |
| 6,057,601 | A | 5/2000 | Lau et al. | 257/738 |
| 6,107,683 | A | 8/2000 | Castro et al. | 257/700 |
| 6,160,705 | A | 12/2000 | Stearns et al. | 361/704 |
| 6,162,664 | A | 12/2000 | Kim | 438/126 |
| 6,281,568 | B1 | 8/2001 | Glenn et al. | 257/684 |
| 6,313,525 | B1 | 11/2001 | Sasano | 257/704 |
| 6,453,549 | B1 | 9/2002 | Bhatt et al. | 29/837 |
| 6,495,914 | B1 | 12/2002 | Sekine et al. | 257/723 |
| 6,498,355 | B1 | 12/2002 | Harrah et al. | 257/99 |
| 6,507,102 | B2 | 1/2003 | Juskey et al. | 257/406 |
| 6,528,882 | B2 | 3/2003 | Ding et al. | 257/738 |
| 6,541,832 | B2 | 4/2003 | Coyle | 257/415 |
| 6,583,444 | B2 | 6/2003 | Fjelstad | 257/82 |
| 6,603,209 | B1 | 8/2003 | DiStefano et al. | 257/781 |
| 6,608,376 | B1 | 8/2003 | Liew et al. | 257/698 |
| 6,625,028 | B1 | 9/2003 | Dove et al. | 361/707 |
| 6,670,219 | B2 | 12/2003 | Lee et al. | 438/107 |
| 6,683,795 | B1 | 1/2004 | Yoo | 361/816 |
| 6,720,651 | B2 | 4/2004 | Gaku et al. | 257/707 |
| 6,744,135 | B2 | 6/2004 | Hasebe et al. | 257/712 |
| 6,861,750 | B2 | 3/2005 | Zhao et al. | 257/739 |
| 6,885,033 | B2 | 4/2005 | Andrews | 257/79 |
| 6,900,535 | B2 | 5/2005 | Zhou | 257/707 |
| 6,906,414 | B2 | 6/2005 | Zhao et al. | 257/707 |
| 6,936,855 | B1 | 8/2005 | Harrah | 257/88 |
| 6,964,877 | B2 | 11/2005 | Chen et al. | 438/20 |
| 7,009,286 | B1 | 3/2006 | Kirloskar et al. | 257/684 |
| 7,038,311 | B2 | 5/2006 | Woodall et al. | 257/706 |
| 7,196,403 | B2 | 3/2007 | Karim | 257/675 |
| 7,202,559 | B2 | 4/2007 | Zhao et al. | 257/707 |
| 7,335,522 | B2 * | 2/2008 | Wang et al. | 438/26 |
| 7,470,935 | B2 | 12/2008 | Lee et al. | 257/98 |
| 7,495,322 | B2 | 2/2009 | Hashimoto et al. | 257/676 |
| 7,582,951 | B2 | 9/2009 | Zhao et al. | 257/660 |
| 7,642,137 | B2 | 1/2010 | Lin et al. | 438/127 |
| 7,679,172 | B2 | 3/2010 | Huang et al. | 257/678 |
| 7,690,817 | B2 | 4/2010 | Sanpei et al. | 362/294 |
| 7,741,158 | B2 | 6/2010 | Leung et al. | 438/122 |
| 7,781,266 | B2 | 8/2010 | Zhao et al. | 438/123 |
| 7,808,087 | B2 | 10/2010 | Zhao et al. | 257/670 |
| 7,812,360 | B2 | 10/2010 | Yano | 257/98 |
| 7,956,372 | B2 | 6/2011 | Kamada et al. | 257/98 |
| 8,030,676 | B2 | 10/2011 | Lin | 257/99 |
| 8,071,998 | B2 | 12/2011 | Chen | 257/99 |
| 2002/0027829 | A1 * | 3/2002 | Higashiho et al. | 365/230.08 |
| 2003/0189830 | A1 | 10/2003 | Sugimoto et al. | 362/294 |
| 2004/0061433 | A1 | 4/2004 | Izuno et al. | 313/498 |
| 2004/0065894 | A1 | 4/2004 | Hashimoto et al. | 257/100 |
| 2005/0024834 | A1 | 2/2005 | Newby | 361/719 |
| 2005/0135105 | A1 | 6/2005 | Teixeira et al. | 362/294 |
| 2005/0185880 | A1 | 8/2005 | Asai | 385/14 |
| 2005/0274959 | A1 | 12/2005 | Kim et al. | 257/79 |
| 2006/0012967 | A1 | 1/2006 | Asai et al. | 361/764 |
| 2006/0054915 | A1 | 3/2006 | Chang | 257/100 |
| 2006/0109632 | A1 | 5/2006 | Berlin et al. | 361/719 |
| 2006/0124953 | A1 * | 6/2006 | Negley et al. | 257/99 |
| 2006/0131735 | A1 | 6/2006 | Ong et al. | 257/706 |
| 2007/0063213 | A1 | 3/2007 | Hsieh et al. | 257/99 |
| 2007/0077416 | A1 | 4/2007 | Ito et al. | 428/339 |
| 2007/0090522 | A1 | 4/2007 | Alhayek et al. | 257/723 |
| 2007/0252166 | A1 | 11/2007 | Chang et al. | 257/98 |
| 2007/0267642 | A1 | 11/2007 | Erchak et al. | 257/98 |
| 2007/0290322 | A1 | 12/2007 | Zhao et al. | 257/690 |
| 2008/0019133 | A1 | 1/2008 | Kim et al. | 362/294 |
| 2008/0032456 | A1 * | 2/2008 | Ahn et al. | 438/124 |
| 2008/0099770 | A1 | 5/2008 | Mendendorp et al. | 257/79 |
| 2008/0102631 | A1 | 5/2008 | Andryushchenko et al. | 438/686 |
| 2008/0173884 | A1 | 7/2008 | Chitnis et al. | 257/98 |
| 2008/0180824 | A1 | 7/2008 | Endoh et al. | 359/894 |
| 2009/0309213 | A1 | 12/2009 | Takahashi et al. | 257/707 |
| 2010/0149756 | A1 | 6/2010 | Rowcliffe et al. | 361/714 |
| 2010/0291737 | A1 | 11/2010 | Ikeguchi et al. | 438/108 |
| 2011/0133204 | A1 | 6/2011 | Lai | 257/76 |

* cited by examiner

SEMICONDUCTOR CHIP ASSEMBLY WITH BUMP/BASE HEAT SPREADER AND DUAL-ANGLE CAVITY IN BUMP

CROSS-REFERENCE TO RELATED APPLICATIONS

This application is a continuation-in-part of U.S. application Ser. No. 12/911,729 filed Oct. 26, 2010. This application also claims the benefit of U.S. Provisional Application Ser. No. 61/380,201 filed Sep. 4, 2010, which is incorporated by reference.

U.S. application Ser. No. 12/911,729 filed Oct. 26, 2010 is a continuation-in-part of U.S. application Ser. No. 12/616,773 filed Nov. 11, 2009 now U.S. Pat. No. 8,067,784 and a continuation-in-part of U.S. application Ser. No. 12/616,775 filed Nov. 11, 2009, each of which is incorporated by reference. U.S. application Ser. No. 12/911,729 filed Oct. 26, 2010 also claims the benefit of U.S. Provisional Application Ser. No. 61/330,318 filed May 1, 2010 and U.S. Provisional Application Ser. No. 61/350,036 filed Jun. 1, 2010, each of which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009.

U.S. application Ser. No. 12/557,540 filed Sep. 11, 2009 and U.S. application Ser. No. 12/557,541 filed Sep. 11, 2009 now U.S. Pat. No. 7,948,076 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009, now U.S. Pat. No. 7,948,076 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and an adhesive. The heat spreader includes a bump that includes first, second and third bent corners that shape a cavity. The conductive trace includes a pad and a terminal. The semiconductor device is located within the cavity, is electrically connected to the conductive trace and is thermally connected to the bump. The bump extends into an opening in the adhesive and provides a recessed die paddle and a reflector for the semiconductor device. The conductive trace provides signal routing between the pad and the terminal.

In accordance with an aspect of the present invention, a semiconductor chip assembly includes a semiconductor device, an adhesive, a heat spreader and a conductive trace. The adhesive includes an opening. The heat spreader includes a bump, a base and a flange, wherein (i) the bump includes first, second and third bent corners with the second bent corner between the first and third bent corners, is adjacent to the flange at the first bent corner and is spaced from the flange at the second and third bent corners, is adjacent to the base at the third bent corner and is spaced from the base at the first and second bent corners, is integral with the flange, extends from the base in a first vertical direction and extends from the flange in a second vertical direction opposite the first vertical direction, (ii) the base extends from the bump in the second vertical direction and extends laterally from the bump in lateral directions orthogonal to the vertical directions, (iii) the flange extends laterally from the bump and is spaced from the base, and (iv) a cavity in the bump faces in the first vertical direction, is covered by the bump in the second vertical direction, is spaced from the base by the bump, extends across most of the bump in the vertical and lateral directions, is shaped by the first, second and third bent corners and has an entrance at the flange, a first angle between the first and second bent corners and a second angle between the second and third bent corners. The conductive trace includes a pad and a terminal.

The semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction, is electrically connected to the pad and thereby electrically connected to the terminal, and is thermally connected to the bump and thereby thermally connected to the base. The adhesive contacts the bump, the base and the flange, is sandwiched between the base and the flange and extends laterally from the bump to or beyond the terminal. The conductive trace is located outside the cavity. The bump extends into the opening, covers the semiconductor device in the second vertical direction and provides a recessed die paddle and a reflector for the semiconductor device. The cavity extends into the opening.

In accordance with another aspect of the present invention, a semiconductor chip assembly includes a semiconductor device, an adhesive, a heat spreader, a substrate and a conductive trace. The adhesive includes an opening. The heat spreader includes a bump, a base and a flange, wherein (i) the bump includes first, second and third bent corners with the second bent corner between the first and third bent corners, is adjacent to the flange at the first bent corner and is spaced from the flange at the second and third bent corners, is adjacent to the base at the third bent corner and is spaced from the base at the first and second bent corners, is integral with the flange, extends from the base in a first vertical direction and extends from the flange in a second vertical direction opposite the first vertical direction, (ii) the base extends from and covers the bump in the second vertical direction and extends laterally from the bump in lateral directions orthogonal to the vertical directions, (iii) the flange extends laterally from the bump and is spaced from the base, and (iv) a cavity in the bump faces in the first vertical direction, is covered by the bump in the second vertical direction, is spaced from the base by the bump, extends across most of the bump in the vertical and lateral directions, is shaped by the first, second and third bent corners and has an entrance at the flange, a first angle between the first and second bent corners and a second angle between the second and third bent corners. The substrate includes a dielectric layer, and an aperture extends through the substrate. The conductive trace includes a pad and a terminal.

The semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction, is electrically connected to the pad and thereby electrically connected to the terminal, and is thermally connected to the bump and thereby thermally connected to the base. The adhesive contacts the bump, the base, the flange and the dielectric layer, is sandwiched between the bump and the dielectric layer, between the flange and the dielectric layer and between the base and the flange and extends laterally from the bump to peripheral edges of the assembly. The conductive trace is located outside the cavity. The bump extends into the opening and the aperture, covers the semiconductor device in the second vertical direction and provides a recessed die paddle and a reflector for the semiconductor device. The cavity extends into the opening and the aperture.

The heat spreader can consist of the bump, the base and the flange. The heat spreader can also consist essentially of copper, aluminum or copper/nickel/aluminum. The heat spreader can also consist of a buried copper, aluminum or copper/nickel/aluminum core and plated surface contacts that consist of gold, silver and/or nickel. In any case, the heat spreader provides heat dissipation and spreading from the semiconductor device to the next level assembly.

The semiconductor device can be mounted on and overlap the bump but not the substrate or the conductive trace, be electrically connected to the pad using a wire bond that extends outside the cavity and be thermally connected to the bump using a die attach that is located within the cavity. For instance, the semiconductor device can extend within and outside the cavity and the wire bond can be located outside the cavity. Alternatively, the semiconductor device can be located within the cavity and the wire bond can extend within and outside the cavity. In any case, the semiconductor device extends into and is located within a periphery of the cavity and the wire bond extends within and outside the periphery of the cavity.

The semiconductor device can be a packaged or unpackaged semiconductor chip. For instance, the semiconductor device can be an LED package that includes an LED chip. Alternatively, the semiconductor device can be a semiconductor chip such as an LED chip.

The adhesive can contact the bump and the dielectric layer in a gap in the aperture between the bump and the substrate, extend across the dielectric layer in the gap and contact the base, the dielectric layer and the terminal outside the gap. The adhesive can also cover the base outside the bump in the first vertical direction, cover the substrate in the first vertical direction and cover and surround the sidewalls of the bump in the lateral directions. The adhesive can also conformally coat the sidewalls of the bump, a surface portion of the base that is adjacent to and extends laterally from the bump and faces in the first vertical direction and a surface of the dielectric layer that faces in the first vertical direction. The adhesive can also fill the space between the bump and the dielectric layer, between the base and the flange and between the base and the substrate.

The adhesive can extend laterally from the bump to or beyond the terminal. For instance, the adhesive and the terminal can extend to peripheral edges of the assembly. In this instance, the adhesive extends laterally from the bump to the terminal. Alternatively, the adhesive can extend to peripheral edges of the assembly and the terminal can be spaced from the peripheral edges of the assembly. In this instance, the adhesive extends laterally from the bump beyond the terminal.

The adhesive alone can intersect an imaginary horizontal line between the bump and the dielectric layer, an imaginary horizontal line between the bump and a plated through-hole, an imaginary horizontal line between the bump and the base, an imaginary vertical line between the bump and the base, an imaginary vertical line between the pad and the dielectric layer, an imaginary vertical line between the flange and the dielectric layer and an imaginary vertical line between the flange and the base without intersecting an imaginary line between the bump and the terminal, between the flange and the terminal, between the pad and the base or between the pad and the terminal.

The bump can be integral with the flange. For instance, the bump and the flange can be a single-piece metal or include a single-piece metal at their interface, and the single-piece metal can be copper. The bump can also be thicker than the base. The bump can also be coplanar with the adhesive at the base and the flange. The bump can also contact the adhesive, be spaced from the dielectric layer and extend into the opening and the aperture.

The bump can include first and second sidewalls and a floor, wherein the first sidewall extends between the first and second bent corners, the second sidewall extends between the second and third bent corners and the floor is adjacent to third bent corner and the base, extends in the lateral directions and is laterally surrounded by the third bent corner. The bump can also have an irregular thickness characteristic of stamping. The bump can also have a larger diameter at the flange than at the base. For instance, the bump can have a cut-off conical or pyramidal shape in which its diameter increases as it extends in the first vertical direction from the third bent corner at the base to the second bent corner and a cylindrical or rectangular prism shape with a constant diameter as it extends in the first vertical direction from the second bent corner to the first bent corner at the flange.

The cavity can be shaped by the first, second and third bent corners, the first and second sidewalls and the floor, have the first angle relative to the floor at the first sidewall and have the second angle relative to the floor at the second sidewall. The cavity can also have a larger diameter at its entrance than at the floor. For instance, the cavity can have a cut-off conical or pyramidal shape in which its diameter increases as it extends in the first vertical direction from the third bent corner at the floor to the second bent corner and a cylindrical or rectangular prism shape with a constant diameter as it extends in the first vertical direction from the second bent corner to the first bent corner at its entrance. In this instance, the first angle can be about 90 degrees and the second angle can be about 120 degrees. The cavity can also have a circular, square or rectangular periphery at its entrance and at the floor. The cavity can also conform to the shape of the bump, extend into the opening and the aperture and extend across most of the bump in the vertical and lateral directions.

The base can have a uniform thickness and be spaced from the conductive layer and the dielectric layer. For instance, the base can be coextensive with the bump or extend laterally from the bump to the adhesive but not to the conductive layer or the dielectric layer.

The base can have a first thickness where it is adjacent to the bump, a second thickness where it is adjacent to the dielectric layer that is larger than the first thickness and a flat surface that faces in the second vertical direction. The base can also have the first thickness where it is adjacent to the adhesive and spaced from the dielectric layer and the second thickness where it is adjacent to a corner-shaped interface between the adhesive and the dielectric layer. The base can also contact the adhesive and the dielectric layer, cover the flange in the second vertical direction, extend laterally beyond the flange, support the substrate and the adhesive and be spaced from peripheral edges of the assembly. The base can also have a surface area in a lateral plane that is larger than that of the bump and the flange combined and over twice as large as that of the bump.

The flange can be thicker than the base. The flange can also contact the adhesive, be spaced from the dielectric layer and extend beyond the adhesive and the dielectric layer in the first vertical direction. The flange can also have a circular, square or rectangular periphery.

The flange and the pad can have the same thickness and be coplanar with one another at a surface that faces in the first vertical direction and the base and the terminal can have the same thickness where closest to one another and different thickness where the base is adjacent to the bump and be coplanar with one another at a surface that faces in the second vertical direction.

The substrate can contact the base and be spaced from the bump, the flange and the pad. The substrate can also be a laminated structure.

The conductive trace can include a routing line that extends beyond the adhesive and the dielectric layer in the first vertical direction in an electrically conductive path between the pad and the terminal. Likewise, the conductive trace can include a plated through-hole that extends through the adhesive and the dielectric layer in an electrically conductive path between the pad and the terminal. For instance, the pad can extend beyond the adhesive and the dielectric layer in the first vertical direction, the terminal can extend beyond the adhesive and the dielectric layer in the second vertical direction and the plated through-hole can extend through the adhesive and the dielectric layer and electrically connect the pad and the terminal. Likewise, the pad and the routing line can extend beyond the adhesive and the dielectric layer in the first vertical direction, the terminal can extend beyond the adhesive and the dielectric layer in the second vertical direction and the plated through-hole can extend through the adhesive and the dielectric layer and electrically connect the routing line and the terminal.

The conductive trace can contact the adhesive and the dielectric layer and be spaced from the heat spreader. For instance, the pad can contact the adhesive and be spaced from the dielectric layer, the terminal can contact the dielectric layer and be spaced from the adhesive and the plated through-hole can contact and extend through the adhesive and the dielectric layer to provide vertical signal routing between the pad and the terminal. Likewise, the pad and the routing line can contact the adhesive and be spaced from the dielectric layer, the terminal can contact the dielectric layer and be spaced from the adhesive and the plated through-hole can contact and extend through the adhesive and the dielectric layer to provide horizontal signal routing between the pad and the plated through-hole and vertical signal routing between the routing line and the terminal. Furthermore, the plated through-hole can extend to a peripheral edge of the assembly or be spaced from the peripheral edges of the assembly.

The conductive trace can consist of the pad, the terminal and the plated through-hole. The conductive trace can also consist essentially of copper. The conductive trace can also consist of a buried copper core and plated surface contacts that consist of gold, silver and/or nickel. In any case, the conductive trace provides signal routing between the pad and the terminal.

The pad can be an electrical contact for the semiconductor device, the terminal can be an electrical contact for the next level assembly, and the pad and the terminal can provide signal routing between the semiconductor device and the next level assembly.

The bump, the base, the flange, the pad, the terminal and the plated through-hole can be the same metals. For instance, the bump, the base, the flange, the pad, the terminal and the plated through-hole can include a gold, silver or nickel surface layer and a buried copper core and be primarily copper. In this instance, a plated contact can include a gold or silver surface layer and a buried nickel layer that contacts and is sandwiched between the surface layer and the buried copper core or a nickel surface layer that contacts the buried copper core. Furthermore, the heat spreader can include a copper core shared by the bump, the base and the flange and the conductive trace can include a copper core shared by the pad, the terminal and the plated through-hole. For instance, the heat spreader and the conductive trace can include a gold, silver or nickel surface layer and a buried copper core and be primarily copper. In this instance, the heat spreader can include a plated contact at the bump and the flange and spaced from the base and another plated contact at the base and spaced from the bump and the flange, and the conductive trace can include a plated contact at the pad, the terminal and the plated through-hole.

The assembly can include an encapsulant that extends into the cavity and covers the semiconductor device in the first vertical direction. The encapsulant can also be located within or extend within and outside the cavity, be laterally confined by or extend laterally from the cavity, contact the semiconductor device in the cavity and fill the remaining space in the cavity. The encapsulant in the cavity can also extend into the opening and the aperture and extend across most of the bump in the vertical and lateral directions. For instance, the encapsulant can be a color-shifting encapsulant that contacts an LED chip, a wire bond, a die attach and the bump in the cavity, is spaced from the conductive trace, the base, the adhesive and the dielectric layer and converts blue light emitted by the LED chip into white light. In this instance, the assembly can include a transparent encapsulant that contacts the color-shifting encapsulant, the flange, the pad and the wire bond outside the cavity, is spaced from the LED chip, the die attach, the base and the terminal and covers the color-shifting encapsulant, the flange and the wire bond in the first vertical direction. Furthermore, the color-shifting encapsulant can include silicone and phosphor and the transparent encapsulant can include silicone and exclude phosphor.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing a bump and a ledge, wherein the bump includes first, second and third bent corners that shape a cavity, mounting an adhesive on the ledge including inserting the bump into an opening in the adhesive, mounting a conductive layer on the adhesive including aligning the bump with an aperture in the conductive layer, then flowing the adhesive between the bump and the conductive layer, solidifying the adhesive, then providing a conductive trace that includes a pad, a terminal and a selected portion of the ledge, providing a heat spreader that includes the bump, then mounting a semiconductor device on the bump within the cavity, electrically connecting the semiconductor device to the conductive trace and thermally connecting the semiconductor device to the heat spreader.

In accordance with an aspect of the present invention, a method of making a semiconductor chip assembly includes (1) providing a bump, a ledge, an adhesive and a conductive layer, wherein (a)(i) the bump includes first, second and third bent corners with the second bent corner between the first and third bent corners, (ii) the bump defines a cavity that faces in a first vertical direction, has an entrance at the ledge, is shaped by the first, second and third bent corners and has a first angle between the first and second bent corners and a second angle between the second and third bent corners and (iii) the bump is adjacent to and integral with the ledge at the first bent corner, is spaced from the ledge at the second and third bent corners, extends vertically from the ledge in a second vertical direction opposite the first vertical direction, extends into an opening in the adhesive and is aligned with an aperture in the conductive layer, (b) the ledge extends laterally from the bump in lateral directions orthogonal to the vertical directions, (c) the adhesive is mounted on the ledge, is sandwiched between the ledge and the conductive layer and is non-solidified, and (d) the conductive layer is mounted on the adhesive, then (2) flowing the adhesive in the second vertical direction into a gap located in the aperture between the bump and the conductive layer, (3) solidifying the adhesive, then (4) providing a conductive trace that includes a pad, a terminal and a selected portion of the ledge that is spaced from the bump, (5) providing a heat spreader that includes the bump and a flange, wherein the bump is adjacent to the flange at the first bent corner and the flange includes a selected portion of the ledge that is adjacent to and integral with and extends laterally from the bump, then (6) mounting a semiconductor device on the bump, wherein (a) the semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction and (b) the bump provides a recessed die paddle for the semiconductor device, (7) electrically connecting the semiconductor device to the pad, thereby electrically connecting the semiconductor device to the terminal, and (8) thermally connecting the semiconductor device to the bump.

In accordance with another aspect of the present invention, a method of making a semiconductor chip assembly includes (1) providing a bump and a ledge, wherein (a) the bump includes first, second and third bent corners with the second bent corner between the first and third bent corners, (b) the bump defines a cavity that faces in a first vertical direction, has an entrance at the ledge, is shaped by the first, second and third bent corners and has a first angle between the first and second bent corners and a second angle between the second and third bent corners, (c) the bump is adjacent to and integral with the ledge at the first bent corner, is spaced from the ledge at the second and third bent corners, extends vertically from the ledge in a second vertical direction opposite the first vertical direction and (d) the ledge extends laterally from the bump in lateral directions orthogonal to the vertical directions, (2) providing an adhesive, wherein an opening extends through the adhesive, (3) providing a conductive layer, wherein an aperture extends through the conductive layer, (4) mounting the adhesive on the ledge, wherein the bump extends into the opening, (5) mounting the conductive layer on the adhesive, including aligning the bump with the aperture, wherein the adhesive is sandwiched between the ledge and the conductive layer and is non-solidified, then (6) applying heat to melt the adhesive, (7) moving the ledge and the conductive layer towards one another, thereby moving the bump in the second vertical direction in the aperture and applying pressure to the molten adhesive between the ledge and the conductive layer, wherein the pressure forces the molten adhesive to flow in the second vertical direction into a gap located in the aperture between the bump and the conductive layer, (8) applying heat to solidify the molten adhesive, thereby mechanically attaching the bump and the ledge to the conductive layer, then (9) providing a conductive trace that includes a pad, a terminal and selected portions of the ledge and the conductive layer that are spaced from the bump, (10) providing a heat spreader that includes the bump, a base and a flange, wherein (a) the bump is adjacent to the flange at the first bent corner and is spaced from the flange at the second and third bent corners, is adjacent to the base at the third bent corner and is spaced from the base at the first and second bent corners and extends vertically from the base in the first vertical direction, (b) the base extends vertically from the bump in the second vertical direction and extends laterally from the bump and (c) the flange includes a selected portion of the ledge that is adjacent to and integral with and extends laterally from the bump, then (11) mounting a semiconductor device on the bump, wherein (a) the semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction and (b) the bump provides a recessed die paddle and a reflector for the semiconductor device, (12) electrically connecting the semiconductor device to the pad, thereby electrically connecting the semiconductor device to the terminal, and (13) thermally connecting the semiconductor device to the bump, thereby thermally connecting the semiconductor device to the base.

Mounting the conductive layer can include mounting the conductive layer alone on the adhesive. Alternatively, mounting the conductive layer can include mounting the conductive layer and a carrier on the adhesive such that the conductive layer contacts and is sandwiched between the adhesive and the carrier, and then, after solidifying the adhesive, removing the carrier and then providing the conductive trace. As another alternative, mounting the conductive layer can include mounting the conductive layer and a dielectric layer on the adhesive such that the conductive layer is spaced from the adhesive and the dielectric layer contacts and is sandwiched between the conductive layer and the adhesive.

In accordance with another aspect of the present invention, a method of making a semiconductor chip assembly includes (1) providing a bump, a ledge, an adhesive and a substrate, wherein (a)(i) the bump includes first, second and third bent corners, first and second sidewalls and a floor, the second bent corner is between the first and third bent corners, the first sidewall extends between the first and second bent corners, the second sidewall extends between the second and third bent corners and the floor is adjacent to the third bent corner, (ii) the bump defines a cavity that faces in a first vertical direction, has an entrance at the ledge, is shaped by the first, second and third bent corners, the first and second sidewalls and the floor and has a first angle relative to the floor at the first sidewall and a second angle relative to the floor at the second sidewall and (iii) the bump is adjacent to and integral with the ledge at the first bent corner, is spaced from the ledge at the second and third bent corners, extends vertically from the ledge in a second vertical direction opposite the first vertical direction, extends into an opening in the adhesive and is aligned with an aperture in the substrate, (b) the ledge extends laterally from the bump in lateral directions orthogonal to the vertical directions, (c) the adhesive is mounted on the ledge, is sandwiched between the ledge and the substrate and is non-solidified, and (d) the substrate is mounted on the adhesive, wherein the substrate includes a conductive layer and a dielectric layer and the dielectric layer is sandwiched between the conductive layer and the adhesive, then (2) flowing the adhesive in the second vertical direction into a gap located in the aperture between the bump and the conductive layer, (3) solidifying the adhesive, then (4) providing a conductive trace that includes a pad, a terminal, a plated through-hole, a selected portion of the ledge that is adjacent to the plated through-hole and spaced from the bump and a selected portion of the conductive layer that is adjacent to the plated through-hole and spaced from the bump, wherein the plated through-hole is in an electrically conductive path between the pad and the terminal, (5) providing a heat spreader that includes the bump, a base and a flange, wherein (a) the bump is adjacent to the flange at the first bent corner and is spaced from the flange at the second and third bent corners, is adjacent to the base at the third bent corner and the floor and is spaced from the base at the first and second bent corners and extends vertically from the base in the first vertical direction, (b) the base covers the bump in the second vertical direction, extends laterally from the bump and includes a selected portion of the conductive layer that is spaced from the conductive trace and (c) the flange includes a selected portion of the ledge that is adjacent to and integral with and extends laterally from the bump, then (6) mounting a semiconductor device on the bump, wherein (a) the semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction and (b) the bump provides a recessed die paddle and a reflector for the semiconductor device, (7) electrically connecting the semiconductor device to the pad, thereby electrically connecting the semiconductor device to the terminal, and (8) thermally connecting the semiconductor device to the bump, thereby thermally connecting the semiconductor device to the base.

In accordance with another aspect of the present invention, a method of making a semiconductor chip assembly includes (1) providing a bump and a ledge, wherein (a) the bump includes first, second and third bent corners, first and second sidewalls and a floor, the second bent corner is between the first and third bent corners, the first sidewall extends between the first and second bent corners, the second sidewall extends between the second and third bent corners and the floor is adjacent to the third bent corner, (b) the bump defines a cavity that faces in a first vertical direction, has an entrance at the ledge, is shaped by the first, second and third bent corners, the first and second sidewalls and the floor and has a first angle relative to the floor at the first sidewall and a second angle relative to the floor at the second sidewall, (c) the bump is adjacent to and integral with the ledge at the first bent corner, is spaced from the ledge at the second and third bent corners and extends vertically from the ledge in a second vertical direction opposite the first vertical direction (d) the ledge extends laterally from the bump in lateral directions orthogonal to the vertical directions, (2) providing an adhesive, wherein an opening extends through the adhesive, (3) providing a substrate that includes a conductive layer and a dielectric layer, wherein an aperture extends through the substrate, (4) mounting the adhesive on the ledge, including inserting the bump into the opening, wherein the bump extends through the opening, (5) mounting the substrate on the adhesive, including inserting the bump into the aperture, wherein the bump extends into the aperture, the adhesive is sandwiched between the ledge and the dielectric layer and is non-solidified and the dielectric layer is sandwiched between the conductive layer and the adhesive, then (6) applying heat to melt the adhesive, (7) moving the ledge and the substrate towards one another, thereby moving the bump in the second vertical direction in the aperture and applying pressure to the molten adhesive between the ledge and the substrate, wherein the pressure forces the molten adhesive to flow in the second vertical direction into a gap located in the aperture between the bump and the substrate, (8) applying heat to solidify the molten adhesive, thereby mechanically attaching the bump and the ledge to the substrate, then (9) providing a plated through-hole that extends through the ledge, the adhesive, the dielectric layer and the conductive layer, then (10) providing a pad, a terminal, a base and a flange, (11) providing a conductive trace that includes the pad, the terminal, the plated through-hole, a selected portion of the ledge that is adjacent to the plated through-hole and spaced from the bump and a selected portion of the conductive layer that is adjacent to the plated through-hole and spaced from the bump, wherein the plated through-hole is in an electrically conductive path between the pad and the terminal, (12) providing a heat spreader that includes the bump, the base and the flange, wherein (a) the bump is adjacent to the flange at the first bent corner and is spaced from the flange at the second and third bent corners, is adjacent to the base at the third bent corner and the floor and is spaced from the base at the first and second bent corners and extends vertically from the base in the first vertical direction, (b) the base covers the bump in the second vertical direction, extends laterally from the bump in the lateral directions and includes a selected portion of the conductive layer that is spaced from the conductive trace and (c) the flange includes a selected portion of the ledge that is adjacent to and integral with and extends laterally from the bump, then (13) mounting a semiconductor device on the bump, wherein (a) the semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction and (b) the bump provides a recessed die paddle and a reflector for the semiconductor device, (14) electrically connecting the semiconductor device to the pad, thereby electrically connecting the semiconductor device to the terminal, and (15) thermally connecting the semiconductor device to the bump, thereby thermally connecting the semiconductor device to the base.

Providing the bump can include mechanically stamping a metal plate, thereby forming the bump in the metal plate and the first, second and third bent corners and the cavity in the bump. In this instance, the bump is a stamped portion of the metal plate, the ledge is an unstamped portion of the metal plate and the first, second and third bent corners are bent portions of the metal plate.

Providing the adhesive can include providing a prepreg with uncured epoxy, flowing the adhesive can include melting the uncured epoxy and compressing the uncured epoxy between the ledge and the substrate, and solidifying the adhesive can include curing the molten uncured epoxy.

Providing the pad can include removing selected portions of the ledge after solidifying the adhesive. The removing can include applying a wet chemical etch to the ledge using an etch mask that defines the pad such that the pad includes a selected portion of the ledge.

Providing the flange can include removing selected portions of the ledge after solidifying the adhesive. The removing can include applying a wet chemical etch to the ledge using an etch mask that defines the flange such that the flange includes a selected portion of the ledge.

Providing the terminal can include removing selected portions of the conductive layer after solidifying the adhesive. The removing can include applying a wet chemical etch to the conductive layer using an etch mask that defines the terminal such that the terminal includes a selected portion of the conductive layer.

Providing the base can include removing selected portions of the conductive layer after solidifying the adhesive. The removing can include applying a wet chemical etch to the conductive layer using an etch mask that defines the base such that the base includes a selected portion of the conductive layer.

Providing the pad and the flange can include removing selected portions of the ledge using an etch mask that defines the pad and the flange. Thus, the pad and the flange can be formed simultaneously using the same etch mask and wet chemical etch. Likewise, providing the terminal and the base can include removing selected portions of the conductive layer using an etch mask that defines the terminal and the base. Thus, the terminal and the base can be formed simultaneously using the same etch mask and wet chemical etch.

The pad can be formed before, during or after the terminal is formed. Thus, the pad and the terminal can be formed simultaneously using the same wet chemical etch and different etch masks or sequentially using different etch masks. Likewise, the flange can be formed before, during or after the base is formed. Thus, the flange and the base can be formed simultaneously using the same wet chemical etch and different etch masks or sequentially using different etch masks. Similarly, the pad, the terminal, the flange and the base can be formed simultaneously or sequentially.

Providing the terminal can include grinding the bump, the adhesive and the conductive layer after solidifying the adhesive such that the bump, the adhesive and the conductive layer are laterally aligned with one another at a lateral surface that faces in the second vertical direction, and then removing selected portions of the conductive layer using an etch mask that defines the terminal such that the terminal includes a selected portion of the conductive layer. The grinding can include grinding the adhesive without grinding the bump and then grinding the bump, the adhesive and the conductive layer. The removing can include applying a wet chemical etch to the conductive layer using an etch mask that defines the terminal.

Providing the pad can include depositing a plated layer on the bump and the ledge after the grinding and then removing selected portions of the ledge and the plated layer such that the pad includes selected portions of the ledge and the plated layer. Depositing the plated layer can include electrolessly plating a thin plated layer on the bump, the adhesive and the ledge and then electroplating a thick plated layer on the thin plated layer. The removing can include applying the wet chemical etch to the ledge and the plated layer using an etch mask to define the pad.

Providing the terminal can include depositing a plated layer on the bump, the adhesive and the conductive layer after the grinding and then removing selected portions of the conductive layer and the plated layer such that the terminal includes selected portions of the conductive layer and the plated layer. Depositing the plated layer can include electrolessly plating a thin plated layer on the bump, the adhesive and the conductive layer and then electroplating a thick plated layer on the thin plated layer. The removing can include applying the wet chemical etch to the conductive layer and the plated layer using an etch mask to define the terminal.

Providing the conductive trace can include providing the pad, the terminal and a plated through-hole in an electrically conductive path between the pad and the terminal. The plated through-hole can be formed before the pad and the terminal and extend through the ledge, the adhesive, the dielectric layer and the conductive layer.

Providing the pad, the flange and the plated through-hole can include drilling a hole through the ledge, the dielectric layer, the adhesive and the conductive layer after solidifying the adhesive, then depositing a plated layer on the bump, the ledge, the dielectric layer, the adhesive and the conductive layer and into the hole, wherein the plated layer forms a first plated layer that covers the bump and the ledge in the first vertical direction and the plated through-hole in the hole, then forming an etch mask on the first plated layer that defines the pad and the flange, etching the ledge and the first plated layer in a pattern defined by the etch mask and then removing the etch mask.

Providing the base, the terminal and the plated through-hole can include drilling a hole through the ledge, the dielectric layer, the adhesive and the conductive layer after solidifying the adhesive, then depositing a plated layer on the ledge, the dielectric layer, the adhesive and the conductive layer and into the hole, wherein the plated layer forms a second plated layer that covers the bump, the adhesive and the conductive layer in the second vertical direction and the plated through-hole in the hole, then forming an etch mask on the second plated layer that defines the base and the terminal, etching the conductive layer and the second plated layer in a pattern defined by the etch mask and then removing the etch mask.

Providing the base, the flange, the pad, the terminal and the plated through-hole can include drilling a hole through the ledge, the dielectric layer, the adhesive and the conductive layer after solidifying the adhesive, then depositing a plated layer on the bump, the ledge, the dielectric layer, the adhesive and the conductive layer and into the hole, wherein the plated layer forms a first plated layer that covers the bump and the ledge in the first vertical direction, a second plated layer that covers the bump, the adhesive and the conductive layer in the second vertical direction and the plated through-hole in the hole, then forming a first etch mask on the first plated layer that defines the pad and the flange, etching the ledge and the first plated layer in a pattern defined by the first etch mask, forming a second etch mask on the second plated layer that defines the base and the terminal, etching the conductive layer and the second plated layer in a pattern defined by the second etch mask and removing the etch masks. Furthermore, etching the ledge and the first plated layer can include exposing the adhesive in the first vertical direction without exposing the dielectric layer in the first vertical direction, and etching the conductive layer and the second plated layer can include exposing the dielectric layer in the second vertical direction without exposing the adhesive in the second vertical direction.

Flowing the adhesive can include filling the gap with the adhesive. Flowing the adhesive can also include squeezing the adhesive through the gap beyond the bump and the conductive layer in the second vertical direction onto surface portions of the bump and the conductive layer that are adjacent to the gap and face in the second vertical direction such that the adhesive extends beyond the bump and the conductive layer in the second vertical direction.

Solidifying the adhesive can include mechanically bonding the bump and the ledge to the substrate.

Mounting the semiconductor device can include providing a die attach between a semiconductor chip such as an LED chip and the bump, electrically connecting the semiconductor device can include providing a wire bond between the chip and the pad, and thermally connecting the semiconductor device can include providing the die attach between the chip and the bump.

The semiconductor device can be encapsulated by depositing an encapsulant in liquid form into the cavity that fills the remaining space in the cavity and covers the semiconductor device in the first vertical direction and then hardening the encapsulant. Furthermore, the cavity can provide a dam that laterally confines the encapsulant as it extends outside the cavity in the first vertical direction.

The adhesive can contact the bump, the base, the flange, the pad, the plated through-hole and the dielectric layer, cover the substrate and the terminal in the first vertical direction, cover the pad and the flange in the second vertical direction, cover and surround the sidewalls of the bump in the lateral directions and extend to peripheral edges of the assembly after the assembly is manufactured and detached from other assemblies in a batch.

The base can cover the semiconductor device, the bump and the flange but not the adhesive, the dielectric layer, the terminal or the plated through-hole in the second vertical direction, support the substrate and the adhesive and be spaced from peripheral edges of the assembly after the assembly is manufactured and detached from other assemblies in a batch.

The present invention has numerous advantages. The heat spreader can provide excellent heat spreading and heat dissipation without heat flow through the adhesive. As a result, the adhesive can be a low cost dielectric with low thermal conductivity and not prone to delamination. The bump and the flange can be integral with one another, thereby enhancing reliability. The bump can have a tapered sidewall adjacent to its floor, a vertical sidewall adjacent to its entrance, a bent corner between the sidewalls and a highly reflective surface layer. As a result, the bump can focus the light generated by an LED chip mounted on the bump within the cavity, thereby enhancing the light output. Furthermore, the cavity can provide a well-defined space for a color-shifting encapsulant deposited on the LED chip. As a result, the color-shifting encapsulant can be dispensed into the cavity in a small consistent amount, thereby enhancing optical performance and reducing cost. The base can include a selected portion of the conductive layer laminated to the dielectric layer, thereby enhancing reliability. The adhesive can be sandwiched between the bump and the substrate, between the base and the substrate and between the flange and the substrate, thereby providing a robust mechanical bond between the heat spreader and the substrate. The conductive trace can provide signal routing with simple circuitry patterns or flexible multi-layer signal routing with complex circuitry patterns. The conductive trace can also provide vertical signal routing between the pad and the terminal using a plated through-hole that extends through the adhesive and the dielectric layer. Furthermore, the plated through-hole can be formed after the adhesive is solidified and remain a hollow tube or be split at a peripheral edge of the assembly. As a result, a solder joint subsequently reflowed on the terminal can wet and flow into the plated through-hole without creating a buried void in the solder joint that might otherwise occur if the plated through-hole is filled with the adhesive or another non-wettable insulator, thereby increasing reliability. The base can provide mechanical support for the substrate, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 4N and 4O are top and bottom views, respectively, corresponding to FIG. 4M;

DETAILED DESCRIPTION OF THE INVENTION

Figure 1A:
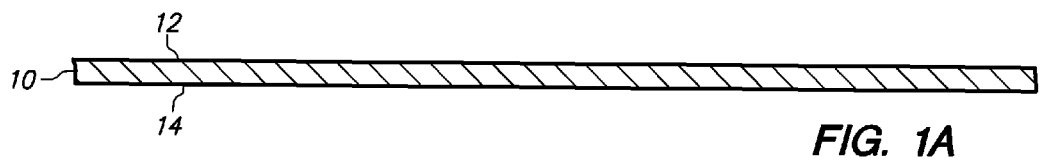
FIGS. 1A and 1B are cross-sectional views showing a method of making a bump and a ledge in accordance with an embodiment of the present invention.
Figure 1B:
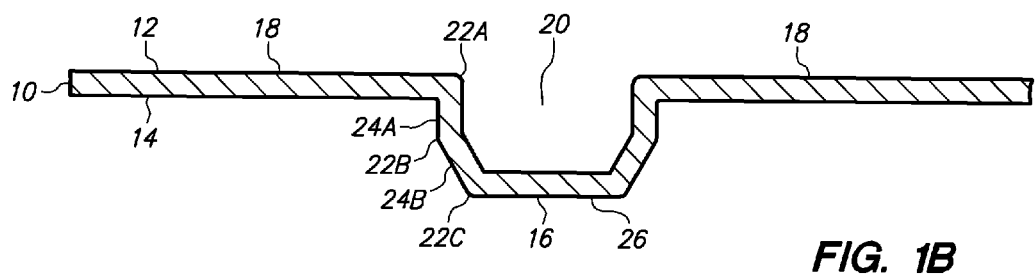
Figure 1C:
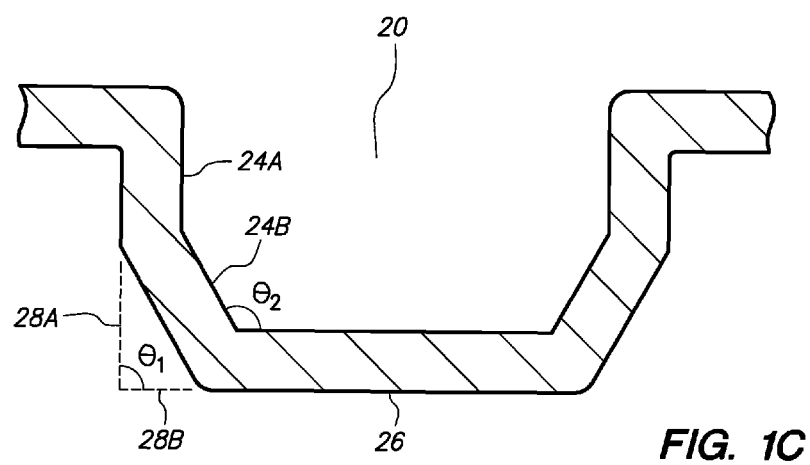
FIGS. 1C, 1D and 1E are enlarged cross-sectional, top and bottom views, respectively, corresponding to FIG. 1B.
Figure 1D:
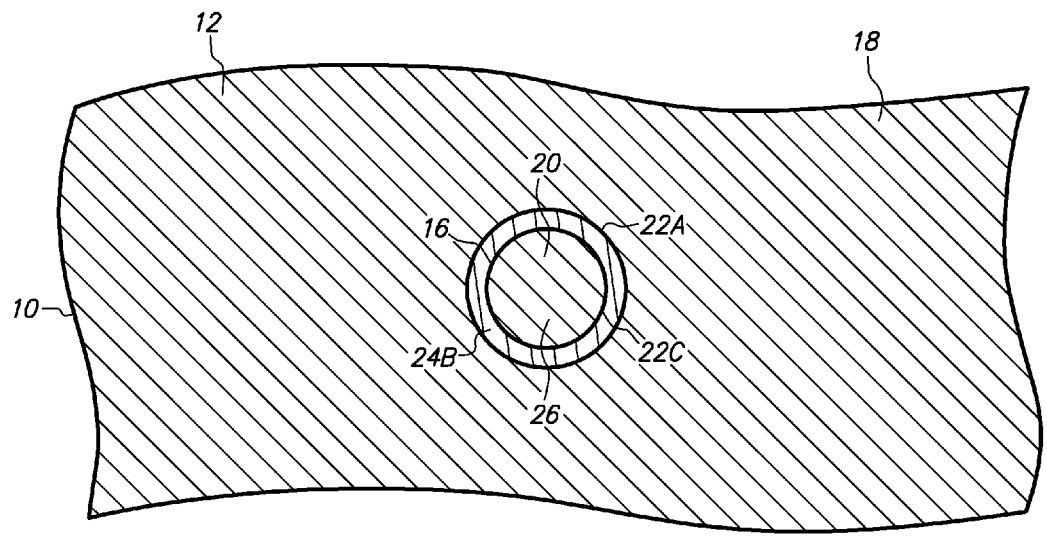
Figure 1E:
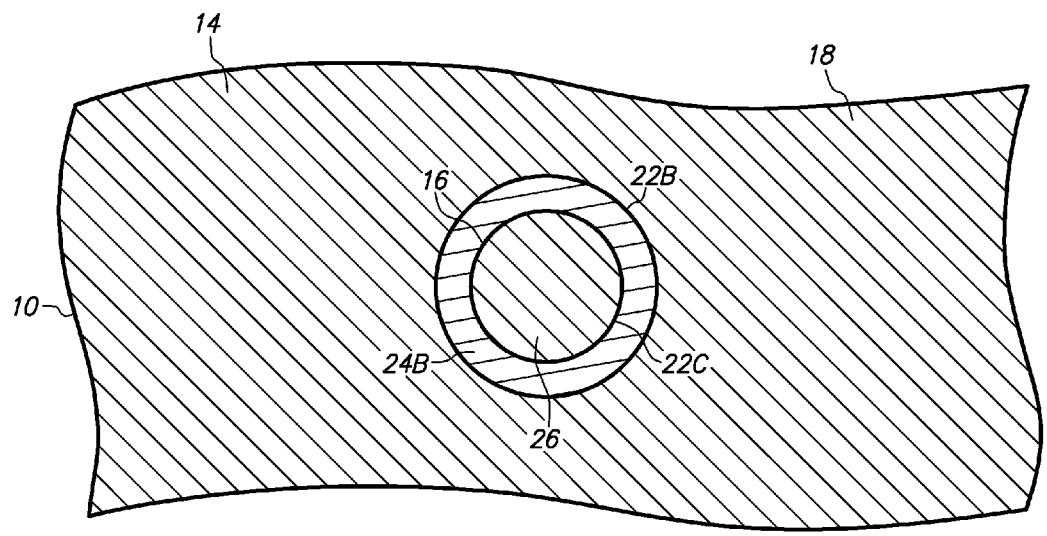

FIGS. 1A and 1B are cross-sectional views showing a method of making a bump and a ledge in accordance with an embodiment of the present invention, FIG. 1C is an enlarged cross-sectional view corresponding to FIG. 1B and FIGS. 1D and 1E are top and bottom views, respectively, corresponding to FIG. 1B.

FIG. 1A. is a cross-sectional view of metal plate 10 which includes opposing major surfaces 12 and 14. Metal plate 10 is illustrated as a copper plate with a thickness of 70 microns. Copper has high thermal conductivity, good bondability and low cost. Metal plate 10 can be various metals such as copper, aluminum, alloy 42, iron, nickel, silver, gold, combinations thereof, and alloys thereof.

FIGS. 1B, 1C, 1D and 1E are cross-sectional, enlarged cross-sectional, top and bottom views, respectively, of metal plate 10 with bump 16, ledge 18 and cavity 20. Bump 16, cavity 20 and bent corners 22A, 22B and 22C are formed by mechanically stamping metal plate 10. Thus, bump 16 is a stamped portion of metal plate 10, ledge 18 is an unstamped portion of metal plate 10 and bent corners 22A, 22B and 22C are bent portions of metal plate 10.

Bump 16 is adjacent to and integral with ledge 18 and extends from ledge 18 in the downward direction. Bump 16 includes bent corners 22A, 22B and 22C, sidewalls 24A and 24B and floor 26. Bent corners 22A, 22B and 22C are formed by the stamping operation and thus sidewalls 24A and 24B are shaped and sloped by the stamping operation.

Bent corner 22A is adjacent to ledge 18 and sidewall 24A and spaced from sidewall 24B and floor 26. Bent corner 22B is adjacent to sidewalls 24A and 24B and spaced from ledge 18 and floor 26. Bent corner 22C is adjacent to sidewall 24B and floor 26 and spaced from ledge 18 and laterally surrounds floor 26.

Sidewall 24A is vertical as it extends in the upward direction from bent corner 22B to bent corner 22A. Sidewall 24B extends outwardly as it extends in the upward direction from bent corner 22C to bent corner 22B. Floor 26 extends laterally in lateral directions (such as left and right) orthogonal to the upward and downward directions. Furthermore, sidewall 24A has an angle $\theta_1$ of 90 degrees relative to floor 26 (as shown by the intersection of imaginary lines 28A and 28B in FIG. 1C) and sidewall 24B has an angle $\theta_2$ of 120 degrees relative to floor 26 at bent corner 22C. Thus, sidewall 24A is non-tapered whereas sidewall 24B is tapered.

Bump 16 has a cut-off conical shape (resembling a frustum) in which its diameter increases as it extends upwardly from bent corner 22C to bent corner 22B and a cylindrical shape with constant diameter as it extends upwardly from bent corner 22B to bent corner 22A. Bump 16 has a height of 250 microns relative to ledge 18, a diameter of 1250 microns at ledge 18 and a diameter of 1000 microns at floor 26. Furthermore, bump 16 has an irregular thickness due to the stamping operation. For instance, sidewalls 24A and 24B are thinner than floor 26 since they are elongated by the stamping operation. Bump 16 is shown with a uniform thickness for convenience of illustration.

Ledge 18 extends laterally from bump 16 in the lateral directions, is flat and has a thickness of 70 microns.

Cavity 20 faces in the upward direction, extends into bump 16, is covered by bump 16 in the downward direction and has an entrance at ledge 18. Cavity 20 conforms to the shape of bump 16 and is shaped by bent corners 22A, 22B and 22C, sidewalls 24A and 24B and floor 26. Cavity 20 has angle $\theta_1$ at sidewall 24A relative to floor 26 and angle $\theta_2$ at sidewall 24B relative to floor 26. Thus, cavity 20 has a diameter that increases as it extends upwardly from bent corner 22C to bent corner 22B and a constant diameter as it extends upwardly from bent corner 22B to bent corner 22A. Cavity 20 also has a cut-off conical shape (resembling a frustum) in which its diameter increases as it extends upwardly from bent corner 22C at floor 26 to bent corner 22B and a cylindrical shape with constant diameter as it extends upwardly from bent corner 22B to bent corner 22A at its entrance. Furthermore, cavity 20 extends across most of bump 16 in the vertical and lateral directions and has a depth of 250 microns.

Figure 2A:
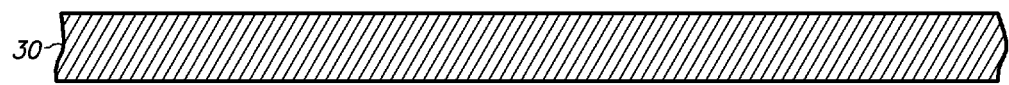
FIGS. 2A and 2B are cross-sectional views showing a method of making an adhesive in accordance with an embodiment of the present invention.
Figure 2B:
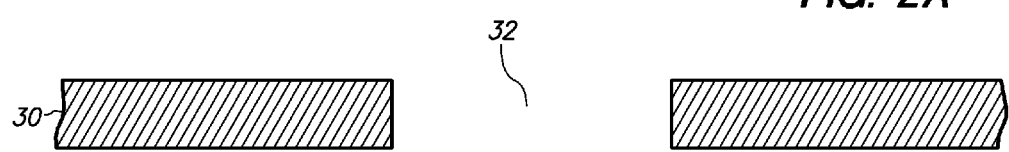
Figure 2C:
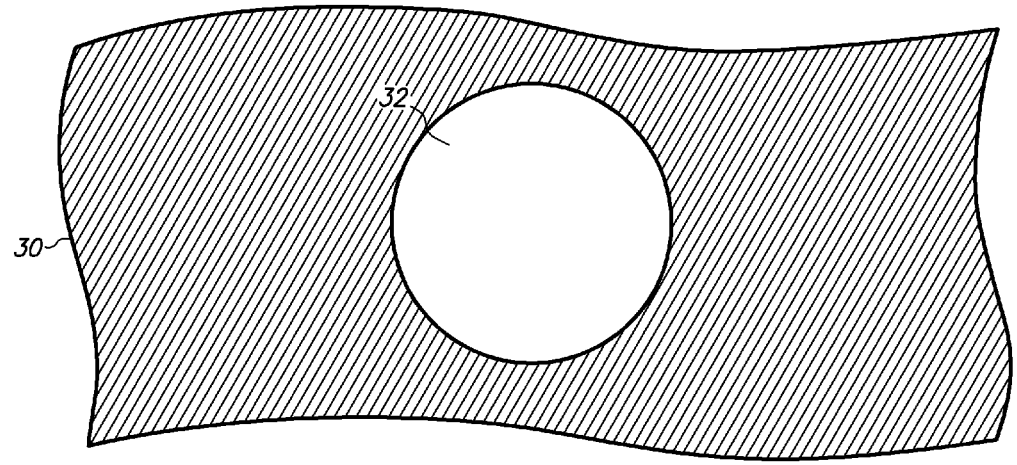
FIGS. 2C and 2D are top and bottom views, respectively, corresponding to FIG. 2B.
Figure 2D:
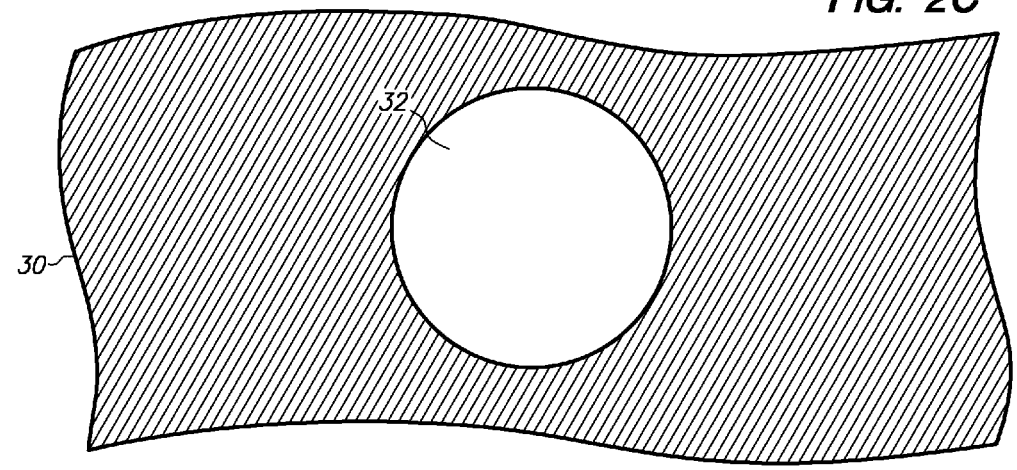

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 30. Adhesive 30 is illustrated as a prepreg with B-stage uncured epoxy provided as a non-solidified unpatterned sheet with a thickness of 150 microns.

Adhesive 30 can be various dielectric films or prepregs formed from numerous organic or inorganic electrical insulators. For instance, adhesive 30 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 30 with opening 32. Opening 32 is a window that extends through adhesive 30 and has a diameter of 1550 microns. Opening 32 is formed by mechanical drilling through the prepreg and can be formed by other techniques such as punching and stamping.

Figure 3A:
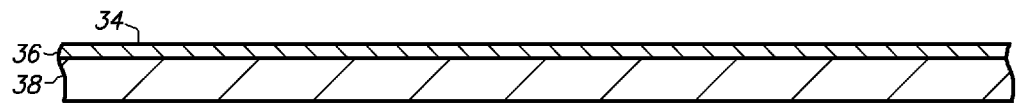
FIGS. 3A and 3B are cross-sectional views showing a method of making a substrate in accordance with an embodiment of the present invention.
Figure 3B:
Figure 3C:
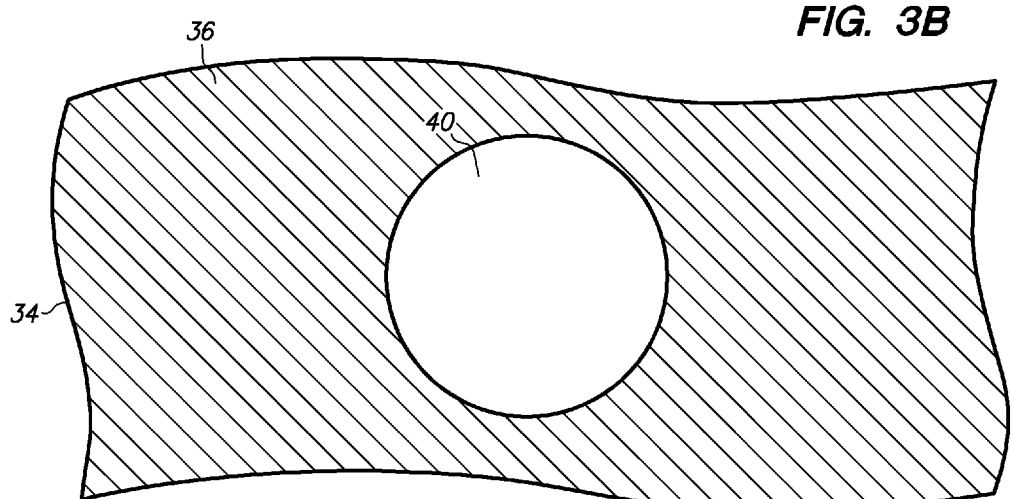
FIGS. 3C and 3D are top and bottom views, respectively, corresponding to FIG. 3B.
Figure 3D:
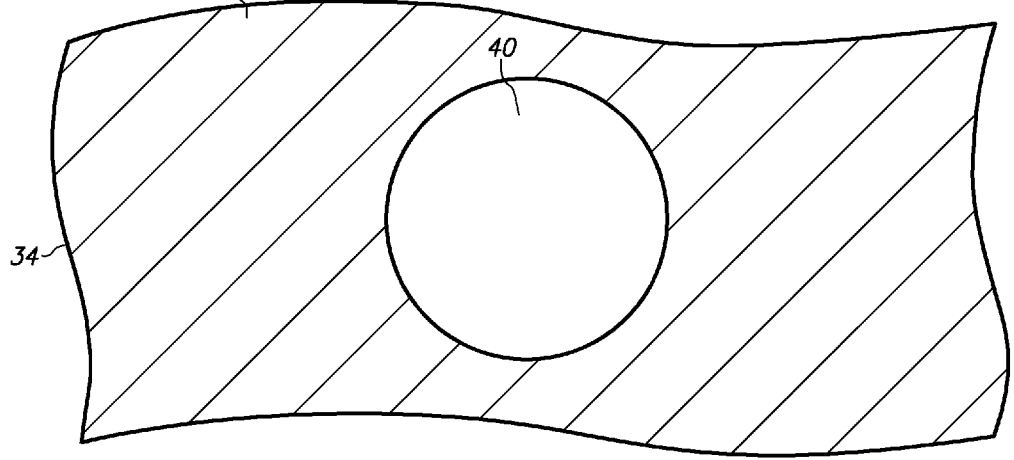

FIGS. 3A and 3B are cross-sectional views showing a method of making a substrate in accordance with an embodiment of the present invention, and FIGS. 3C and 3D are top and bottom views, respectively, corresponding to FIG. 3B.

FIG. 3A is a cross-sectional view of substrate 34 that includes conductive layer 36 and dielectric layer 38. Conductive layer 36 is an electrical conductor that contacts and extends above dielectric layer 38, and dielectric layer 38 is an electrical insulator. For instance, conductive layer 36 is an unpatterned copper sheet with a thickness of 30 microns, and dielectric layer 38 is epoxy with a thickness of 120 microns.

FIGS. 3B, 3C and 3D are cross-sectional, top and bottom views, respectively, of substrate 34 with aperture 40. Aperture 40 is a window that extends through substrate 34 and has a diameter of 1550 microns. Aperture 40 is formed by mechanical drilling through conductive layer 36 and dielectric layer 38 and can be formed with other techniques such as punching and stamping. Thus, opening 32 and aperture 40 have the same diameter. Furthermore, opening 32 and aperture 40 can be formed in the same manner with the same drill bit at the same drilling station or the same punch at the same punching station.

Substrate 34 is illustrated as a laminated structure. Substrate 34 can be other electrical interconnects such as a ceramic board or a printed circuit board. Likewise, substrate 34 can include additional layers of embedded circuitry.

Figure 4A:
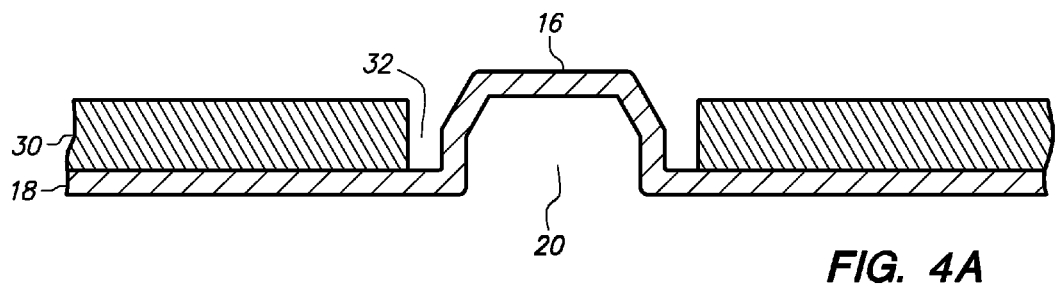
FIGS. 4A-4M are cross-sectional views showing a method of making a thermal board in accordance with an embodiment of the present invention.
Figure 4B:
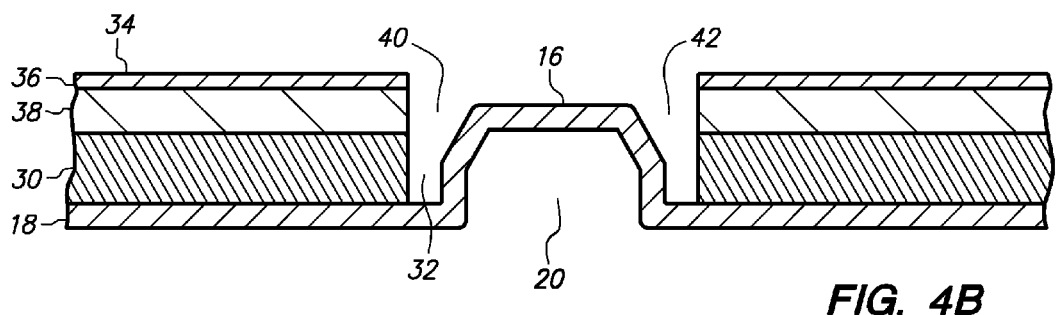
Figure 4C:
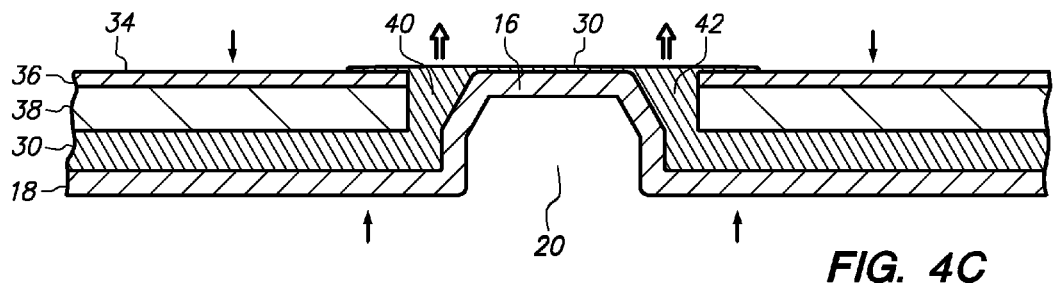
Figure 4D:
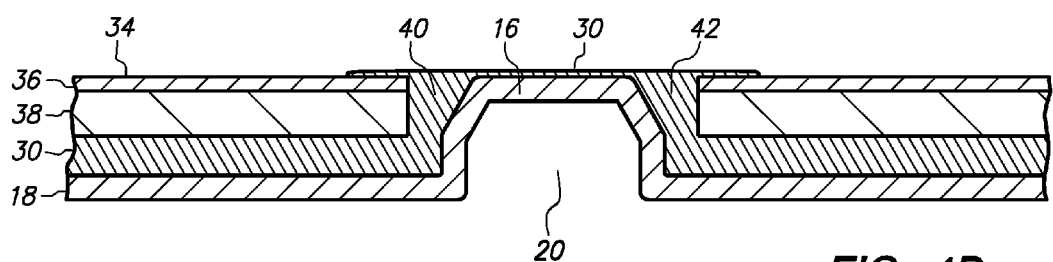
Figure 4E:
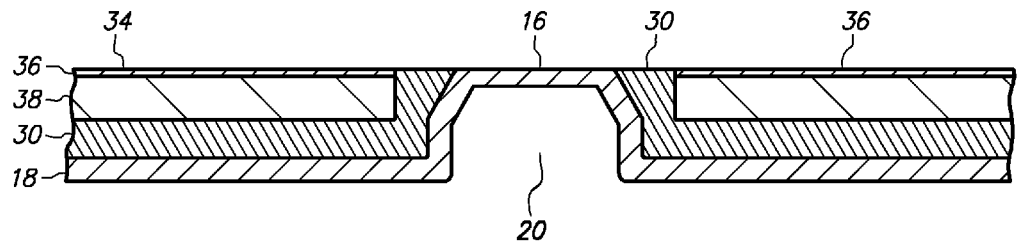
Figure 4F:
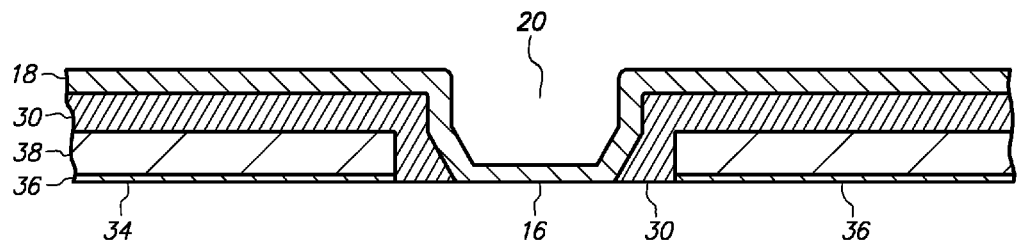
Figure 4G:
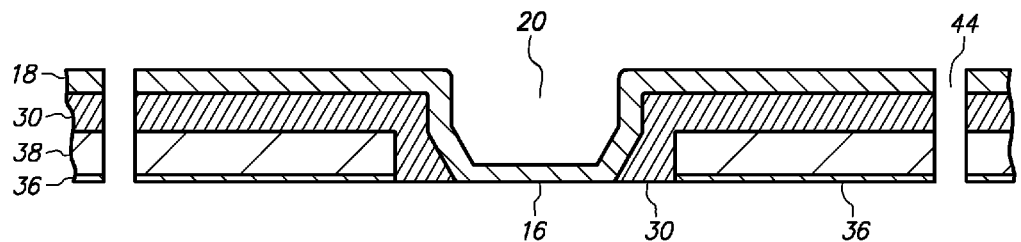
Figure 4H:
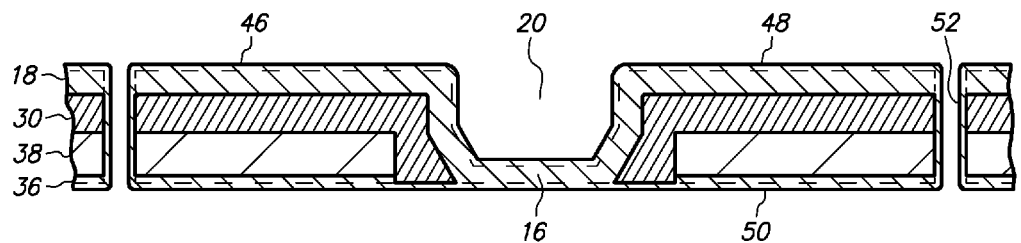
Figure 4I:
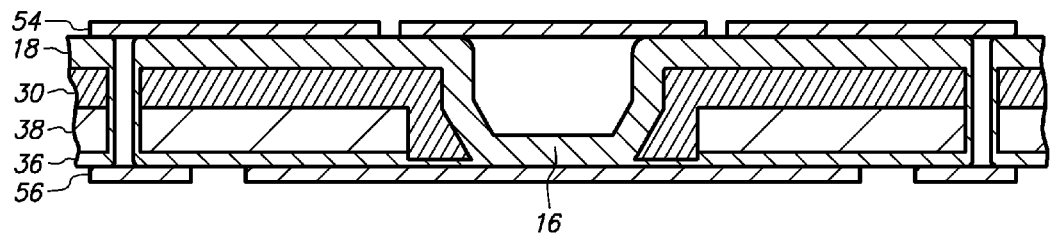
Figure 4J:
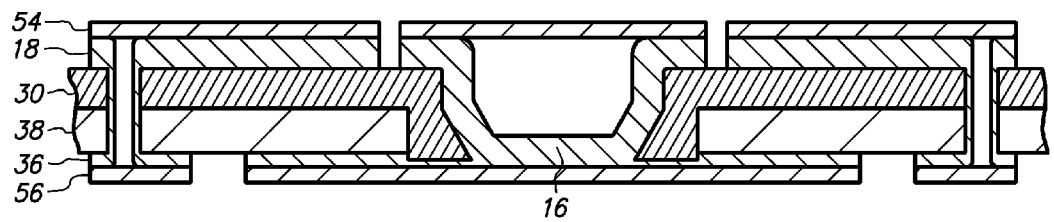
Figure 4K:
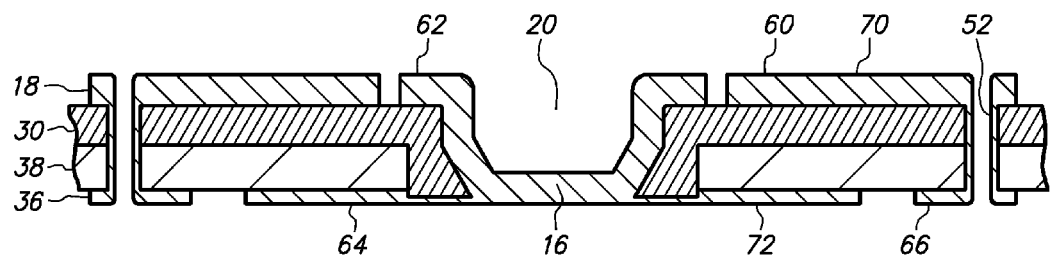
Figure 4L:
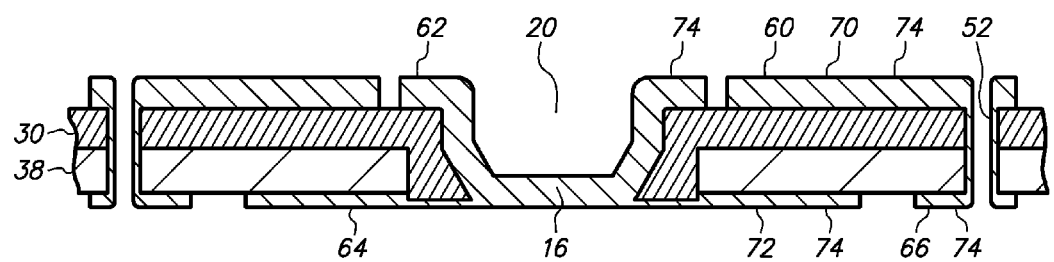
Figure 4M:
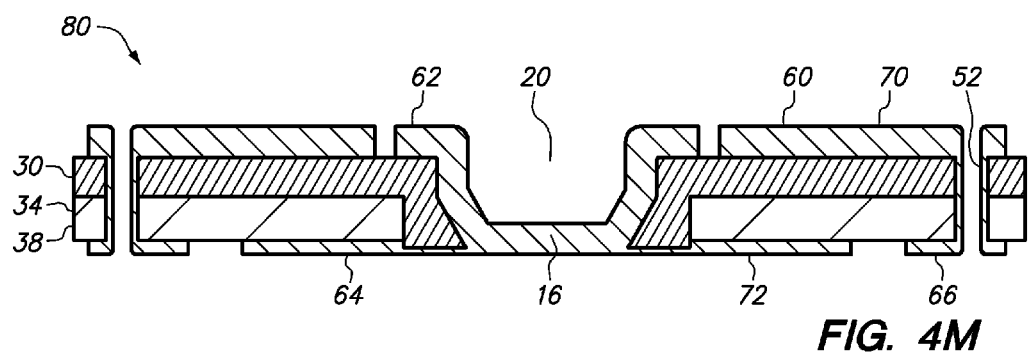
Figure 4N:
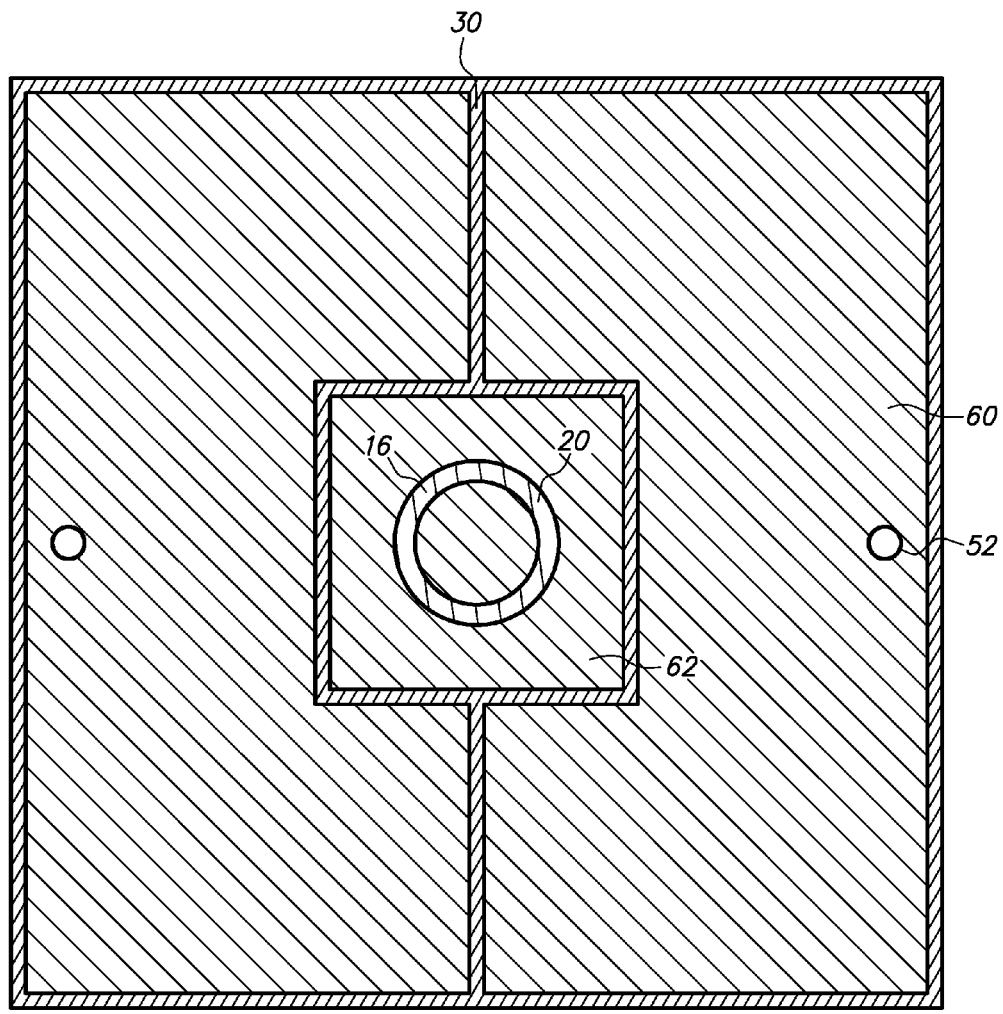
Figure 40:
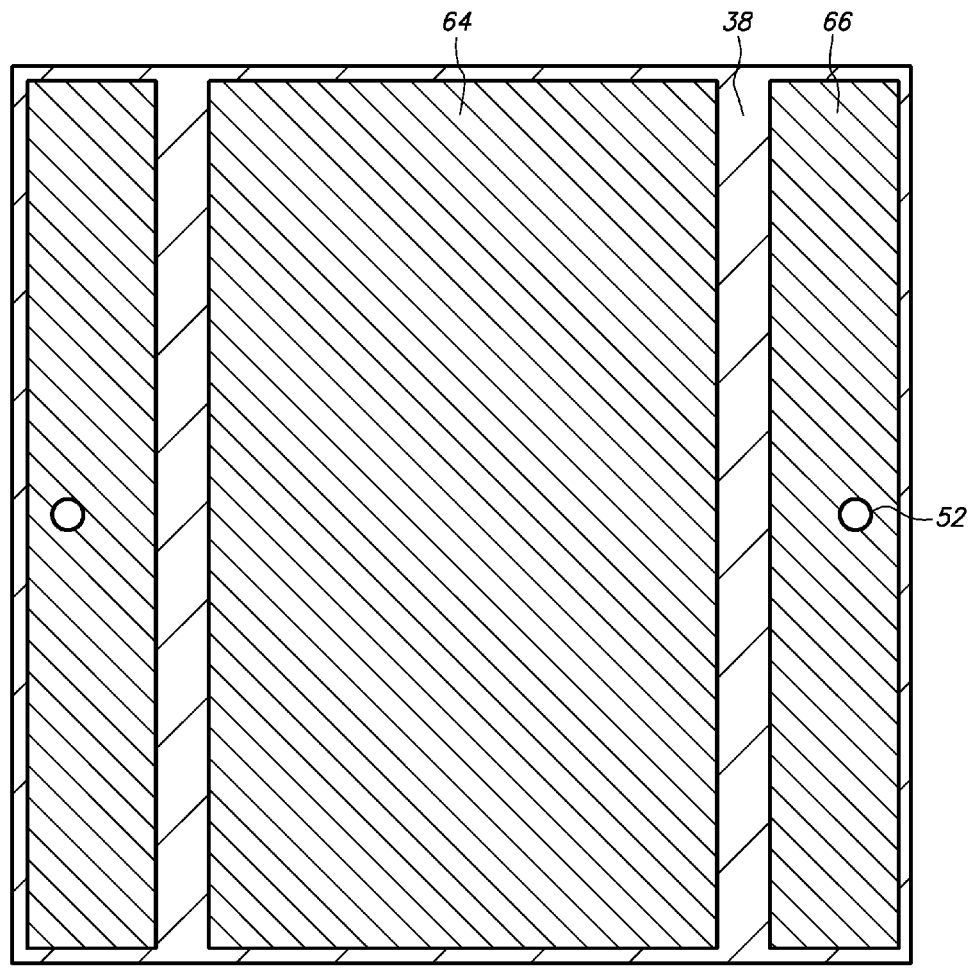

FIGS. 4A-4M are cross-sectional views showing a method of making a thermal board that includes bump 16, adhesive 30 and substrate 34 in accordance with an embodiment of the present invention, and FIGS. 4N and 4O are top and bottom views, respectively, corresponding to FIG. 4M.

In FIGS. 4A and 4B the structure is inverted to a cavity-down position so that gravity assists with mounting adhesive 30 and substrate 34 on ledge 18 and in FIGS. 4C-4E the structure remains in the cavity-down position. Thereafter, in FIGS. 4F-4O the structure is inverted again to the cavity-up position as in FIGS. 1A-1D. Thus, cavity 20 faces downward in FIGS. 4A-4E and upward in FIGS. 4F-4O. However, the relative orientation of the structure does not change. Cavity 20 faces in the first vertical direction and is covered by bump 16 in the second vertical direction regardless of whether the structure is inverted, rotated or slanted. Likewise, bump 16 extends beyond substrate 34 in the first vertical direction and ledge 18 in the second vertical direction regardless of whether the structure is inverted, rotated or slanted. Hence, the first and second vertical directions are oriented relative to the structure and remain opposite to one another and orthogonal to the lateral directions.

FIG. 4A is a cross-sectional view of the structure with adhesive 30 mounted on ledge 18. Adhesive 30 is mounted by lowering it onto ledge 18 as bump 16 is inserted into and through and upwards in opening 32. Adhesive 30 eventually contacts and rests on ledge 18. Preferably, bump 16 is inserted into and extends through opening 32 without contacting adhesive 30 and is aligned with and centrally located within opening 32.

FIG. 4B is a cross-sectional view of the structure with substrate 34 mounted on adhesive 30. Substrate 34 is mounted by lowering it onto adhesive 30 as bump 16 is inserted into and upwards in aperture 40. Substrate 34 eventually contacts and rests on adhesive 30.

Bump 16 is inserted into but not through aperture 40 without contacting substrate 34 and is aligned with and centrally located within aperture 40. As a result, gap 42 is located in aperture 40 between bump 16 and substrate 34. Gap 42 laterally surrounds bump 16 and is laterally surrounded by substrate 34. In addition, opening 32 and aperture 40 are precisely aligned with one another and have the same diameter.

At this stage, substrate 34 is mounted on and contacts and extends above adhesive 30. Bump 16 extends through opening 32 into aperture 40 to dielectric layer 38, is 50 microns below the top surface of conductive layer 36 and is exposed through aperture 40 in the upward direction. Adhesive 30 contacts and is sandwiched between ledge 18 and substrate 34, contacts dielectric layer 38 but is spaced from conductive layer 36 and remains a non-solidified prepreg with B-stage uncured epoxy, and gap 42 is filled with air.

FIG. 4C is a cross-sectional view of the structure with adhesive 30 in gap 42. Adhesive 30 is flowed into gap 42 by applying heat and pressure. In this illustration, adhesive 30 is forced into gap 42 by applying downward pressure to conductive layer 36 and/or upward pressure to ledge 18, thereby moving ledge 18 and substrate 34 towards one another and applying pressure to adhesive 30 while simultaneously applying heat to adhesive 30. Adhesive 30 becomes compliant enough under the heat and pressure to conform to virtually any shape. As a result, adhesive 30 sandwiched between ledge 18 and substrate 34 is compressed, forced out of its original shape and flows into and upward in gap 42. Ledge 18 and substrate 34 continue to move towards one another and adhesive 30 eventually fills gap 42. Moreover, adhesive 30 remains sandwiched between and continues to fill the reduced space between ledge 18 and substrate 34.

For instance, ledge 18 and conductive layer 36 can be disposed between top and bottom platens (not shown) of a press. In addition, a top cull plate and top buffer paper (not shown) can be sandwiched between conductive layer 36 and the top platen, and a bottom cull plate and bottom buffer paper (not shown) can be sandwiched between ledge 18 and the bottom platen. The stack includes the top platen, top cull plate, top buffer paper, substrate 34, adhesive 30, ledge 18, bottom buffer paper, bottom cull plate and bottom platen in descending order. Furthermore, the stack may be positioned on the bottom platen by tooling pins (not shown) that extend upward from the bottom platen through registration holes (not shown) in ledge 18.

The platens are heated and move towards one another, thereby applying heat and pressure to adhesive 30. The cull plates disperse the heat from the platens so that it is more uniformly applied to ledge 18 and substrate 34 and thus adhesive 30, and the buffer papers disperse the pressure from the platens so that it is more uniformly applied to ledge 18 and substrate 34 and thus adhesive 30. Initially, dielectric layer 38 contacts and presses down on adhesive 30. As the platen motion and heat continue, adhesive 30 between ledge 18 and substrate 34 is compressed, melted and flows into and upward in gap 42 and across dielectric layer 38 to conductive layer 36. For instance, the uncured epoxy is melted by the heat and the molten uncured epoxy is squeezed by the pressure into gap 42, however the reinforcement and the filler remain between ledge 18 and substrate 34. Adhesive 30 elevates more rapidly than bump 16 in aperture 40 and fills gap 42. Adhesive 30 also rises slightly above gap 42 and overflows onto the top surfaces of bump 16 and conductive layer 36 adjacent to gap 42 before the platen motion stops. This may occur due to the prepreg being slightly thicker than necessary. As a result, adhesive 30 creates a thin coating on the top surfaces of bump 16 and conductive layer 36. The platen motion is eventually blocked by bump 16 and the platens become stationary but continue to apply heat to adhesive 30.

The upward flow of adhesive 30 in gap 42 is shown by the thick upward arrows, the upward motion of bump 16 and ledge 18 relative to substrate 34 is shown by the thin upward arrows, and the downward motion of substrate 34 relative to bump 16 and ledge 18 is shown by the thin downward arrows.

FIG. 4D is a cross-sectional view of the structure with adhesive 30 solidified.

For instance, the platens continue to clamp bump 16 and ledge 18 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 30 as solidified provides a secure robust mechanical bond between bump 16 and substrate 34 and between ledge 18 and substrate 34. Adhesive 30 can withstand normal operating pressure without distortion or damage and is only temporarily distorted under unusually high pressure. Furthermore, adhesive 30 can absorb thermal expansion mismatch between bump 16 and substrate 34 and between ledge 18 and substrate 34.

At this stage, bump 16 and conductive layer 36 are essentially coplanar with one another and adhesive 30 and conductive layer 36 extend to a top surface that faces in the upward direction. For instance, adhesive 30 between ledge 18 and dielectric layer 38 has a thickness of 100 microns which is 50 microns less than its initial thickness of 150 microns, bump 16 ascends 50 microns in aperture 40 and substrate 34 descends 50 microns relative to bump 16. The 250 micron height of bump 16 is essentially the same as the combined height of conductive layer 36 (30 microns), dielectric layer 38 (120 microns) and the underlying adhesive 30 (100 microns). Furthermore, bump 16 continues to be centrally located in opening 32 and aperture 40 and spaced from substrate 34 and adhesive 30 fills the space between ledge 18 and substrate 34 and fills gap 42. For instance, gap 42 (as well as adhesive 30 between bump 16 and substrate 34) has a width of 225 microns ((1550−1000)/2) at floor 26. Adhesive 30 extends across dielectric layer 38 in gap 42. That is, adhesive 30 in gap 42 extends in the upward and downward directions across the thickness of dielectric layer 38 at the outer sidewall of gap 42. Adhesive 30 also includes a thin top portion above gap 42 that contacts the top surfaces of bump 16 and conductive layer 36 and extends above bump 16 by 10 microns.

FIG. 4E is a cross-sectional view of the structure after upper portions of bump 16, adhesive 30 and conductive layer 36 are removed.

Bump 16, adhesive 30 and conductive layer 36 have their upper portions removed by grinding. For instance, a rotating diamond sand wheel and distilled water are applied to the top of the structure. Initially, the diamond sand wheel grinds only adhesive 30. As the grinding continues, adhesive 30 becomes thinner as its grinded surface migrates downwardly. Eventually the diamond sand wheel contacts bump 16 and conductive layer 36 (not necessarily at the same time), and as a result, begins to grind bump 16 and conductive layer 36 as well. As the grinding continues, bump 16, adhesive 30 and conductive layer 36 become thinner as their grinded surfaces migrate downwardly. The grinding continues until the desired thickness has been removed. Thereafter, the structure is rinsed in distilled water to remove contaminants.

The grinding removes a 25 micron thick upper portion of adhesive 30, a 15 micron thick upper portion of bump 16 and a 15 micron thick upper portion of conductive layer 36. The decreased thickness does not appreciably affect bump 16 or adhesive 30. However, it substantially reduces the thickness of conductive layer 36 from 30 microns to 15 microns.

At this stage, bump 16, adhesive 30 and conductive layer 36 are coplanar with one another at a smoothed lapped lateral top surface that is above dielectric layer 38 and faces in the upward direction.

FIG. 4F is a cross-sectional view of the structure after it is inverted.

FIG. 4G is a cross-sectional view of the structure with hole 44. Hole 44 is a through-hole that extends through ledge 18, adhesive 30, conductive layer 36 and dielectric layer 38 and has a diameter of 300 microns. Hole 44 is formed by mechanical drilling and can be formed by other techniques such as laser drilling and plasma etching.

FIG. 4H is a cross-sectional view of the structure with plated layer 46 deposited on bump 16, ledge 18, adhesive 30, conductive layer 36 and dielectric layer 38. Plated layer 46 forms upper plated layer 48, lower plated layer 50 and plated through-hole 52.

Upper plated layer 48 is deposited on and contacts bump 16 and ledge 18 at surface 12 and covers them in the upward direction. Upper plated layer 48 is an unpatterned copper layer with a thickness of 20 microns.

Lower plated layer 50 is deposited on and contacts bump 16, adhesive 30 and conductive layer 36 at the lateral bottom surface and covers them in the downward direction. Lower plated layer 50 is an unpatterned copper layer with a thickness of 20 microns.

Plated through-hole 52 is deposited on and contacts ledge 18, adhesive 30, conductive layer 36 and dielectric layer 38 in hole 44 and covers the inner sidewall in the lateral directions. Plated through-hole 52 is a copper tube with a thickness of 20 microns and is adjacent to and integral with and electrically connects plated layers 48 and 50.

For instance, the structure is dipped in an activator solution to render adhesive 30 and dielectric layer 38 catalytic to electroless copper, then a first copper layer is electrolessly plated on bump 16, ledge 18, adhesive 30, conductive layer 36 and dielectric layer 38, and then a second copper layer is electroplated on the first copper layer. The first copper layer has a thickness of 2 microns, the second copper layer has a thickness of 18 microns, and plated layer 46 (and plated layers 48 and 50 and plated through-hole 52) has a thickness of 20 microns. As a result, bump 16 and ledge 18 essentially grow in the upward direction and conductive layer 36 essentially grows in the downward direction. Furthermore, cavity 20 ascends 20 microns in the upward direction, continues to extend across most of bump 16 in the vertical and lateral directions and retains a depth of 250 microns.

Upper plated layer 48 serves as a build-up layer for bump 16 and ledge 18, lower plated layer 50 serves as a base for bump 16, a build-up layer for conductive layer 36 and a bridge between bump 16 and conductive layer 36 and plated through-hole 52 serves as an electrical interconnect between ledge 18 and conductive layer 36.

Bump 16, ledge 18, upper plated layer 48 and plated through-hole 52 are shown as a single layer for convenience of illustration. Likewise, bump 16, conductive layer 36, lower plated layer 50 and plated through-hole 52 are shown as a single layer for convenience of illustration. The boundary (shown in phantom) between bump 16 and upper plated layer 48, between ledge 18 and upper plated layer 48, between ledge 18 and plated through-hole 52, between bump 16 and lower plated layer 50, between conductive layer 36 and lower plated layer 50 and between conductive layer 36 and plated through-hole 52 may be difficult or impossible to detect since copper is plated on copper. However, the boundary between adhesive 30 and lower plated layer 50 outside hole 44, between adhesive 30 and plated through-hole 52 in hole 44 and between dielectric layer 38 and plated through-hole 52 in hole 44 is clear.

FIG. 4I is a cross-sectional view of the structure with etch masks 54 and 56 formed on plated layers 48 and 50, respectively.

Etch masks 54 and 56 are illustrated as photoresist layers which are deposited on plated layers 48 and 50, respectively, using dry film lamination in which hot rolls simultaneously press photoresist layers 54 and 56 onto plated layers 48 and 50, respectively. Wet spin coating and curtain coating are also suitable deposition techniques.

A first reticle (not shown) is positioned proximate to photoresist layer 54 and a second reticle (not shown) is positioned proximate to photoresist layer 56. Thereafter, photoresist layers 54 and 56 are patterned by selectively applying light through the first and second reticles, respectively, so that the photoresist portions exposed to the light are rendered insoluble, applying a developer solution to remove the photoresist portions that are unexposed to the light and remain soluble and then hard baking, as is conventional. As a result, photoresist layer 54 has a pattern that selectively exposes upper plated layer 48 and photoresist layer 56 has a pattern that selectively exposes lower plated layer 50. However, photoresist layers 54 and 56 cover bump 16 and plated through-hole 52 in the upward and downward directions, respectively.

FIG. 4J is a cross-sectional view of the structure with selected portions of ledge 18 and upper plated layer 48 removed by etching ledge 18 and upper plated layer 48 in the pattern defined by etch mask 54, and selected portions of conductive layer 36 and lower plated layer 50 removed by etching conductive layer 36 and lower plated layer 50 in the pattern defined by etch mask 56.

The etching is a front-side and back-side wet chemical etch. For instance, a top spray nozzle (not shown) and a bottom spray nozzle (not shown) can spray the wet chemical etch on the top and bottom of the structure, or the structure can be dipped in the wet chemical etch. The wet chemical etch etches through ledge 18 and upper plated layer 48 to expose adhesive 30 in the upward direction and converts ledge 18 and upper plated layer 48 from unpatterned into patterned layers. The wet chemical etch also etches through conductive layer 36 and lower plated layer 50 to expose dielectric layer 38 in the downward direction and converts conductive layer 36 and lower plated layer 50 from unpatterned into patterned layers. As a result, adhesive 30 is exposed in the upward direction but not the downward direction and dielectric layer 38 is exposed in the downward direction but not the upward direction.

A suitable wet chemical etch that is highly selective of copper can be provided by a solution containing alkaline ammonia or a dilute mixture of nitric and hydrochloric acid. Likewise, the wet chemical etch can be acidic or alkaline. The optimal etch time for providing the pattern transfer without excessively exposing ledge 18, conductive layer 36 and plated layers 48 and 50 to the wet chemical etch can be established through trial and error.

FIG. 4K is a cross-sectional view of the structure after etch masks 54 and 56 are removed. The photoresist layers are stripped using a solvent, such as a strong alkaline solution containing potassium hydroxide with a pH of 14, that is highly selective of photoresist with respect to copper.

Ledge 18 and upper plated layer 48 as etched include pad 60 and flange 62. Thus, pad 60 and flange 62 are selected portions of ledge 18 and upper plated layer 48 defined by etch mask 54 that are spaced from one another. Pad 60 is adjacent to and extends laterally from and is electrically connected to plated through-hole 52 and is spaced from bump 16. Flange 62 is adjacent to and integral with and extends laterally from and is thermally connected to bump 16 and is spaced from plated through-hole 52. Flange 62 is positioned so that bump 16 and cavity 20 are centrally located within its periphery. Furthermore, pad 60 and flange 62 contact adhesive 30, are spaced from dielectric layer 38, extend above adhesive 30 and dielectric layer 38, are flat, have a thickness of 90 microns (70+20) and are coplanar with one another at a top surface that faces in the upward direction.

Conductive layer 36 and lower plated layer 50 as etched include base 64 and terminal 66. Thus, base 64 and terminal 66 are selected portions of conductive layer 36 and lower plated layer 50 defined by etch mask 56 that are spaced from one another. Base 64 is adjacent to and extends below and laterally from and is thermally connected to bump 16, covers bump 16 and flange 62 in the downward direction and is spaced from plated through-hole 52. Base 64 has a thickness of 20 microns where it is adjacent to bump 16 and a thickness of 35 microns (15+20) where it is adjacent to dielectric layer 38. Moreover, base 64 has a thickness of 20 microns where it is adjacent to adhesive 30 and spaced from dielectric layer 38 and a thickness of 35 microns where it is adjacent to a corner-shaped interface between a side surface of adhesive 30 and a bottom surface of dielectric layer 38. Terminal 66 is adjacent to and electrically connected to plated through-hole 52, is spaced from bump 16 and has a thickness of 35 microns (15+20). Furthermore, base 64 contacts adhesive 30 and dielectric layer 38, terminal 66 contacts dielectric layer 38 and is spaced from adhesive 30, and base 64 and terminal 66 extend below adhesive 30 and dielectric layer 38, have the same thickness where they are closest to one another, have different thickness where base 64 is adjacent to bump 16 and are coplanar with one another at a bottom surface that faces in the downward direction.

Conductive trace 70 includes plated through-hole 52, pad 60 and terminal 66. Thus, conductive trace 70 includes selected portions of ledge 18 and upper plated layer 48 that are adjacent to plated through-hole 52 and spaced from bump 16 and selected portions of conductive layer 36 and lower plated layer 50 that are adjacent to plated through-hole 52 and spaced from bump 16. Conductive trace 70 is located outside cavity 20. Furthermore, plated through-hole 52 provides an electrically conductive path between pad 60 and terminal 66.

Conductive trace 70 provides horizontal (fan-out) routing by pad 60 to plated through-hole 52 and vertical (top to bottom) routing from pad 60 to terminal 66 by plated through-hole 52. Conductive trace 70 is not limited to this configuration. For instance, pad 60 can be electrically connected to plated through-hole 52 by a routing line above adhesive 30 and dielectric layer 38 as defined by etch mask 54, and terminal 66 can be electrically connected to plated through-hole 52 by a routing line below adhesive 30 and dielectric layer 38 as defined by etch mask 56. Furthermore, the electrically conductive path can include vias that extend through adhesive 30 and/or dielectric layer 38 and routing lines (above and/or below adhesive 30 and/or dielectric layer 38) as well as passive components such as resistors and capacitors mounted on additional pads.

Heat spreader 72 includes bump 16, flange 62 and base 64. Thus, heat spreader 72 includes selected portions of ledge 18 and upper plated layer 48 that are adjacent to bump 16 and spaced from conductive trace 70, a selected portion of conductive layer 36 that is spaced from bump 16 and conductive trace 70 and a selected portion of lower plated layer 50 that is adjacent to bump 16 and spaced from conductive trace 70. Furthermore, bump 16 provides a thermally conductive path to base 64.

Heat spreader 72 is essentially a heat slug with an inverted T-like shape that includes a pedestal (bump 16), wings (base 64 portions that extend laterally from the pedestal) and a thermal pad (flange 62).

FIG. 4L is a cross-sectional view of the structure with plated contacts 74 formed on conductive trace 70 and heat spreader 72.

Plated contacts 74 are thin spot plated metal coatings that contact the exposed copper surfaces. Thus, plated contacts 74 contact bump 16, plated through-hole 52, pad 60 and flange 62 and cover them in the upward direction and contact plated through-hole 52, base 64 and terminal 66 and cover them in the downward direction. For instance, a nickel layer is electrolessly plated on the exposed copper surfaces, and then a silver layer is electrolessly plated on the nickel layer. The buried nickel layer has a thickness of 3 microns, the silver surface layer has a thickness of 0.5 microns, and plated contacts 74 have a thickness of 3.5 microns.

Bump 16, pad 60, flange 62, base 64 and terminal 66 treated with plated contacts 74 as a surface finish have several advantages. The buried nickel layer provides the primary mechanical and electrical and/or thermal connection, and the silver surface layer provides a wettable surface to facilitate solder reflow and accommodates a solder joint and a wire bond. Plated contacts 74 also protect conductive trace 70 and heat spreader 72 from corrosion. Plated contacts 74 can include a wide variety of metals to accommodate the external connection media. For instance, a gold surface layer can be plated on a buried nickel layer or a nickel surface layer alone can be employed.

Conductive trace 70 and heat spreader 72 treated with plated contacts 74 are shown as single layers for convenience of illustration. The boundary (not shown) in conductive trace 70 with plated contacts 74 and in heat spreader 72 with plated contacts 74 occurs at the copper/nickel interface.

At this stage, the manufacture of thermal board 80 can be considered complete.

FIGS. 4M, 4N and 4O are cross-sectional, top and bottom views, respectively, of thermal board 80 after it is detached at peripheral edges along cut lines from a support frame and/or adjacent thermal boards in a batch.

Thermal board 80 includes adhesive 30, substrate 34, conductive trace 70 and heat spreader 72. Substrate 34 includes dielectric layer 38. Conductive trace 70 includes plated through-hole 52, pad 60 and terminal 66. Heat spreader 72 includes bump 16, flange 62 and base 64.

Bump 16 is adjacent to flange 62 at bent corner 22A, is adjacent to base 64 at bent corner 22C and at floor 26, extends from base 64 in the upward direction, extends from flange 62 in the downward direction and is integral with flange 62. Bump 16 extends into and remains centrally located within opening 32 and aperture 40 and is coplanar at its bottom with an adjacent portion of adhesive 30 that contacts base 64. Bump 16 also contacts adhesive 30, is spaced from dielectric layer 38 and retains its tubular/cut-off conical shape in which its diameter increases and then is constant as it extends upwardly from base 64 to flange 62.

Cavity 20 faces in the upward direction, extends into and remains centrally located within bump 16, opening 32 and aperture 40, is covered by bump 16 in the downward direction and is spaced from base 64 by bump 16. Cavity 20 conforms to the shape of bump 16, is shaped by bent corners 22A, 22B and 22C, sidewalls 24A and 24B and floor 26, has angle $\theta_1$ at sidewall 24A relative to floor 26 and angle $\theta_2$ at sidewall 24B relative to floor 26, extends across most of bump 16 in the vertical and lateral directions and retains its tubular/cut-off conical shape in which its diameter increases and then is constant as it extends upwardly from floor 26 to its entrance at flange 62.

Flange 62 extends laterally from bump 16, is adjacent to bent corner 22A and spaced from bent corners 22B and 22C, extends above and overlaps adhesive 30, dielectric layer 38, opening 32 and aperture 40, contacts adhesive 30 and is spaced from dielectric layer 38 and base 64. Flange 62 is also thicker than base 64.

Base 64 extends laterally from bump 16, is adjacent to bent corner 22C and floor 26 and spaced from bent corners 22A and 22B, extends laterally beyond opening 32, aperture 40 and flange 62 and covers bump 16, opening 32, aperture 40 and flange 62 in the downward direction. Base 64 contacts adhesive 30 and dielectric layer 38, extends beyond adhesive 30 and dielectric layer 38 in the downward direction, supports adhesive 30 and substrate 34 and is spaced from the peripheral edges of thermal board 80. Base 64 has a first thickness where it is adjacent to bump 16, a second thickness where it is adjacent to dielectric layer 38 that is larger than the first thickness and a flat surface that faces in the downward direction. Moreover, base 64 has the first thickness where it is adjacent to adhesive 30 and spaced from dielectric layer 38 and the second thickness where it is adjacent to a corner-shaped interface between adhesive 30 and dielectric layer 38.

Base 64 contacts adhesive 30 and dielectric layer 38, extends beyond adhesive 30 and dielectric layer 38 in the downward direction, supports adhesive 30 and substrate 34 and is spaced from the peripheral edges of thermal board 80. Base 64 has a first thickness (20 microns) where it is adjacent to bump 16, a second thickness (35 microns) where it is adjacent to dielectric layer 38 that is larger than the first thickness and a flat surface that faces in the downward direction. Moreover, base 64 has the first thickness where it is adjacent to adhesive 30 and spaced from dielectric layer 38 and the second thickness where it is adjacent to a corner-shaped interface between adhesive 30 and dielectric layer 38.

Adhesive 30 contacts and is sandwiched between and fills the space between bump 16 and dielectric layer 38 in gap 42, contacts dielectric layer 38, plated through-hole 52 and flange 62 outside gap 42, contacts base 64 and is spaced from terminal 66. Adhesive 30 extends across dielectric layer 38 in gap 42, extends between bump 16 and flange 62, extends between bump 16 and base 64 and is sandwiched between bump 16 and plated through-hole 52 and between flange 62 and base 64. Adhesive 30 also extends laterally from bump 16 beyond conductive trace 70 to peripheral edges of the assembly and is solidified.

Adhesive 30 covers and surrounds sidewalls 24A and 24B of bump 16 in the lateral directions, covers base 64 outside the periphery of bump 16 in the upward direction, covers dielectric layer 38 and terminal 66 in the upward direction and covers pad 60 and flange 62 in the downward direction. Adhesive 30 also conformally coats sidewalls 24A and 24B of bump 16, a top surface of dielectric layer 38 and a top surface portion of base 64 that is adjacent to and extends laterally from bump 16 and faces in the upward direction.

Adhesive 30 alone can intersect an imaginary horizontal line between bump 16 and dielectric layer 38, an imaginary horizontal line between bump 16 and plated through-hole 52, an imaginary horizontal line between bump 16 and base 64, an imaginary vertical line between bump 16 and base 64, an imaginary vertical line between pad 60 and dielectric layer 38, an imaginary vertical line between flange 62 and dielectric layer 38 and an imaginary vertical line between flange 62 and base 64. However, adhesive 30 alone cannot intersect an imaginary line between bump 16 and terminal 66, between pad 60 and base 64, between pad 60 and terminal 66 or between flange 62 and terminal 66. Thus, an imaginary horizontal line exists that intersects only adhesive 30 as the line extends from bump 16 to dielectric layer 38, however no imaginary line (horizontal, vertical or otherwise) exists that intersects only adhesive 30 as the line extends from bump 16 to terminal 66 since such line would also intersect dielectric layer 38 and/or base 64 and/or base 64 between bump 16 and terminal 66.

Dielectric layer 38 contacts and is sandwiched between adhesive 30 and base 64 and between adhesive 30 and terminal 66.

Pad 60 and flange 62 contact adhesive 30 and are spaced from dielectric layer 38.

Plated through-hole 52 contacts and extends above and below and through adhesive 30 and dielectric layer 38 in hole 44. Plated through-hole 52 retains its tubular shape with straight vertical inner and outer sidewalls in which its diameter is constant as it extends vertically from pad 60 to terminal 66.

Bump 16 is coplanar with adhesive 30 at their bottoms at base 64. Furthermore, pad 60 and flange 62 have the same thickness (90 microns) and are coplanar with one another above adhesive 30 and dielectric layer 38 at a surface that faces in the upward direction, and base 64 and terminal 66 have the same thickness where they are closest to one another, have different thickness where base 64 is adjacent to bump 16 and are coplanar with one another below adhesive 30 and dielectric layer 38 at a surface that faces in the downward direction.

Adhesive 30 and dielectric layer 38 extend to straight vertical peripheral edges of thermal board 80 after it is detached or singulated from a batch of identical simultaneously manufactured thermal boards.

Pad 60 is customized as an electrical interface for a semiconductor device such as an LED chip that is subsequently mounted on bump 16, terminal 66 is customized as an electrical interface for the next level assembly such as a solderable wire from a printed circuit board, and base 64 is customized as a thermal interface for the next level assembly such as the printed circuit board or a heat sink for an electronic device.

Pad 60 and terminal 66 are horizontally and vertically offset from one another and exposed at the top and bottom surfaces, respectively, of thermal board 80, thereby providing horizontal and vertical signal routing between the semiconductor device and the next level assembly.

Conductive trace 70 is shown in cross-section as a continuous circuit trace for convenience of illustration. However, conductive trace 70 can provide horizontal signal routing in both the X and Y directions. That is, pad 60 and terminal 66 can be laterally offset from one another in the X and Y directions. Furthermore, plated through-hole 52 can be located at a corner of thermal board 80.

Conductive trace 70 and heat spreader 72 remain spaced from one another. As a result, conductive trace 70 and heat spreader 72 are mechanically attached and electrically isolated from one another.

Heat spreader 72 provides heat spreading and heat dissipation from a semiconductor device that is subsequently mounted on bump 16 to the next level assembly that thermal board 80 is subsequently mounted on. The semiconductor device generates heat that flows into bump 16 and through bump 16 into base 64 where it is spread out and dissipated in the downward direction, for instance to an underlying heat sink.

Plated contacts 74 occupy 85 to 95 percent of the top surface of thermal board 80 and thus provide a highly reflective top surface which is particularly useful if an LED device is subsequently mounted on bump 16 in cavity 20.

Bump 16, plated through-hole 52, pad 60, flange 62, base 64 and terminal 66 are the same metals—i.e. copper/nickel/silver. Bump 16, plated through-hole 52, pad 60, flange 62, base 64 and terminal 66 consist of a silver surface layer, a buried copper core and a buried nickel layer that contacts and is sandwiched between the silver surface layer and the buried copper core. Bump 16, plated through-hole 52, pad 60, flange 62, base 64 and terminal 66 are also primarily copper at the buried copper core. Plated contacts 74 provide the silver surface layer and the buried nickel layer and various combinations of metal plate 10, conductive layer 36 and plated layer 46 provide the buried copper core.

Conductive trace 70 includes a buried copper core shared by plated through-hole 52, pad 60 and terminal 66 and heat spreader 72 includes a buried copper core shared by bump 16, flange 62 and base 64. Furthermore, conductive trace 70 includes a plated contact 74 at plated through-hole 52, pad 60 and terminal 66 and heat spreader 72 includes a plated contact at bump 16 and flange 62 and spaced from base 64 and another plated contact 74 at base 64 and spaced from bump 16 and flange 62. Furthermore, conductive trace 70 and heat spreader 72 consist of copper/nickel/silver and are primarily copper at the buried copper core.

Thermal board 80 can include multiple conductive traces 70 with a plated through-hole 52, pad 60 and terminal 66. A single conductive trace 70 is described and labeled for convenience of illustration. In conductive traces 70, plated through-holes 52, pads 60 and terminals 66 generally have similar shapes and sizes. For instance, some conductive traces 70 may be spaced and separated and electrically isolated from one another whereas other conductive traces 70 can intersect or route to the same pad 60 or terminal 66 and be electrically connected to one another. Likewise, some pads 60 may receive independent signals whereas other pads 60 share a common signal, power or ground.

Thermal board 80 can be adapted for an LED package with blue, green and red LED chips, with each LED chip including an anode and a cathode and each LED package including a corresponding anode terminal and cathode terminal. In this instance, thermal board 80 can include six pads 60 and four terminals 66 so that each anode is routed from a separate pad 60 to a separate terminal 66 whereas each cathode is routed from a separate pad 60 to a common ground terminal 66.

A brief cleaning step can be applied to the structure at various manufacturing stages to remove oxides and debris that may be present on the exposed metal. For instance, a brief oxygen plasma cleaning step can be applied to the structure. Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 70 after they are formed. A plating bus can be disconnected during the wet chemical etch that forms pad 60 and flange 62.

Thermal board 80 can include registration holes (not shown) that are drilled or sliced through adhesive 30 and substrate 34 so that thermal board 80 can be positioned by inserting tooling pins through the registration holes when it is subsequently mounted on an underlying carrier.

Thermal board 80 can accommodate multiple semiconductor devices rather than one with a single bump or multiple bumps. Thus, multiple semiconductor devices can be mounted on a single bump or separate semiconductor devices can be mounted on separate bumps.

Thermal board 80 with a single bump for multiple semiconductor devices can be accomplished by drilling additional holes to define additional plated through-holes 52, adjusting etch mask 54 to define additional pads 60 and adjusting etch mask 56 to define additional terminals 66. The plated through-holes 52, pads 60 and terminals 66 can be laterally repositioned to provide a 2×2 array for four semiconductor devices. In addition, the topography (lateral shape) can be adjusted for pads 60, bases 64 and terminals 66.

Thermal board 80 with multiple bumps for multiple semiconductor devices can be accomplished by stamping metal plate 10 to include additional bumps 16, adjusting adhesive 30 to include additional openings 32, adjusting substrate 34 to include additional apertures 40, drilling additional holes to define additional plated through-holes 52, adjusting etch mask 54 to define additional pads 60 and flanges 62 and adjusting etch mask 56 to define additional bases 64 and terminals 66. The bumps 16, plated through-holes 52, pads 60, flanges 62, bases 64 and terminals 66 can be laterally repositioned to provide a 2×2 array for four semiconductor devices. In addition, the topography (lateral shape) can be adjusted for bumps 16, pads 60, flanges 62, bases 64 and terminals 66. Furthermore, bumps 16 can have separate bases 64 or share a single base 64 as defined by etch mask 56.

Figure 5A:
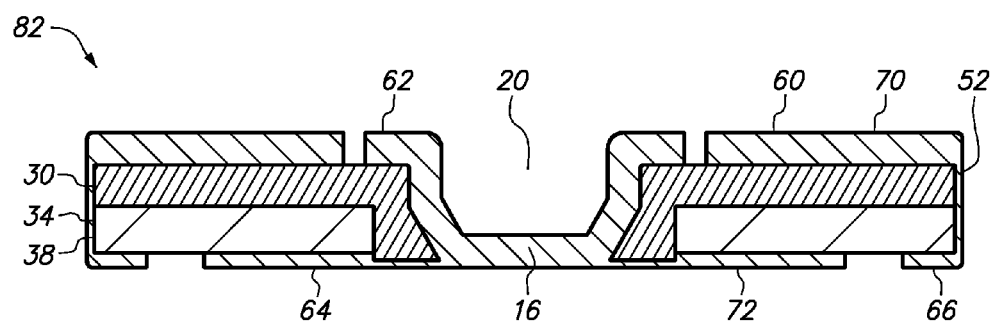
FIGS. 5A, 5B and 5C are cross-sectional, top and bottom views, respectively, of a thermal board with a plated through-hole at a peripheral edge in accordance with an embodiment of the present invention.
Figure 5B:
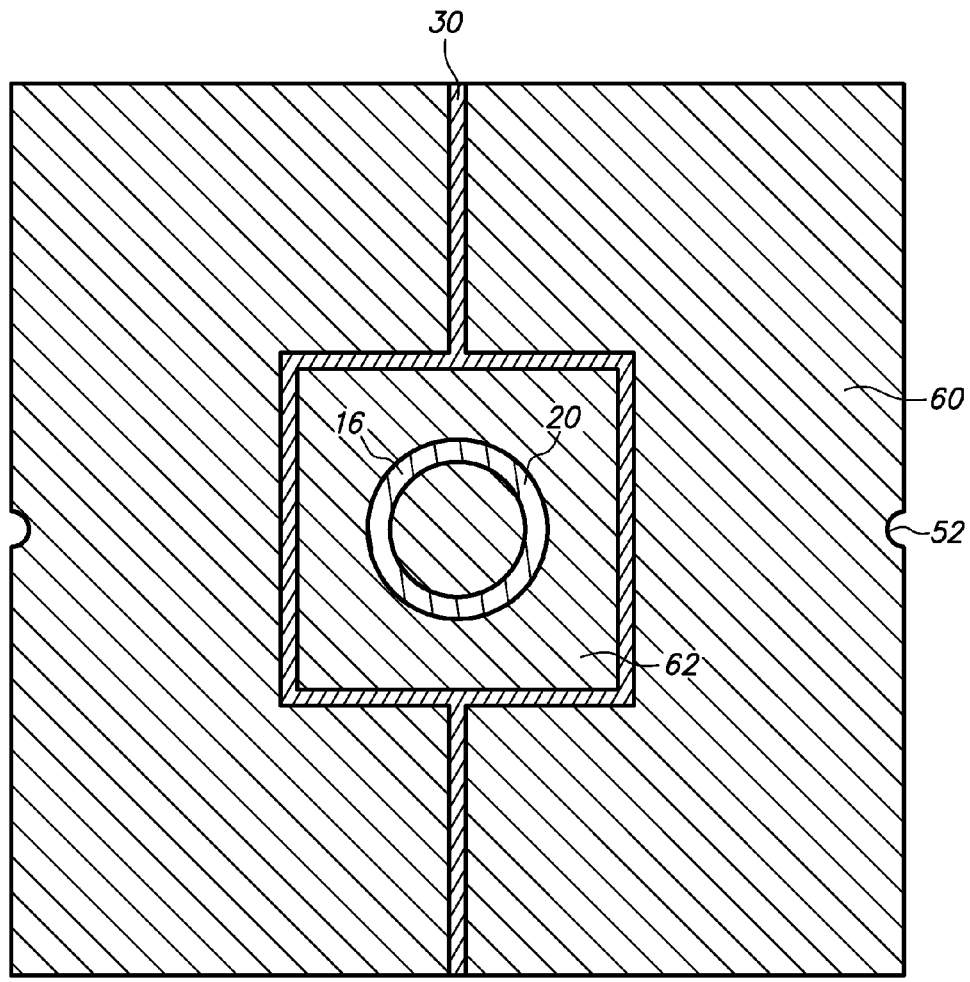
Figure 5C:
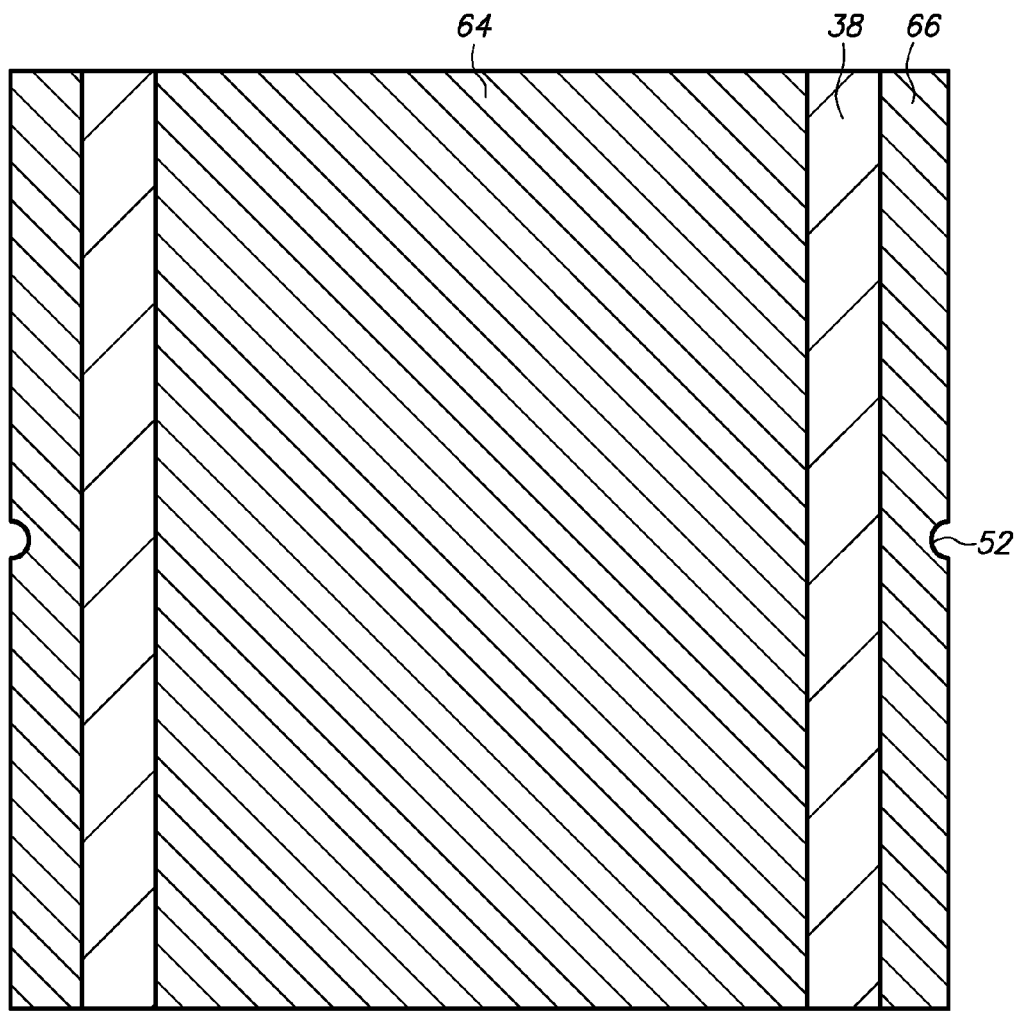

FIGS. 5A, 5B and 5C are cross-sectional, top and bottom views, respectively, of a thermal board with a plated through-hole at a peripheral edge in accordance with an embodiment of the present invention.

In this embodiment, the plated through-hole is located at a peripheral edge where the thermal board is detached. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 82 includes adhesive 30, substrate 34, conductive trace 70 and heat spreader 72. Substrate 34 includes dielectric layer 38. Conductive trace 70 includes plated through-hole 52, pad 60 and terminal 66. Heat spreader 72 includes bump 16, flange 62 and base 64.

Plated through-hole 52 is located at a peripheral edge of thermal board 82 rather than spaced from the peripheral edges of thermal board 82. Plated through-hole 52 has a semi-tubular shape with a semi-circular circumference rather than a tubular shape with a circular circumference and adhesive 30 extends laterally from bump 16 to but not beyond plated through-hole 52, pad 60 and terminal 66. Furthermore, thermal board 82 is more compact than thermal board 80.

Thermal board 82 can be manufactured in a manner similar to thermal board 80 with suitable adjustments for plated through-hole 52. For instance, adhesive 30 is mounted on ledge 18, substrate 34 is mounted on adhesive 30, heat and pressure are applied to flow and solidify adhesive 30, grinding is applied to planarize the bump 16, adhesive 30 and conductive layer 36 at a lateral surface, hole 44 is drilled through ledge 18, adhesive 30, conductive layer 36 and dielectric layer 38 and then plated layers 48 and 50 and plated through-hole 52 are deposited on the structure as previously described. Thereafter, ledge 18 and upper plated layer 48 are etched to form pad 60 and flange 62, conductive layer 36 and lower plated layer 50 are etched to form base 64 and terminal 66 and then plated contacts 74 provide a surface finish for bump 16, pad 60, flange 62, base 64 and terminal 66. Thereafter, adhesive 30, substrate 34, plated through-hole 52, pad 60, base 64 and terminal 66 are cut or cracked at the peripheral edges of thermal board 82 to detach it from the batch. As a result, a semi-tubular portion of plated through-hole 52 is detached from the peripheral edge while another semi-tubular portion of plated through-hole 52 at the peripheral edge remains intact.

Figure 6A:
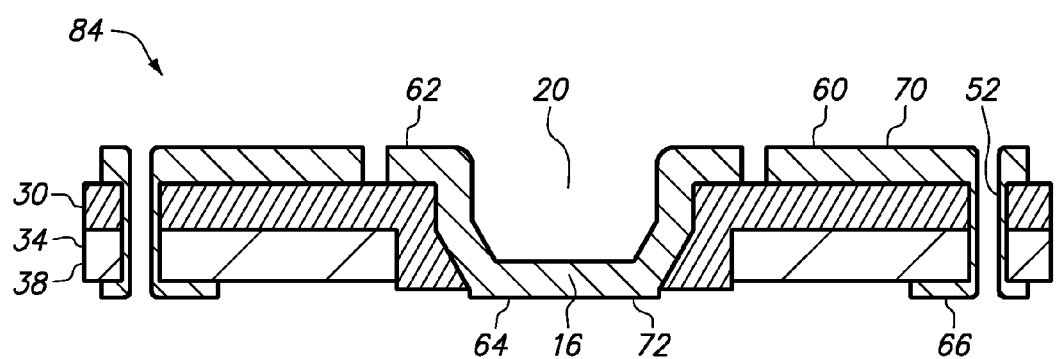
FIGS. 6A, 6B and 6C are cross-sectional, top and bottom views, respectively, of a thermal board with a coextensive bump and base in accordance with an embodiment of the present invention.
Figure 6B:
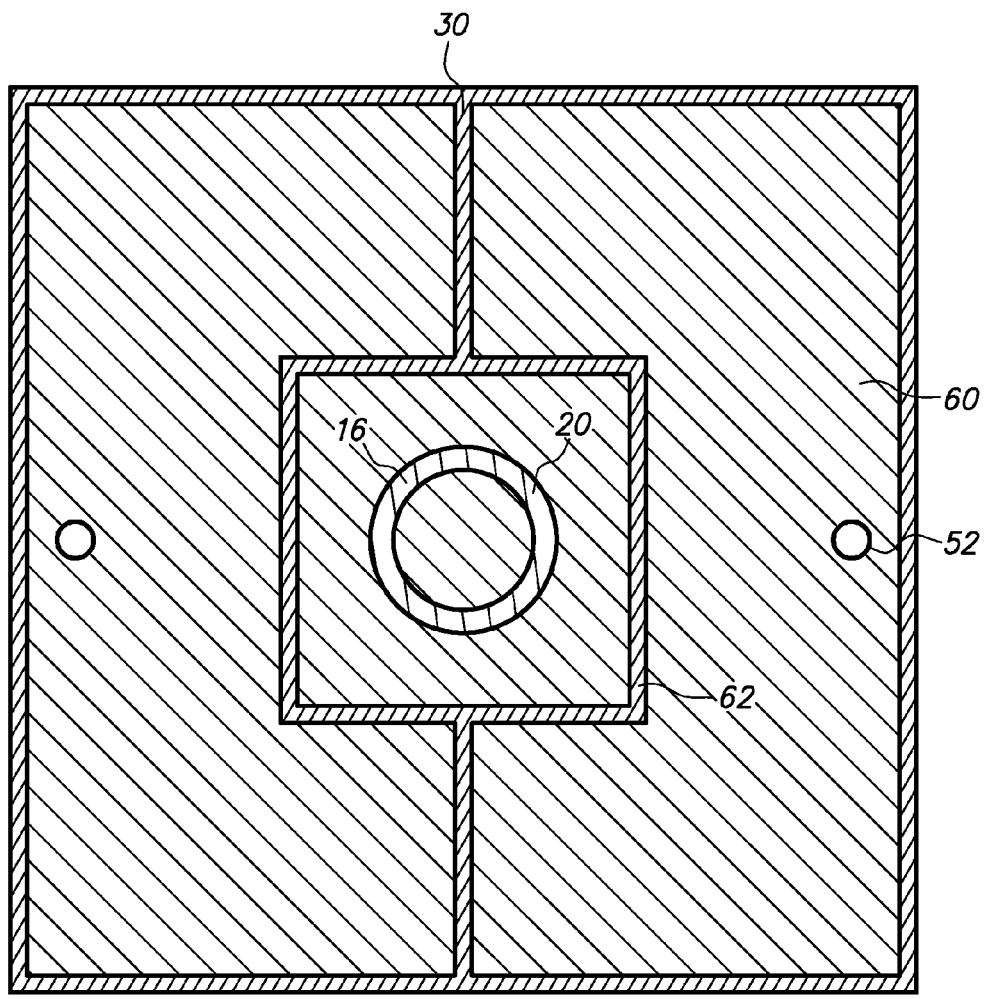
Figure 6C:
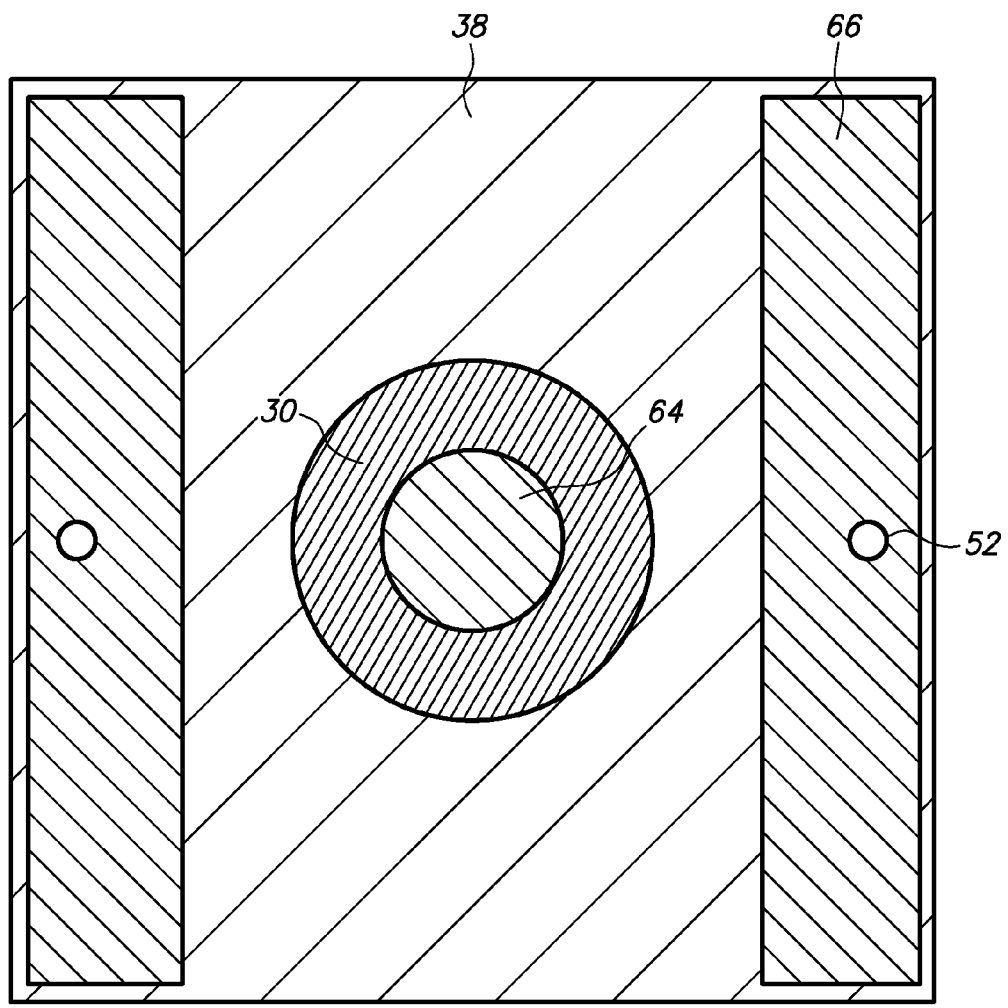

FIGS. 6A, 6B and 6C are cross-sectional, top and bottom views, respectively, of a thermal board with a coextensive bump and base in accordance with an embodiment of the present invention.

In this embodiment, the bump and the base are coextensive with one another. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 84 includes adhesive 30, substrate 34, conductive trace 70 and heat spreader 72. Substrate 34 includes dielectric layer 38. Conductive trace 70 includes plated through-hole 52, pad 60 and terminal 66. Heat spreader 72 includes bump 16, flange 62 and base 64.

Base 64 is coextensive with bump 16 at floor 26. As a result, base 64 does not extend laterally from bump 16 and adhesive 30 is exposed in the downward direction. Furthermore, thermal board 84 is more compact than thermal board 80.

Thermal board 84 can be manufactured in a manner similar to thermal board 80 with suitable adjustments for pad 60, base 64 and terminal 66. For instance, adhesive 30 is mounted on ledge 18, substrate 34 is mounted on adhesive 30, heat and pressure are applied to flow and solidify adhesive 30, grinding is applied to planarize the bump 16, adhesive 30 and conductive layer 36 at a lateral surface, hole 44 is drilled through ledge 18, adhesive 30, conductive layer 36 and dielectric layer 38 and then plated layers 48 and 50 and plated through-hole 52 are deposited on the structure as previously described. However, hole 44 is laterally shifted towards bump 16 and therefore plated through-hole 52 is laterally shifted towards bump 16. Thereafter, etch masks 54 and 56 are formed on plated layers 48 and 50, respectively. However, etch mask 54 is adjusted to reduce the size of pad 60 and etch mask 56 is adjusted to align base 64 with bump 16 at floor 28 and laterally shift terminal 66 towards bump 16. Thereafter, ledge 18 and upper plated layer 48 are etched to form pad 60 and flange 62, conductive layer 36 and lower plated layer 50 are etched to form base 64 and terminal 66 and then plated contacts 74 provide a surface finish for bump 16, pad 60, flange 62, base 64 and terminal 66. Thereafter, adhesive 30 and substrate 34 are cut or cracked at the peripheral edges of thermal board 84 to detach it from the batch.

Figure 7A:
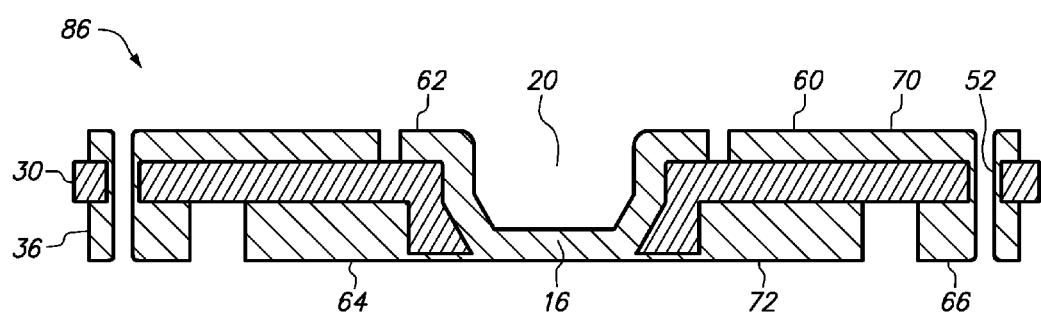
FIGS. 7A, 7B and 7C are cross-sectional, top and bottom views, respectively, of a thermal board with a thick base and terminal in accordance with an embodiment of the present invention.
Figure 7B:
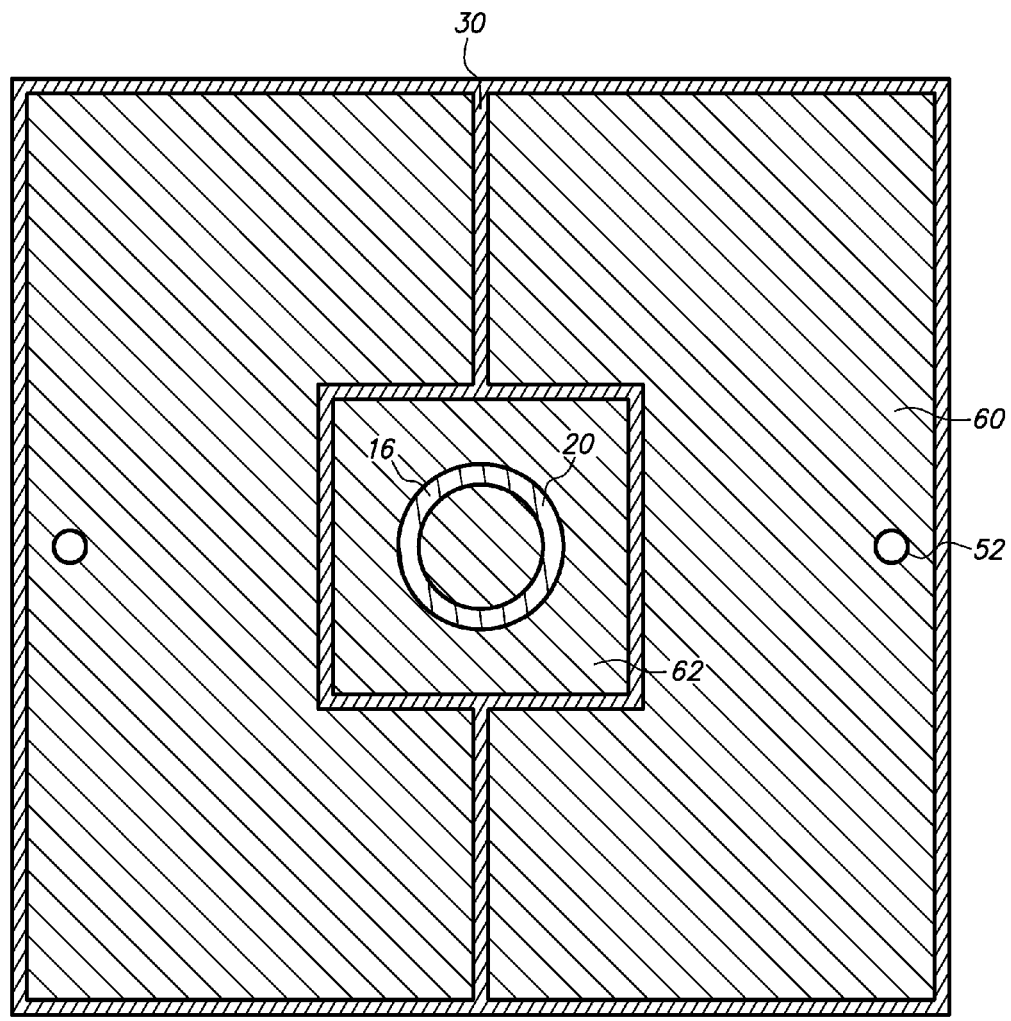
Figure 7C:
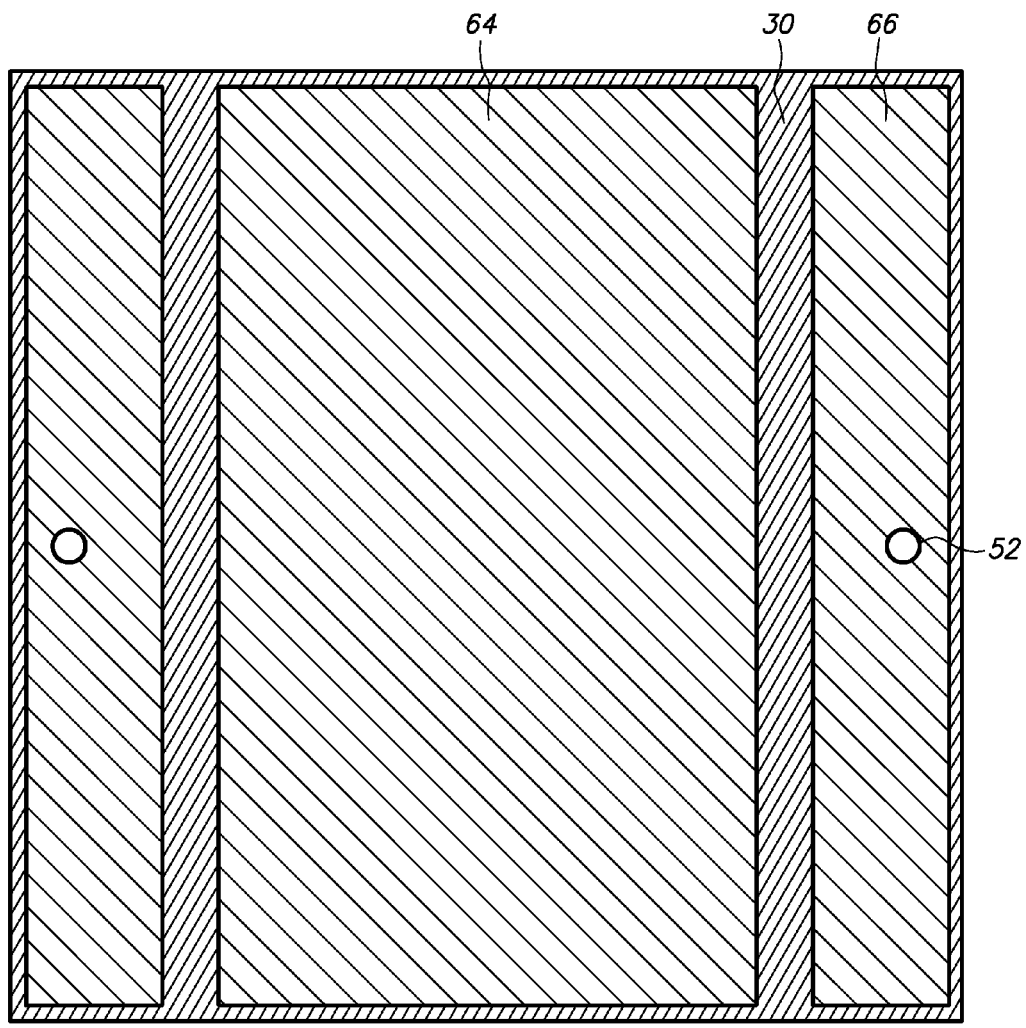

FIGS. 7A, 7B and 7C are cross-sectional, top and bottom views, respectively, of a thermal board with a thick base and terminal in accordance with an embodiment of the present invention.

In this embodiment, the substrate is a thick conductive layer and the dielectric layer is omitted. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 86 includes adhesive 30, conductive trace 70 and heat spreader 72. Conductive trace 70 includes plated through-hole 52, pad 60 and terminal 66. Heat spreader 72 includes bump 16, flange 62 and base 64.

Conductive layer 36 is thicker in this embodiment than the previous embodiment. For instance, conductive layer 36 has a thickness of 130 microns (rather than 30 microns) so that it can be handled without warping or wobbling. Base 64 and terminal 66 are therefore thicker, and thermal board 86 is devoid of a dielectric layer corresponding to dielectric layer 38.

Thermal board 86 can be manufactured in a manner similar to thermal board 80 with suitable adjustments for conductive layer 36. For instance, adhesive 30 is mounted on ledge 18, conductive layer 36 alone is mounted on adhesive 30, heat and pressure are applied to flow and solidify adhesive 30, grinding is applied to planarize the bump 16, adhesive 30 and conductive layer 36 at a lateral surface, hole 44 is drilled through ledge 18, adhesive 30 and conductive layer 36 and then plated layers 48 and 50 and plated through-hole 52 are deposited on the structure as previously described. Thereafter, ledge 18 and upper plated layer 48 are etched to form pad 60 and flange 62, conductive layer 36 and lower plated layer 50 are etched to form base 64 and terminal 66 and then plated contacts 74 provide a surface finish for bump 16, pad 60, flange 62, base 64 and terminal 66. Thereafter, adhesive 30 is cut or cracked at the peripheral edges of thermal board 86 to detach it from the batch.

Figure 8A:
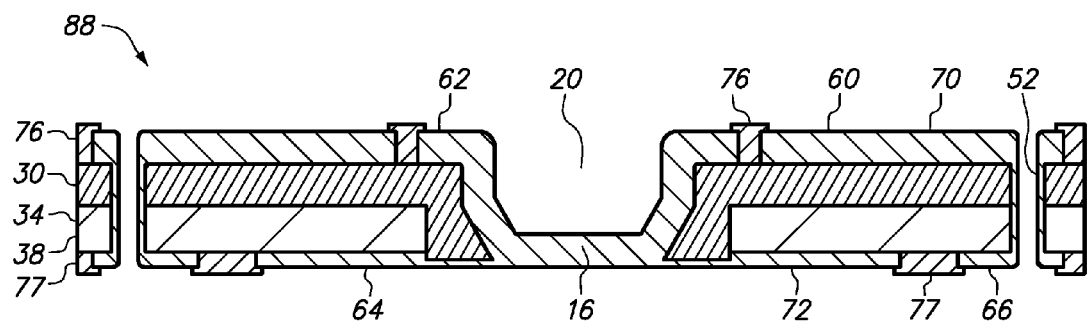
FIGS. 8A, 8B and 8C are cross-sectional, top and bottom views, respectively, of a thermal board with dual solder masks in accordance with an embodiment of the present invention.
Figure 8B:
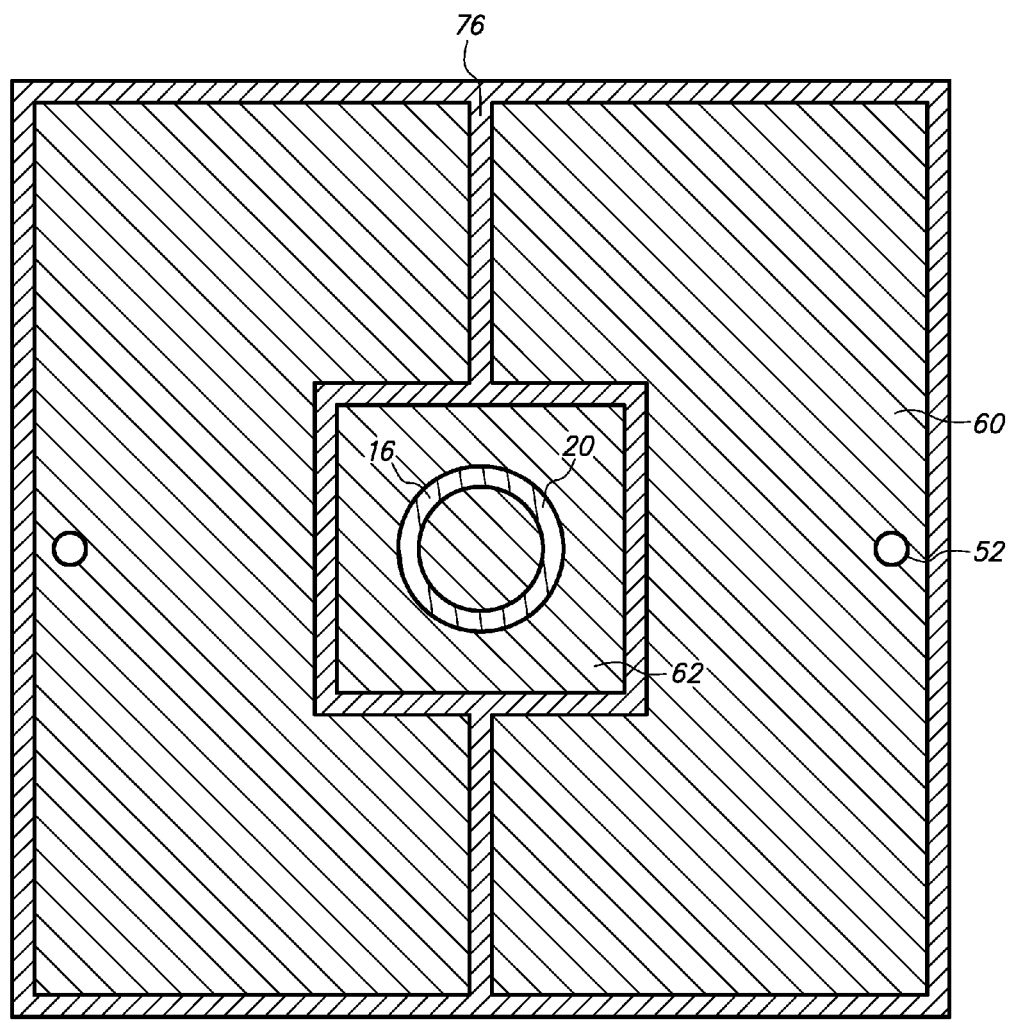
Figure 8C:
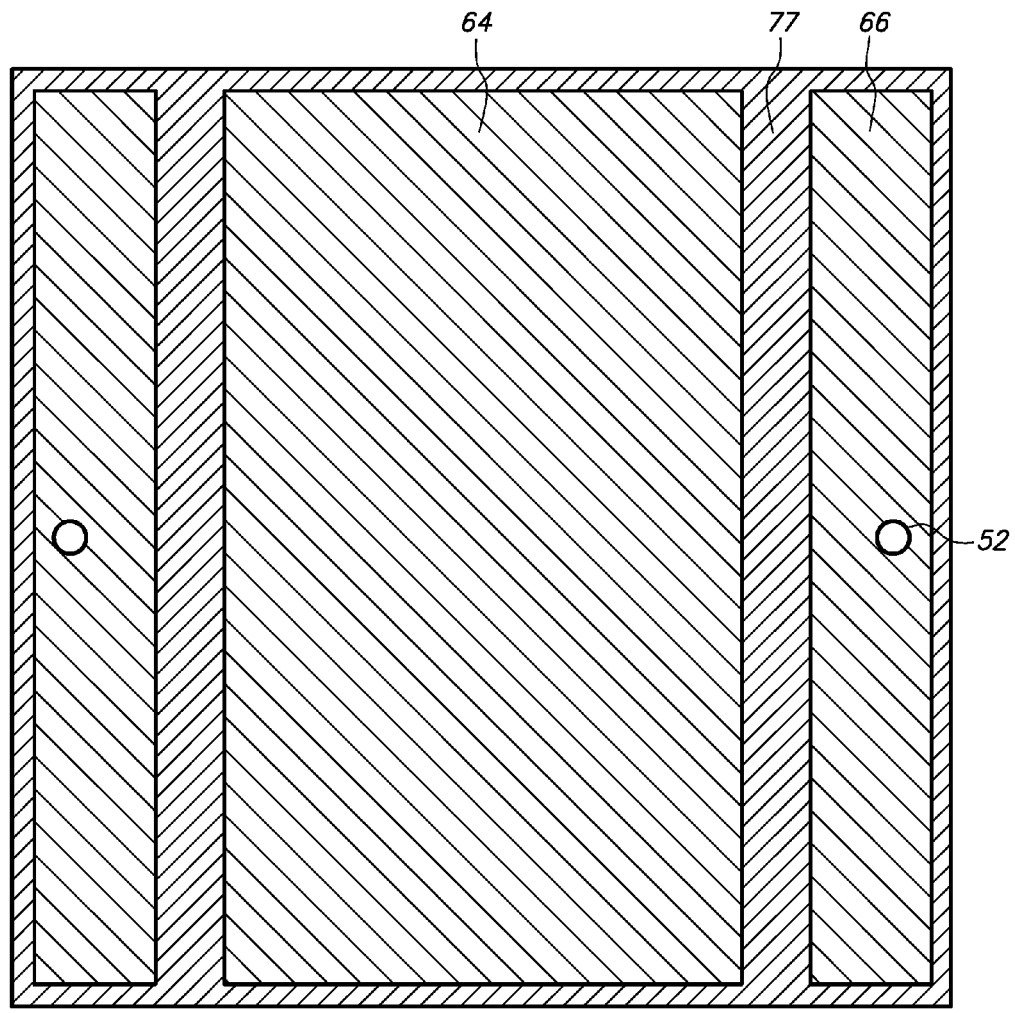

FIGS. 8A, 8B and 8C are cross-sectional, top and bottom views, respectively, of a thermal board with dual solder masks in accordance with an embodiment of the present invention.

In this embodiment, top and bottom solder masks selectively expose the conductive trace and the heat spreader. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 88 includes adhesive 30, substrate 34, conductive trace 70, heat spreader 72 and solder masks 76 and 77. Substrate 34 includes dielectric layer 38. Conductive trace 70 includes plated through-hole 52, pad 60 and terminal 66. Heat spreader 72 includes bump 16, flange 62 and base 64.

Solder mask 76 is an electrically insulative layer that selectively exposes bump 16, pad 60 and flange 62 in the upward direction and covers adhesive 30 where it is otherwise exposed in the upward direction, and solder mask 77 is an electrically insulative layer that selectively exposes base 64 and terminal 66 in the downward direction and covers dielectric layer 38 where it is otherwise exposed in the downward direction.

Thermal board 88 can be manufactured in a manner similar to thermal board 80 with suitable adjustments for solder masks 76 and 77. For instance, adhesive 30 is mounted on ledge 18, substrate 34 is mounted on adhesive 30, heat and pressure are applied to flow and solidify adhesive 30, grinding is applied to planarize the bump 16, adhesive 30 and conductive layer 36 at a lateral surface, hole 44 is drilled through ledge 18, adhesive 30, conductive layer 36 and dielectric layer 38 and then plated layers 48 and 50 and plated through-hole 52 are deposited on the structure as previously described. Thereafter, ledge 18 and upper plated layer 48 are etched to form pad 60 and flange 62, conductive layer 36 and lower plated layer 50 are etched to form base 64 and terminal 66, then solder mask 76 is formed on the top surface and solder mask 77 is formed on the bottom surface and then plated contacts 74 provide a surface finish for bump 16, pad 60, flange 62, base 64 and terminal 66. Thereafter, adhesive 30, substrate 34 and solder masks 76 and 77 are cut or cracked at the peripheral edges of thermal board 88 to detach it from the batch.

Solder masks 76 and 77 are initially a photoimageable liquid resin that is dispensed on the top and bottom surfaces, respectively. Thereafter, solder masks 76 and 77 are patterned by selectively applying light through reticles (not shown) so that the solder mask portions exposed to the light are rendered insoluble, applying a developer solution to remove the solder mask portions that are unexposed to the light and remain soluble and then hard baking, as is conventional.

Figure 9A:
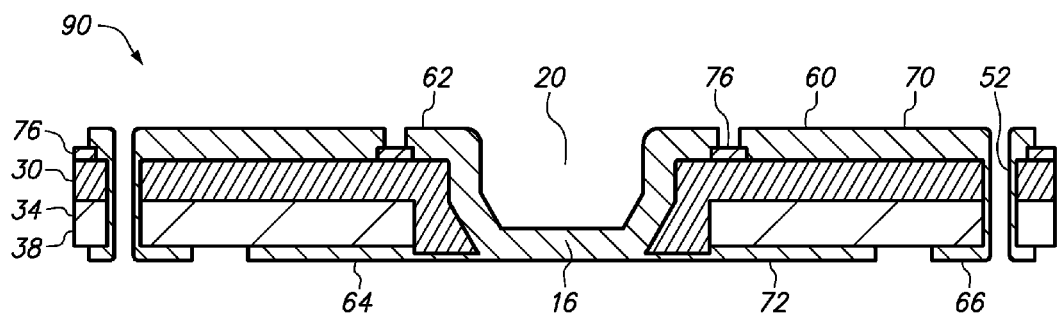
FIGS. 9A, 9B and 9C are cross-sectional, top and bottom views, respectively, of a thermal board with an embedded solder mask in accordance with an embodiment of the present invention.
Figure 9B:
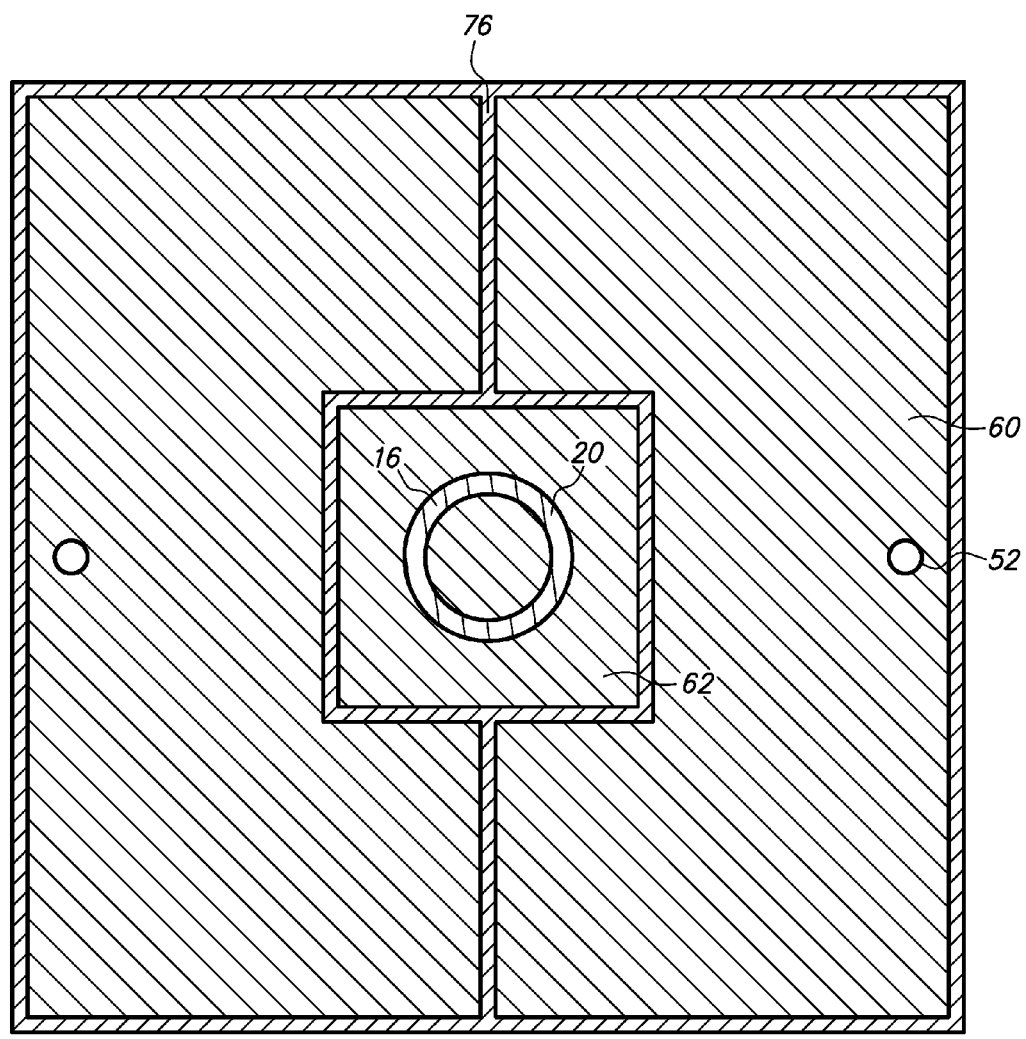
Figure 9C:
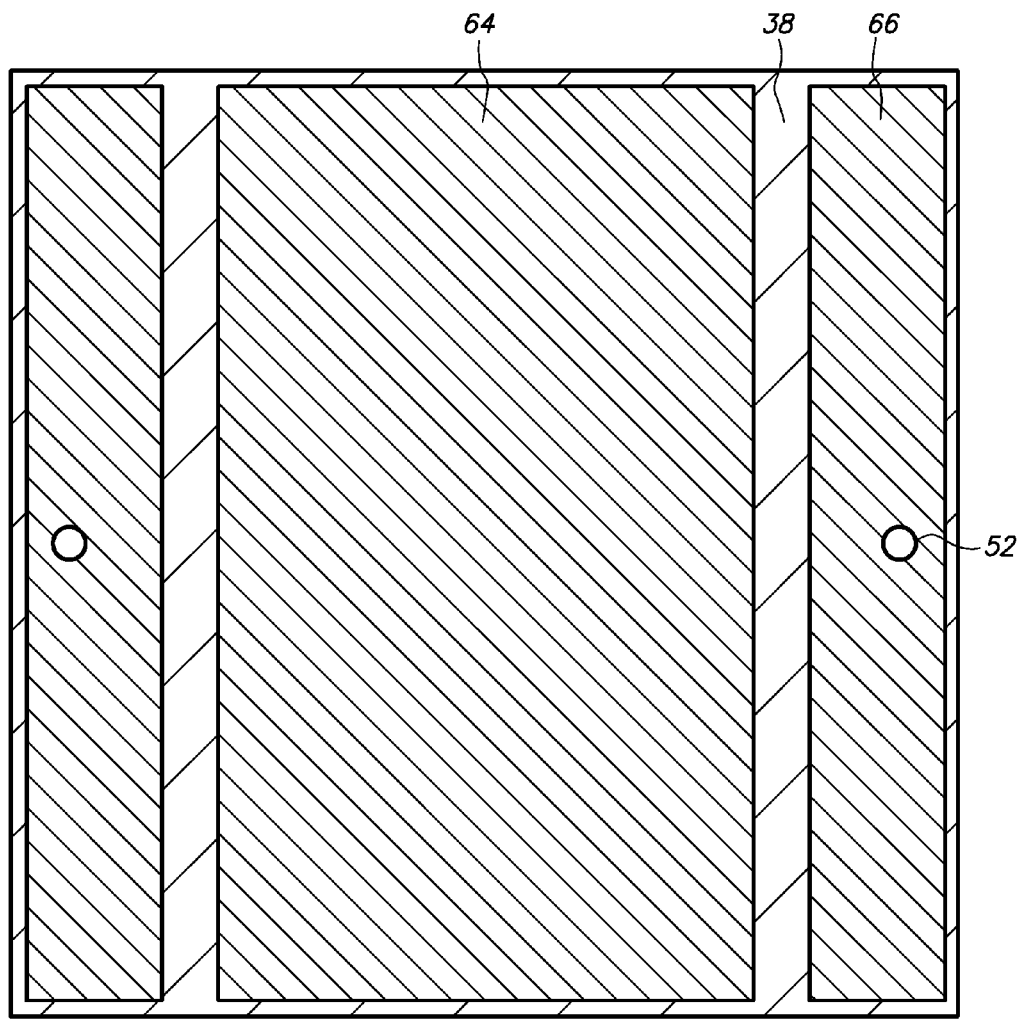

FIGS. 9A, 9B and 9C are cross-sectional, top and bottom views, respectively, of a thermal board with an embedded solder mask in accordance with an embodiment of the present invention.

In this embodiment, an embedded solder mask contacts and is sandwiched between the pad and the flange. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 90 includes adhesive 30, substrate 34, conductive trace 70, heat spreader 72 and solder mask 76. Substrate 34 includes dielectric layer 38. Conductive trace 70 includes plated through-hole 52, pad 60 and terminal 66. Heat spreader 72 includes bump 16, flange 62 and base 64.

Solder mask 76 is an electrically insulative layer that contacts and is sandwiched between and is recessed relative to pad 60 and flange 62, contacts adhesive 30 and covers adhesive 30 where it is otherwise exposed in the upward direction.

Thermal board 90 can be manufactured in a manner similar to thermal board 80 with suitable adjustments for metal plate 10 and solder mask 76. For instance, metal plate 10 is etched using an etch mask with a pattern similar to but slightly wider than that of etch mask 54 to form a trench in metal plate 10 that extends into but not through metal plate 10 at surface 14, is spaced from surface 12 and defines lower portions of pad 60 and flange 62, then solder mask 76 is formed in the trench and then metal plate 10 is stamped to form bump 16. Thereafter, adhesive is mounted on ledge 18, substrate 34 is mounted on adhesive 30, heat and pressure are applied to flow and solidify adhesive 30, grinding is applied to planarize the bump 16, adhesive 30 and conductive layer 36 at a lateral surface, hole 44 is drilled through ledge 18, adhesive 30, conductive layer 36 and dielectric layer 38 and then plated layers 48 and 50 and plated through-hole 52 are deposited on the structure as previously described. Thereafter, upper plated layer 48 alone is etched to form upper portions of pad 60 and flange 62 and expose solder mask 76 without exposing adhesive 30, conductive layer 36 and lower plated layer 50 are etched to form base 64 and terminal 66, and then plated contacts 74 provide a surface finish for bump 16, pad 60, flange 62, base 64 and terminal 66. Thereafter, adhesive 30, substrate 34 and solder mask 76 are cut or cracked at the peripheral edges of thermal board 90 to detach it from the batch.

Solder mask 76 is initially a photoimageable liquid resin that is dispensed on metal plate 10 at surface 14 and fills the trench. Metal plate 10 can be inverted as the liquid resin is dispensed so that surface 14 faces upwards and gravity assists with flowing the liquid resin into the trench. Thereafter, solder mask 76 is hardened by hard baking, as is conventional. Thereafter, metal plate 10 is inverted again so that surface 14 faces downwards and metal plate 10 and solder mask 76 have their lower portions removed by grinding. For instance, a rotating diamond sand wheel and distilled water are applied to the bottom of the structure. Initially, the diamond sand wheel grinds only solder mask 76. As the grinding continues, solder mask 76 becomes thinner as its grinded surface migrates upwardly. Eventually the diamond sand wheel contacts metal plate 10 and begins to grind metal plate 10 as well. As the grinding continues, metal plate 10 and solder mask 76 become thinner as their grinded surfaces migrate upwardly. The grinding continues until the desired thickness has been removed. Thereafter, the structure is rinsed in distilled water to remove contaminants. As a result, metal plate 10 and solder mask 76 are coplanar with one another at a smoothed lapped lateral bottom surface that faces in the downward direction and solder mask 76 is located within and fills the trench.

Figure 10A:
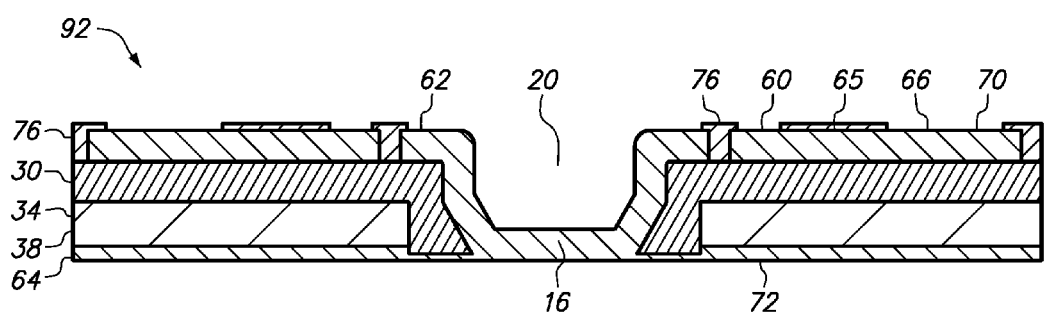
FIGS. 10A, 10B and 10C are cross-sectional, top and bottom views, respectively, of a thermal board with horizontal signal routing in accordance with an embodiment of the present invention.
Figure 10B:
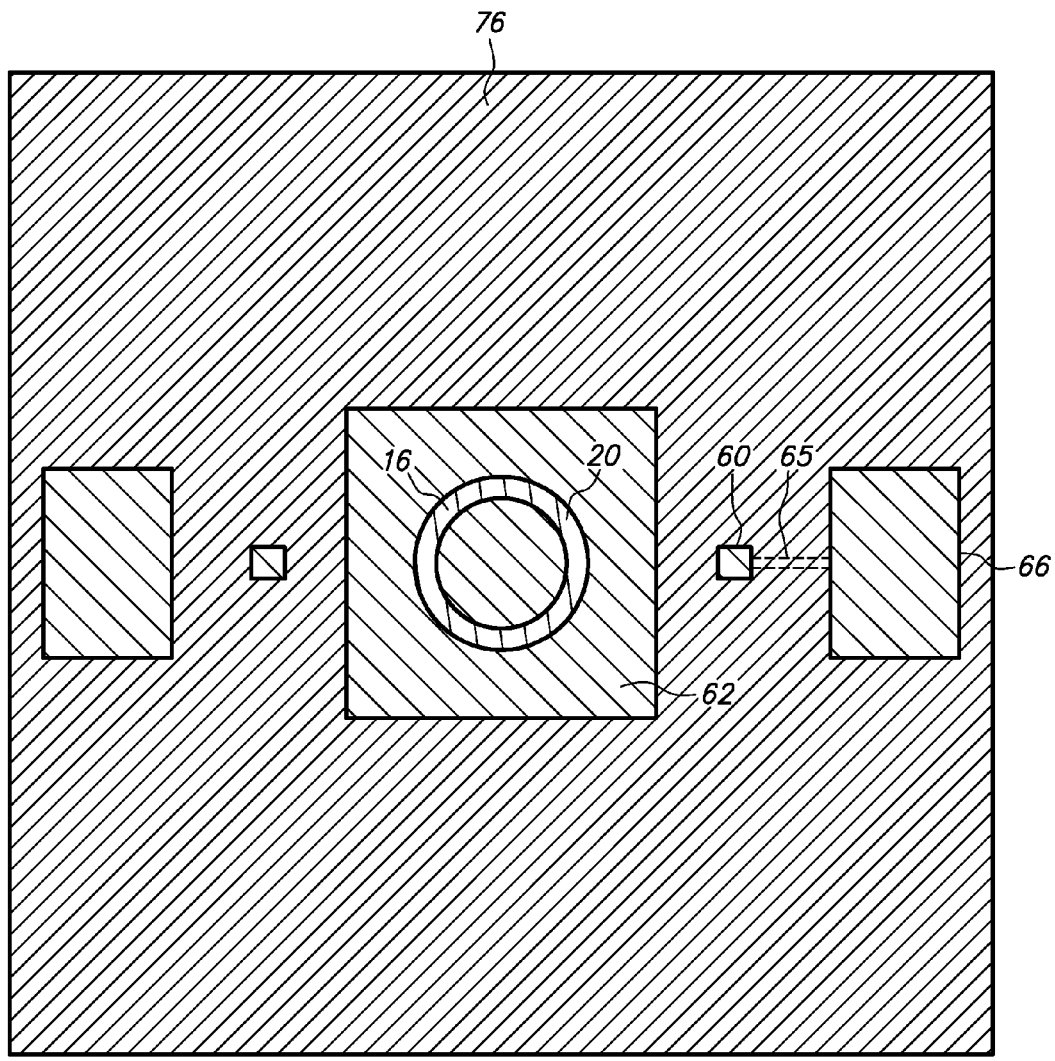
Figure 10C:
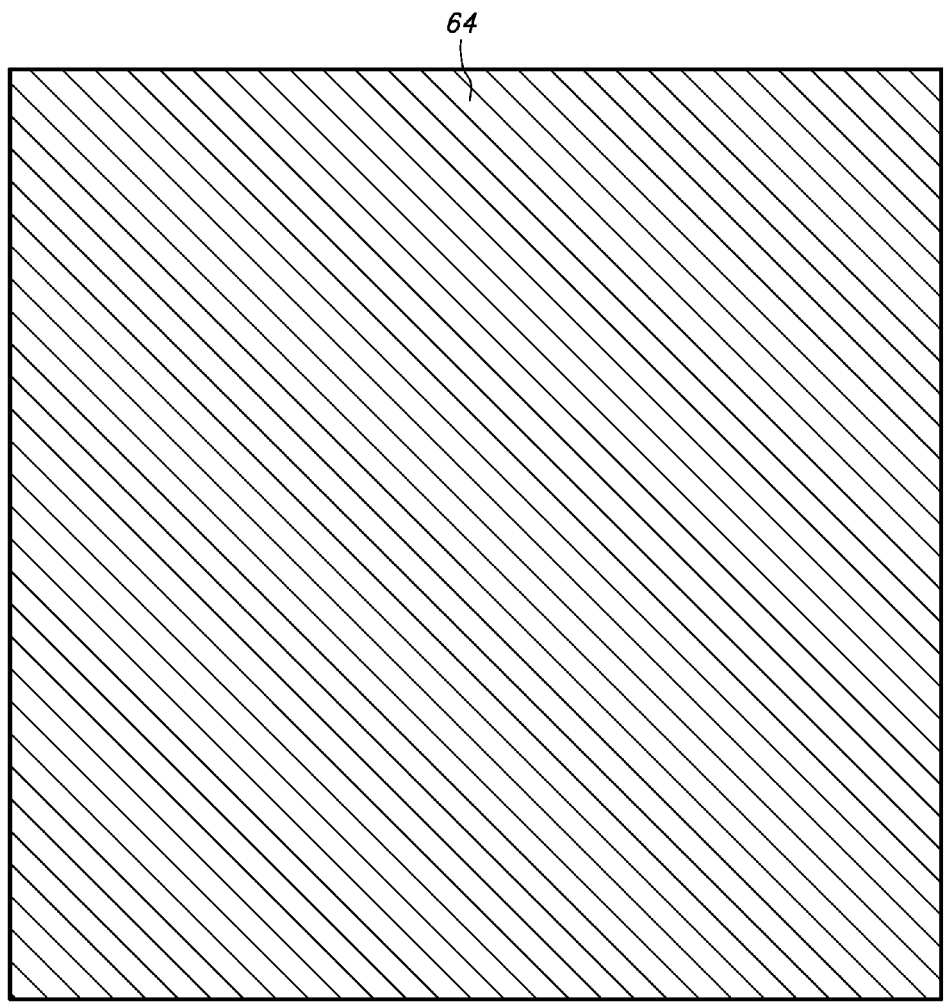

FIGS. 10A, 10B and 10C are cross-sectional, top and bottom views, respectively, of a thermal board with horizontal signal routing in accordance with an embodiment of the present invention.

In this embodiment, the pad and the terminal are located above the adhesive and the dielectric layer and the plated through-hole is omitted. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 92 includes adhesive 30, substrate 34, conductive trace 70, heat spreader 72 and solder mask 76. Substrate 34 includes dielectric layer 38. Conductive trace 70 includes pad 60, routing line 65 and terminal 66. Heat spreader 72 includes bump 16, flange 62 and base 64.

Conductive trace 70 provides horizontal (lateral) fan-out routing from pad 60 to terminal 66 and routing line 65 provides an electrically conductive path between pad 60 and terminal 66. Pad 60, routing line 65 and terminal 66 are located above and contact adhesive 30 and are spaced from and overlap dielectric layer 38. Pad 60 is coplanar with terminal 66 above adhesive 30. Base 64 covers bump 16, adhesive 30, substrate 34, flange 62, conductive trace 70 and solder mask 76 in the downward direction and extends to the peripheral edges of thermal board 92. Solder mask 76 is an electrically insulative layer that selectively exposes bump 16, pad 60, flange 62 and terminal 66 and covers routing line 65 in the upward direction and extends to the peripheral edges of thermal board 92. Conductive trace 70 is therefore spaced from dielectric layer 38 and thermal board 92 is devoid of a plated through-hole corresponding to plated through-hole 52.

Thermal board 92 can be manufactured in a manner similar to thermal board 80 with suitable adjustments for base 64, conductive trace 70 and solder mask 76. For instance, adhesive 30 is mounted on ledge 18, substrate 34 is mounted on adhesive 30, heat and pressure are applied to flow and solidify adhesive 30, grinding is applied to planarize the bump 16, adhesive 30 and conductive layer 36 at a lateral surface and then plated layers 48 and 50 are deposited on the structure as previously described. However, hole 44 is omitted and therefore plated through-hole 52 is omitted. Thereafter, ledge 18 and upper plated layer 48 are etched to form pad 60, flange 62, routing line 65 and terminal 66 using a single etch mask. However, conductive layer 36 and lower plated layer 50 remain unpatterned. Thereafter, solder mask 76 is formed on the top surface and then plated contacts 74 provide a surface finish for bump 16, pad 60, flange 62, base 64 and terminal 66. Thereafter, adhesive 30, substrate 34, base 64 and solder mask 76 are cut or cracked at the peripheral edges of thermal board 92 to detach it from the batch.

Solder mask 76 is initially a photoimageable liquid resin that is dispensed on the top surface. Thereafter, solder mask 76 is patterned by selectively applying light through a reticle (not shown) so that the solder mask portions exposed to the light are rendered insoluble, applying a developer solution to remove the solder mask portions that are unexposed to the light and remain soluble and then hard baking, as is conventional.

Figure 11A:
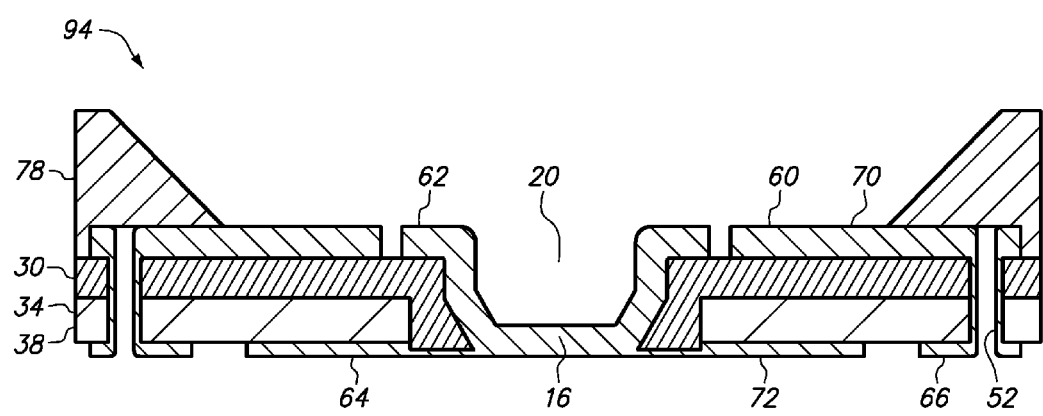
FIGS. 11A, 11B and 11C are cross-sectional, top and bottom views, respectively, of a thermal board with a rim in accordance with an embodiment of the present invention.
Figure 11B:
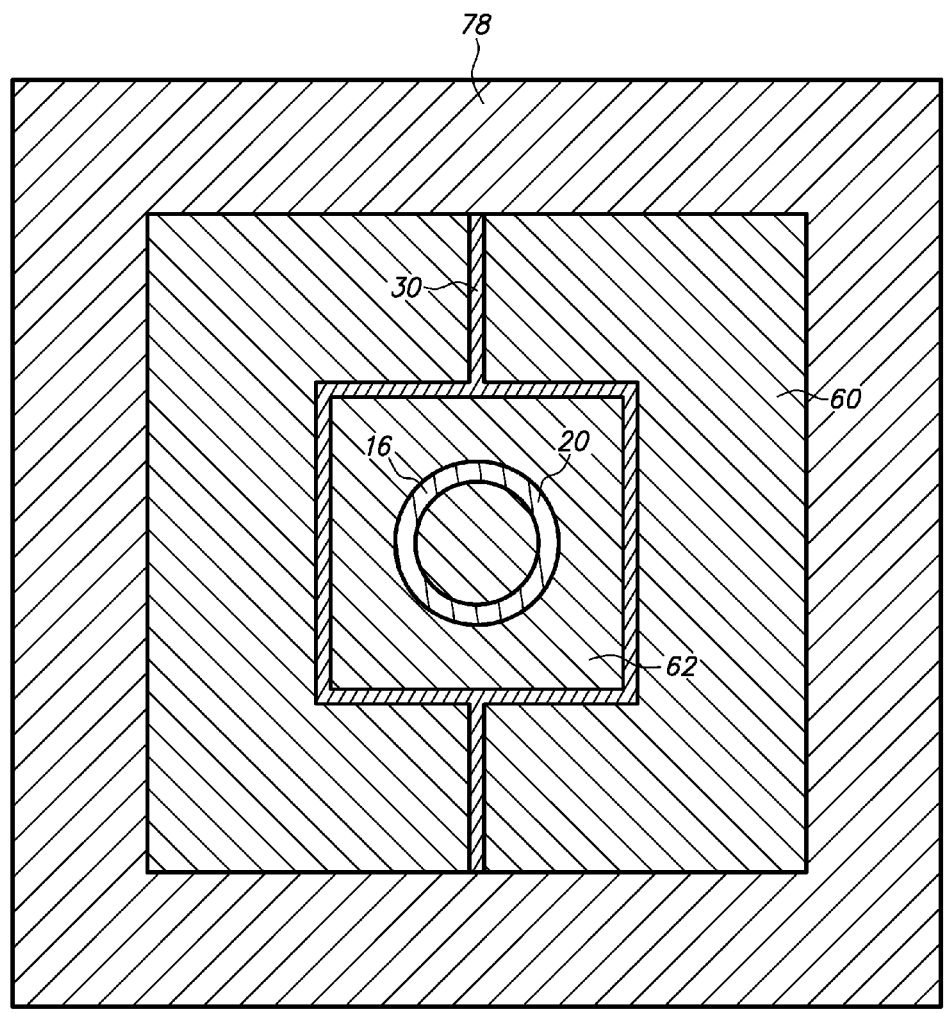
Figure 11C:
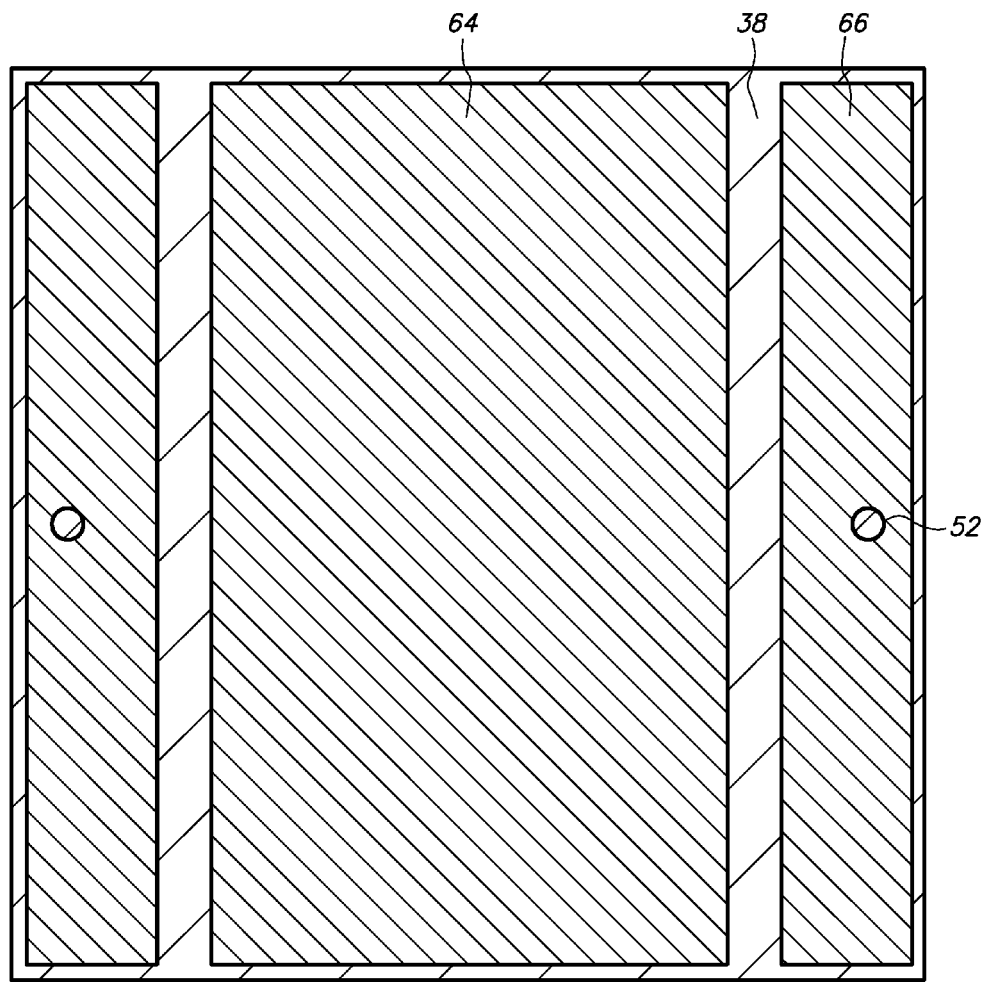

FIGS. 11A, 11B and 11C are cross-sectional, top and bottom views, respectively, of a thermal board with a rim in accordance with an embodiment of the present invention.

In this embodiment, a rim is mounted on the top surface. For purposes of brevity, any description of thermal board 80 is incorporated herein insofar as the same is applicable, and the same description need not be repeated. Likewise, elements of the thermal board similar to those in thermal board 80 have corresponding reference numerals.

Thermal board 94 includes adhesive 30, substrate 34, conductive trace 70, heat spreader 72 and rim 78. Substrate 34 includes dielectric layer 38. Conductive trace 70 includes plated through-hole 52, pad 60 and terminal 66. Heat spreader 72 includes bump 16, flange 62 and base 64.

Rim 78 is a square shaped frame that contacts and extends above pad 60. Bump 16 and flange 62 are centrally located within the periphery of rim 78. For instance, rim 78 has a height of 600 microns, a width (between its inner and outer sidewalls) of 1000 microns and is laterally spaced from flange 62 by 500 microns.

Rim 78 includes a solder mask, a laminate and an adhesive film shown as a single layer for convenience of illustration. The solder mask contacts and extends above the laminate and provides the top surface, the adhesive film contacts and extends below the laminate and provides the bottom surface, and the laminate contacts and is sandwiched between and laminated to the solder mask and adhesive film. The solder mask, laminate and adhesive film are electrical insulators. For instance, the solder mask has a thickness of 50 microns, the laminate has a thickness of 500 microns, and the adhesive film has thickness of 50 microns. Thus, rim 78 has a height of 600 microns (50+500+50).

The laminate can be various dielectric films formed from numerous organic and inorganic electrical insulators. For instance, the laminate can be polyimide or FR-4 epoxy although other epoxies such as polyfunctional and bismaleimide triazine (BT) are suitable. Alternatively, rim 78 can include a metal ring on the adhesive film.

Thermal board 94 can be manufactured in a manner similar to thermal board 80 with suitable adjustments for rim 78. For instance, adhesive 30 is mounted on ledge 18, substrate 34 is mounted on adhesive 30, heat and pressure are applied to flow and solidify adhesive 30, grinding is applied to planarize the bump 16, adhesive 30 and conductive layer 36 at a lateral surface, hole 44 is drilled through ledge 18, adhesive 30, conductive layer 36 and dielectric layer 38 and then plated layers 48 and 50 and plated through-hole 52 are deposited on the structure as previously described. Thereafter, ledge 18 and upper plated layer 48 are etched to form pad 60 and flange 62, conductive layer 36 and lower plated layer 50 are etched to form base 64 and terminal 66, then rim 78 is mounted on the top surface and then plated contacts 74 provide a surface finish for bump 16, pad 60, flange 62, base 64 and terminal 66. Thereafter, adhesive 30 and substrate 34 are cut or cracked at the peripheral edges of thermal board 94 to detach it from the batch.

Figure 12A:
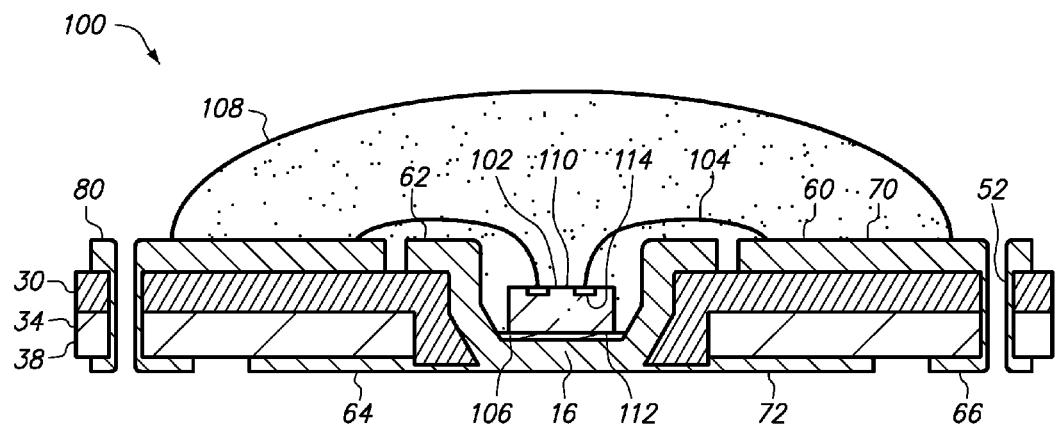
FIGS. 12A, 12B and 12C are cross-sectional, top and bottom views, respectively, of a semiconductor chip assembly that includes a thermal board, a semiconductor device and an encapsulant in accordance with an embodiment of the present invention.
Figure 12B:
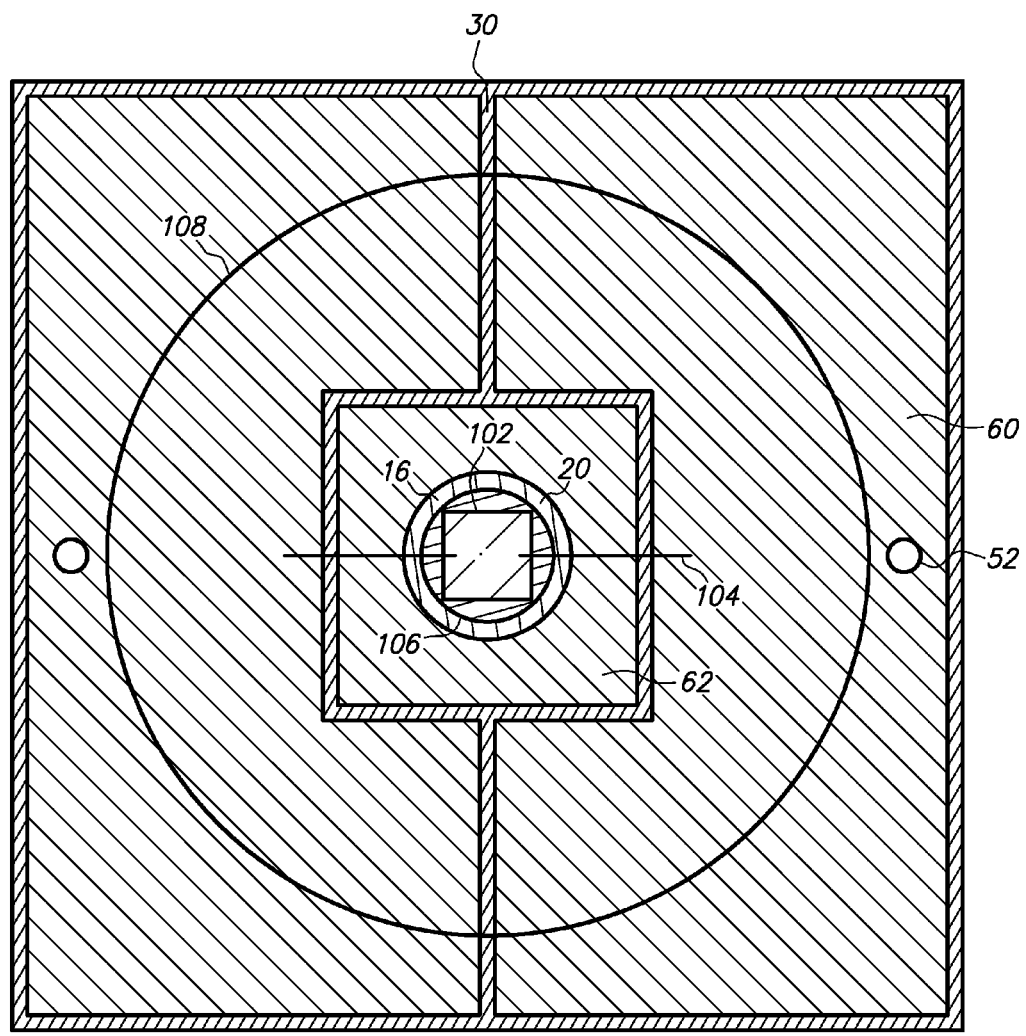
Figure 12C:
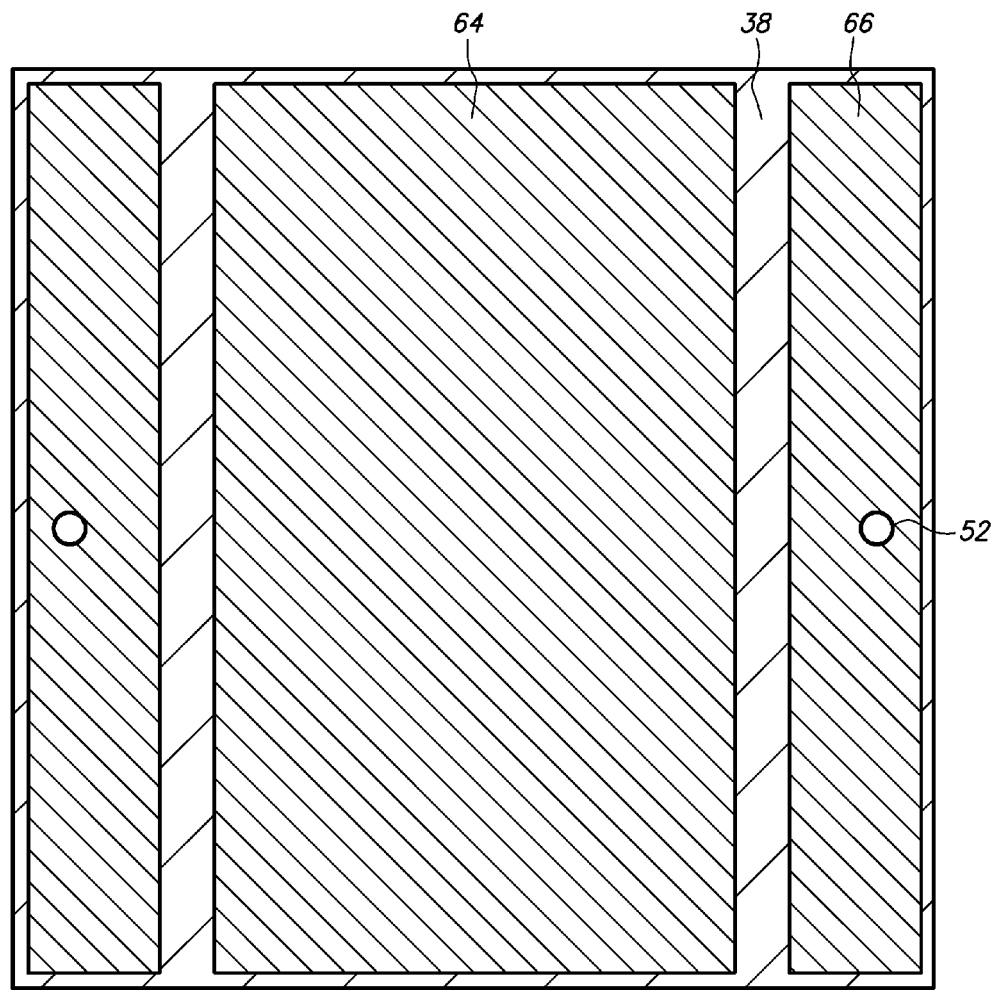

FIGS. 12A, 12B and 12C are cross-sectional, top and bottom views, respectively, of a semiconductor chip assembly that includes a thermal board, a semiconductor device and an encapsulant in accordance with an embodiment of the present invention.

In this embodiment, the semiconductor device is an LED chip that emits blue light, is mounted on the bump, is electrically connected to the pad using a wire bond and is thermally connected to the bump using a die attach. The LED chip is covered by a color-shifting encapsulant that converts the blue light to white light.

Semiconductor chip assembly 100 includes thermal board 80, LED chip 102, wire bond 104, die attach 106 and encapsulant 108. LED chip 102 includes top surface 110, bottom surface 112 and bond pad 114. Top surface 110 is the active surface and includes bond pad 114 and bottom surface 112 is the thermal contact surface.

LED chip 102 is mounted on heat spreader 72, electrically connected to conductive trace 70 and thermally connected to heat spreader 72. In particular, LED chip 102 is mounted on bump 16, overlaps bump 16 but not substrate 34 or conductive trace 70, is laterally surrounded by bump 16 and adhesive 30, is electrically connected to pad 60 by wire bond 104 and is thermally connected to and mechanically attached to bump 16 by die attach 106.

LED chip 102 is vertically positioned below and thus extends below but not above bent corner 22A, extends above and below bent corner 22B and is vertically positioned above and thus extends above but not below bent corner 22C. Likewise, bent corner 22A extends above but not below top surface 110, bent corner 22B is vertically positioned between surfaces 110 and 112, bent corner 22C extends below but not above bottom surface 112, sidewall 24A extends above top surface 110 but not below bottom surface 112, sidewall 24B extends below bottom surface 112 but not above top surface 110 and floor 26 is below bottom surface 112.

LED chip 102 has a thickness of 150 microns and die attach 106 has a thickness of 25 microns. As a result, the combined height of LED chip 102 and the underlying die attach 106 175 microns which is 75 microns less than the depth of cavity 20 (250 microns). LED chip 102 has a length and width of 500 microns.

LED chip 102 and die attach 106 are located within cavity 20, wire bond 104 and encapsulant 108 extend within and outside cavity 20, and substrate 34 and conductive trace 70 are located outside cavity 20. Wire bond 104 is bonded to and electrically connects pads 60 and 114, thereby electrically connecting LED chip 102 to terminal 66. Die attach 106 contacts and is sandwiched between and thermally connects and mechanically attaches bump 16 and thermal contact surface 112, thereby thermally connecting LED chip 102 to base 64. Furthermore, bump 16 covers LED chip 102 in the downward direction and provides a recessed die paddle as well as a reflector for LED chip 102.

Encapsulant 108 is a solid adherent electrically insulative color-shifting protective enclosure that provides environmental protection such as moisture resistance and particle protection for LED chip 102 and wire bond 104. Encapsulant 108 contacts bump 16, LED chip 102, wire bond 104 and die attach 106 in cavity 20, contacts adhesive 30, pad 60 and flange 62 outside cavity 20, is spaced from dielectric layer 38, plated through-hole 52, base 64 and terminal 66, fills the remaining space in cavity 20, seals LED chip 102 within cavity 20 and covers bump 16, flange 62, LED chip 102, wire bond 104 and die attach 106 in the upward direction.

Pad 60 is spot plated with nickel/silver to bond well with wire bond 104, thereby improving signal transfer from conductive trace 70 to LED chip 102, and bump 16 is spot plated with nickel/silver to bond well with die attach 106, thereby improving heat transfer from LED chip 102 to heat spreader 72. Flange 62 is also spot plated with nickel/silver. As a result, bump 16, pad 60 and flange 62 provide a highly reflective surface which reflects the light emitted towards the silver surface layer by LED chip 102, thereby increasing light output in the upward direction.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor (shown as dots in FIG. 12A). For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light and assembly 100 is a white light source. In addition, encapsulant 108 has a hemisphere dome shape which provides a convex refractive surface that focuses the white light in the upward direction.

Semiconductor chip assembly 100 can be manufactured by mounting LED chip 102 on bump 16 using die attach 106, then wire bonding pads 60 and 114 and then forming encapsulant 108.

For instance, die attach 106 is initially a silver-filled epoxy paste with high thermal conductivity that is selectively screen printed into cavity 20 on bump 16 and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 60 and 114 and then encapsulant 108 is molded on the structure.

LED chip 102 can be electrically connected to pad 60 by a wide variety of connection media, thermally connected to and mechanically attached to heat spreader 72 by a wide variety of thermal adhesives and encapsulated by a wide variety of encapsulants.

Semiconductor chip assembly 100 is a first-level single-chip package.

Figure 13A:
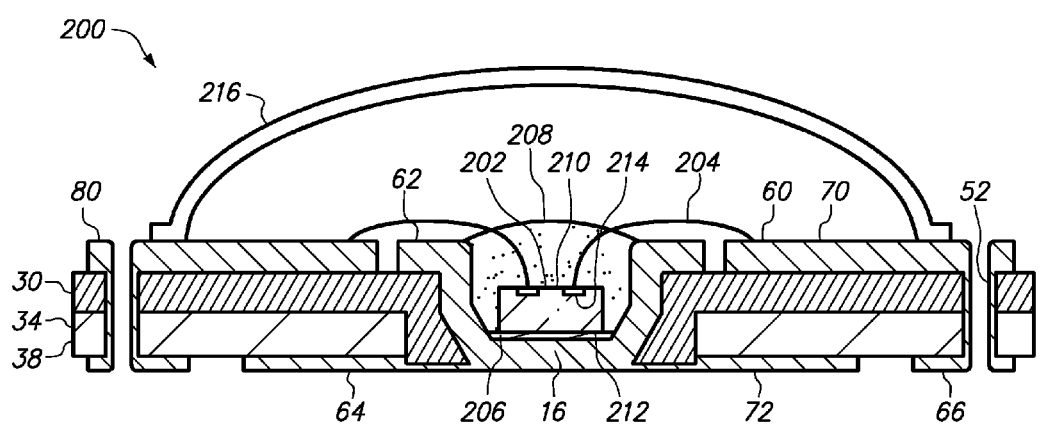
FIGS. 13A, 13B and 13C are cross-sectional, top and bottom views, respectively, of a semiconductor chip assembly that includes a thermal board, a semiconductor device, an encapsulant and a lens in accordance with an embodiment of the present invention.
Figure 13B:
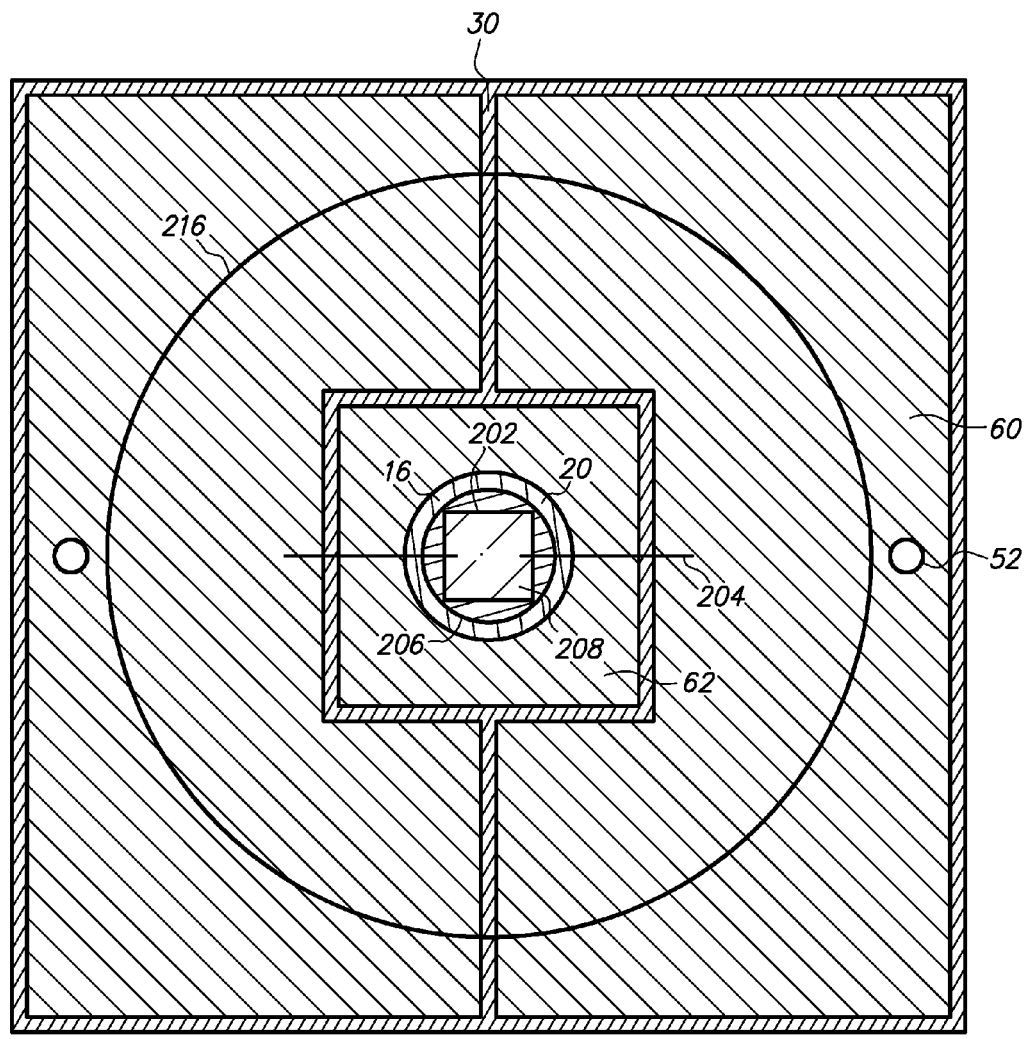
Figure 13C:
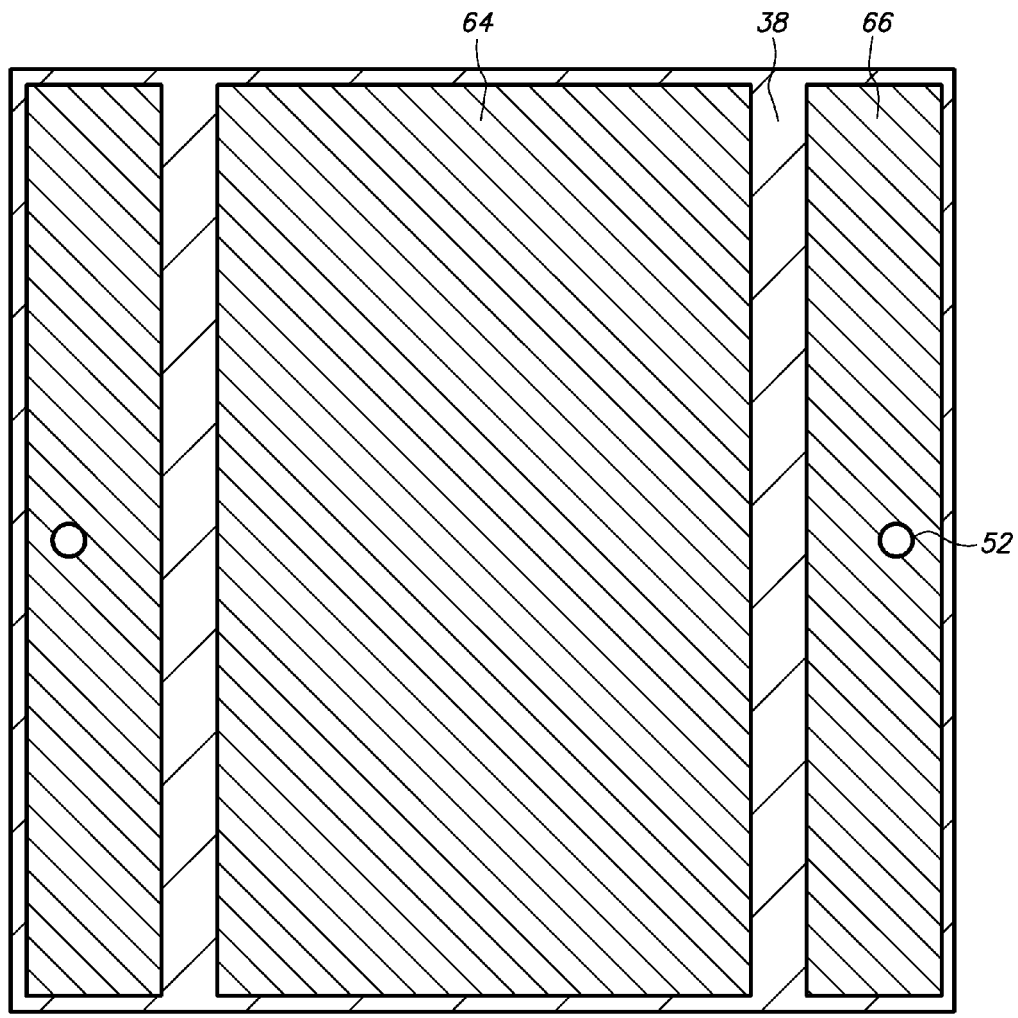

FIGS. 13A, 13B and 13C are cross-sectional, top and bottom views, respectively, of a semiconductor chip assembly that includes a thermal board, a semiconductor device, an encapsulant and a lens in accordance with an embodiment of the present invention.

In this embodiment, the semiconductor device is covered by a color-shifting encapsulant and a transparent lens. For purposes of brevity, any description of assembly 100 is incorporated herein insofar as the same is applicable, and the same description need not be repeated. Likewise, elements of the assembly similar to those in assembly 100 have corresponding reference numerals indexed at two-hundred rather than one-hundred. For instance, LED chip 202 corresponds to LED chip 102, wire bond 204 corresponds to wire bond 104, etc.

Semiconductor chip assembly 200 includes thermal board 80, LED chip 202, wire bond 204, die attach 206, encapsulant 208 and lens 216. LED chip 202 includes top surface 210, bottom surface 212 and bond pad 214. Top surface 210 is the active surface and includes bond pad 214 and bottom surface 212 is the thermal contact surface.

LED chip 202 is mounted on heat spreader 72, electrically connected to conductive trace 70 and thermally connected to heat spreader 72. In particular, LED chip 202 is mounted on bump 16, is electrically connected to pad 60 by wire bond 204 and is thermally connected to and mechanically attached to bump 16 by die attach 206.

Encapsulant 208 contacts bump 16, LED chip 202, wire bond 204 and die attach 206 in cavity 20, is spaced from adhesive 30, dielectric layer 38, base 64 and conductive trace 70, fills the remaining space in cavity 20, seals LED chip 202 within cavity 20 and covers LED chip 202 in the upward direction. However, encapsulant 208 extends above cavity 20 by 10 microns, is laterally confined by cavity 20, is almost entirely located within cavity 20 and only partially protects wire bond 204. Furthermore, since cavity 20 has a precisely controlled and well-defined space due to the stamping operation, encapsulant 208 is dispensed in a small consistent amount.

Lens 216 is a transparent plastic lid with a curved hollow dome (resembling a hemisphere) mounted on the top surface and provides environmental protection such as moisture resistance and particle protection for wire bond 204 and encapsulant 208. Lens 216 contacts pad 60, is spaced from adhesive 30, dielectric layer 38, plated through-hole 52, terminal 66, heat spreader 72, LED chip 202, wire bond 204, die attach 206 and encapsulant 208 and covers bump 16, flange 62, LED chip 202, wire bond 204, die attach 206 and encapsulant 208 in the upward direction. Furthermore, lens 216 includes transparent plastic but is devoid of fluorescent powder and does not color-shift light.

LED chip 202 emits blue light, encapsulant 208 converts the blue light to white light which in turn radiates through lens 216 and assembly 200 is a white light source. In addition, lens 216 has a hemisphere dome shape with a convex refractive surface that focuses the white light emitted by encapsulant 208 in the upward direction. Moreover, since encapsulant 208 is considerably smaller than encapsulant 108 and lens 216 need not contain phosphor or fluorescent powder, this arrangement is especially cost effective.

Semiconductor chip assembly 200 can be manufactured by mounting LED chip 202 on bump 16 using die attach 206 and then wire bonding pads 60 and 214. Thereafter, encapsulant 208 is deposited as an A-stage uncured epoxy into cavity 20 on LED chip 202 and wire bond 204 by screen printing or dispensing by an injection nozzle in step-and-repeat fashion. The liquid epoxy fills the remaining space in and extends slightly above and is laterally confined by cavity 20 which serves as a dam, and then the liquid epoxy is heated and hardened at a relatively low temperature such as 190° C., thereby converting the A-stage liquid uncured epoxy into C-stage cured or hardened epoxy. Thereafter, lens 216 is mounted on the structure.

Semiconductor chip assembly 200 is a first-level single-chip package.

Figure 14A:
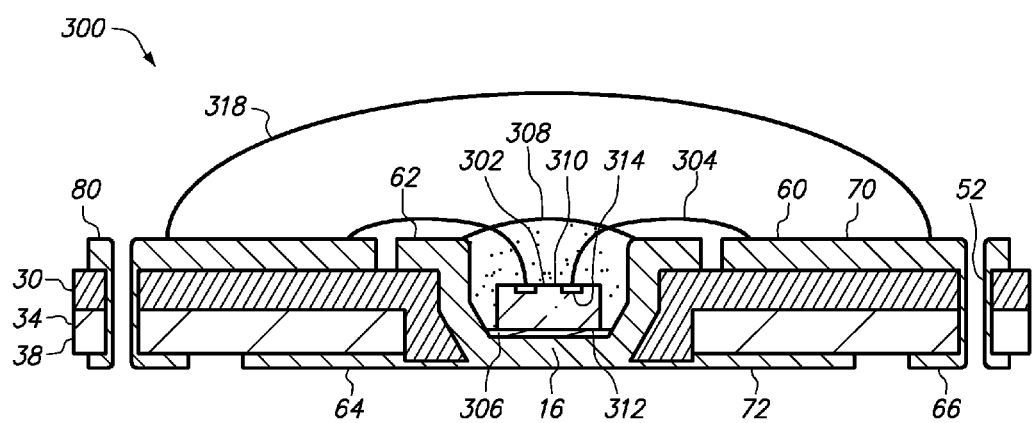
FIGS. 14A, 14B and 14C are cross-sectional, top and bottom views, respectively, of a semiconductor chip assembly that includes a thermal board, a semiconductor device and dual encapsulants in accordance with an embodiment of the present invention.
Figure 14B:
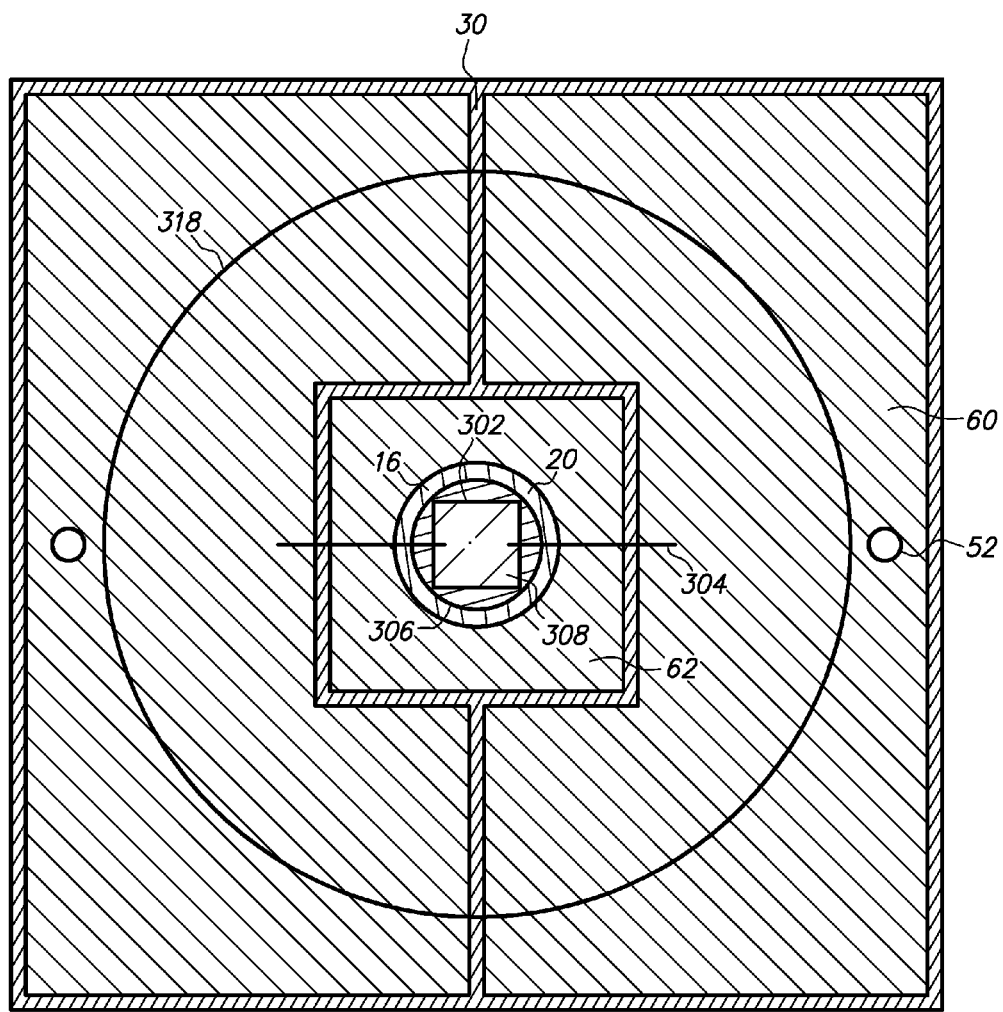
Figure 14C:
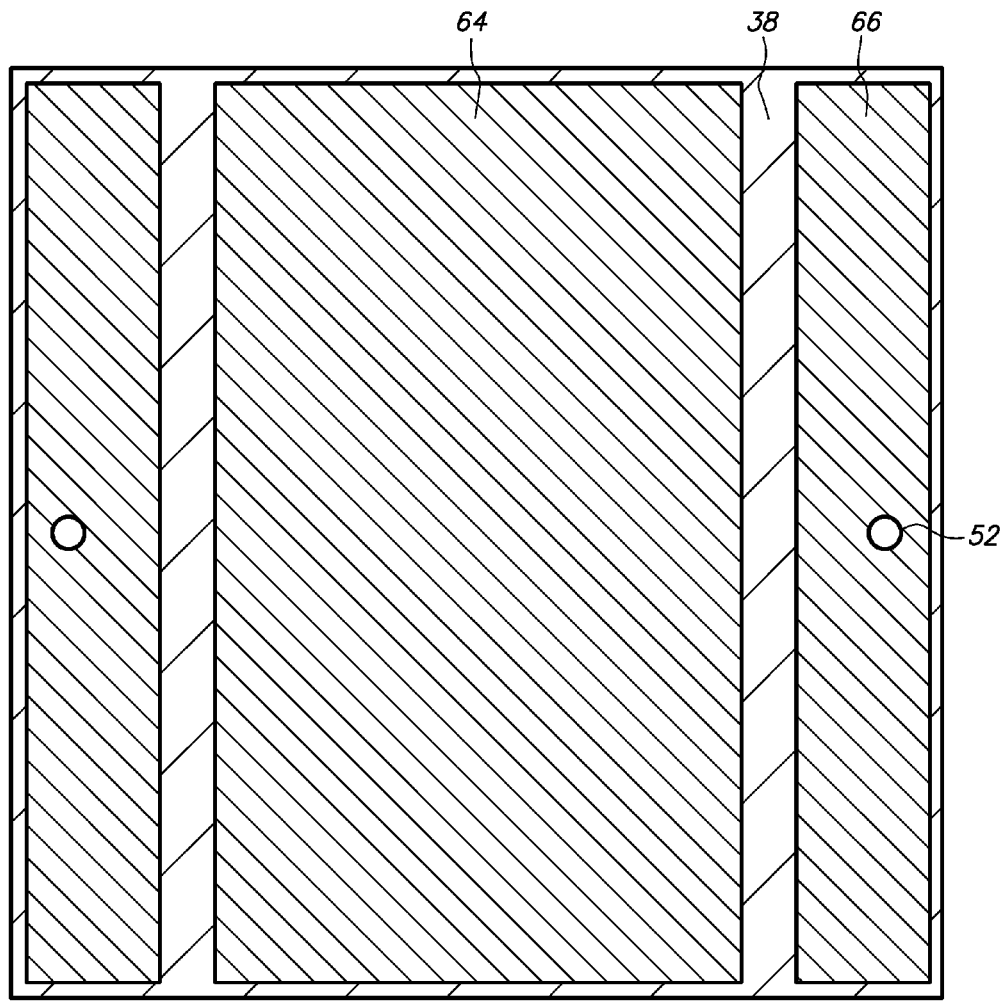

FIGS. 14A, 14B and 14C are cross-sectional, top and bottom views, respectively, of a semiconductor chip assembly that includes a thermal board, a semiconductor device and dual encapsulants in accordance with an embodiment of the present invention.

In this embodiment, the semiconductor device is covered by a color-shifting encapsulant and a transparent encapsulant. For purposes of brevity, any description of assembly 200 is incorporated herein insofar as the same is applicable, and the same description need not be repeated. Likewise, elements of the assembly similar to those in assembly 200 have corresponding reference numerals indexed at three-hundred rather than two-hundred. For instance, LED chip 302 corresponds to LED chip 202, wire bond 304 corresponds to wire bond 204, etc.

Semiconductor chip assembly 300 includes thermal board 80, LED chip 302, wire bond 304, die attach 306 and encapsulants 308 and 318. LED chip 302 includes top surface 310, bottom surface 312 and bond pad 314. Top surface 310 is the active surface and includes bond pad 314 and bottom surface 312 is the thermal contact surface.

LED chip 302 is mounted on heat spreader 72, electrically connected to conductive trace 70 and thermally connected to heat spreader 72. In particular, LED chip 302 is mounted on bump 16, is electrically connected to pad 60 by wire bond 304 and is thermally connected to and mechanically attached to bump 16 by die attach 306.

Encapsulant 308 covers LED chip 302 in the upward direction and is almost entirely located within cavity 20.

Encapsulant 318 is a solid adherent electrically insulative transparent protective enclosure that provides environmental protection such as moisture resistance and particle protection for wire bond 304 and encapsulant 308. Encapsulant 318 contacts adhesive 30, pad 60, flange 62, wire bond 304 and encapsulant 308, is spaced from bump 16, dielectric layer 38, plated through-hole 52, base 64, terminal 66, LED chip 302 and die attach 306 and covers bump 16, flange 62, LED chip 302, wire bond 304, die attach 306 and encapsulant 308 in the upward direction. Furthermore, encapsulant 318 includes transparent silicone but is devoid of fluorescent powder and does not color-shift light.

LED chip 302 emits blue light, encapsulant 308 converts the blue light to white light which in turn radiates through encapsulant 318 and assembly 300 is a white light source. In addition, encapsulant 318 has a hemisphere dome shape with a convex refractive surface that focuses the white light emitted by encapsulant 318 in the upward direction. Moreover, since encapsulant 308 is considerably smaller than encapsulant 108 and encapsulant 318 need not contain phosphor or fluorescent powder, this arrangement is especially cost effective.

Semiconductor chip assembly 300 can be manufactured by mounting LED chip 302 on bump 16 using die attach 306, then wire bonding pads 60 and 314, then forming encapsulant 308 by depositing and curing using cavity 20 as a dam and then forming encapsulant 318 by molding.

Semiconductor chip assembly 300 is a first-level single-chip package.

Figure 15A:
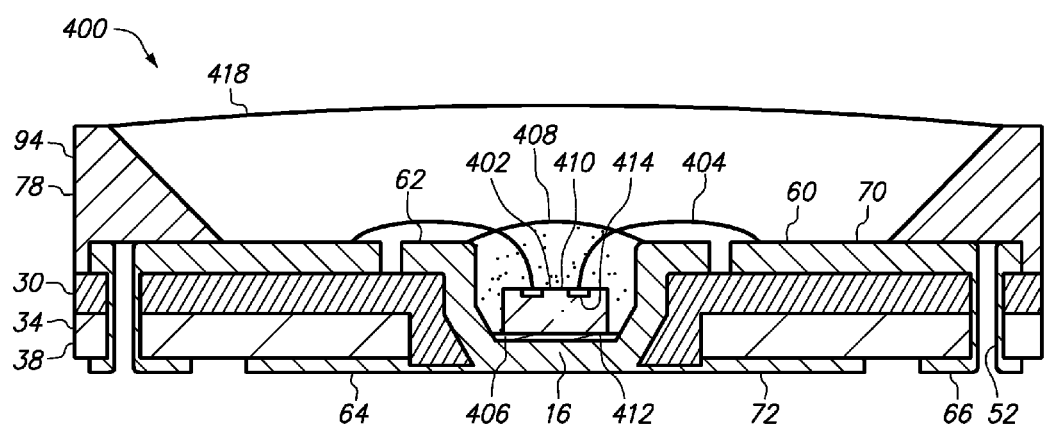
FIGS. 15A, 15B and 15C are cross-sectional, top and bottom views, respectively, of a semiconductor chip assembly that includes a thermal board with a rim, a semiconductor device and dual encapsulants in accordance with an embodiment of the present invention.
Figure 15B:
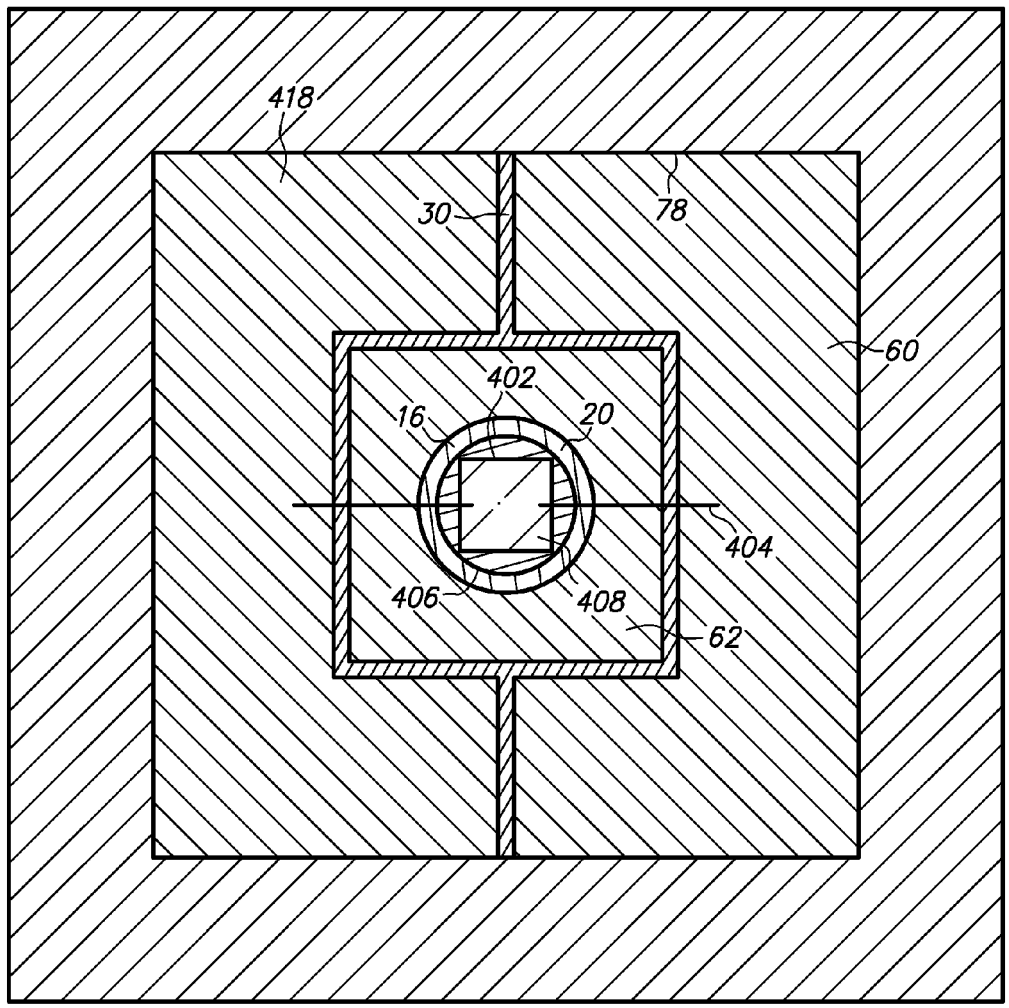
Figure 15C:
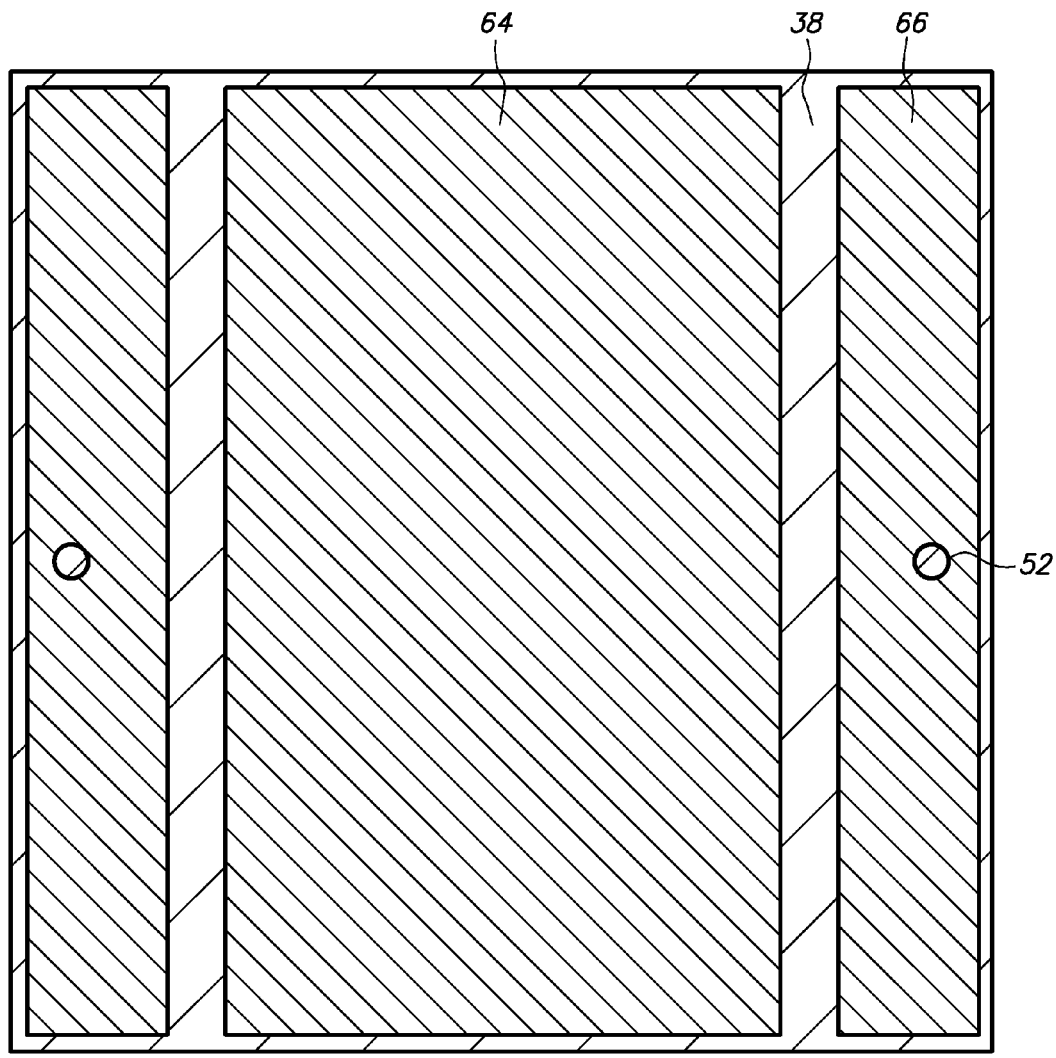

FIGS. 15A, 15B and 15C are cross-sectional, top and bottom views, respectively, of a semiconductor chip assembly that includes a thermal board with a rim, a semiconductor device and dual encapsulants in accordance with an embodiment of the present invention.

In this embodiment, the semiconductor device is covered by a color-shifting encapsulant and a transparent encapsulant. For purposes of brevity, any description of assembly 300 is incorporated herein insofar as the same is applicable, and the same description need not be repeated. Likewise, elements of the assembly similar to those in assembly 300 have corresponding reference numerals indexed at four-hundred rather than three-hundred. For instance, LED chip 402 corresponds to LED chip 302, wire bond 404 corresponds to wire bond 304, etc.

Semiconductor chip assembly 400 includes thermal board 94, LED chip 402, wire bond 404, die attach 406 and encapsulants 408 and 418. LED chip 402 includes top surface 410, bottom surface 412 and bond pad 414. Top surface 410 is the active surface and includes bond pad 414 and bottom surface 412 is the thermal contact surface.

LED chip 402 is mounted on heat spreader 72, electrically connected to conductive trace 70 and thermally connected to heat spreader 72. In particular, LED chip 402 is mounted on bump 16, is electrically connected to pad 60 by wire bond 404 and is thermally connected to and mechanically attached to bump 16 by die attach 406.

Encapsulant 408 covers LED chip 402 in the upward direction and is almost entirely located within cavity 20. Encapsulant 418 covers wire bond 404 and encapsulant 408 in the upward direction and is located outside cavity 20. Encapsulant 418 also contacts and is laterally confined by rim 78.

LED chip 402 emits blue light, encapsulant 408 converts the blue light to white light which in turn radiates through encapsulant 418 and assembly 400 is a white light source.

Semiconductor chip assembly 400 can be manufactured by mounting LED chip 402 on bump 16 using die attach 406, then wire bonding pads 60 and 414, then forming encapsulant 408 by depositing and curing using cavity 20 as a dam and then forming encapsulant 418 by depositing and curing using rim 78 as a dam.

Semiconductor chip assembly 400 is a first-level single-chip package.

Figure 16A:
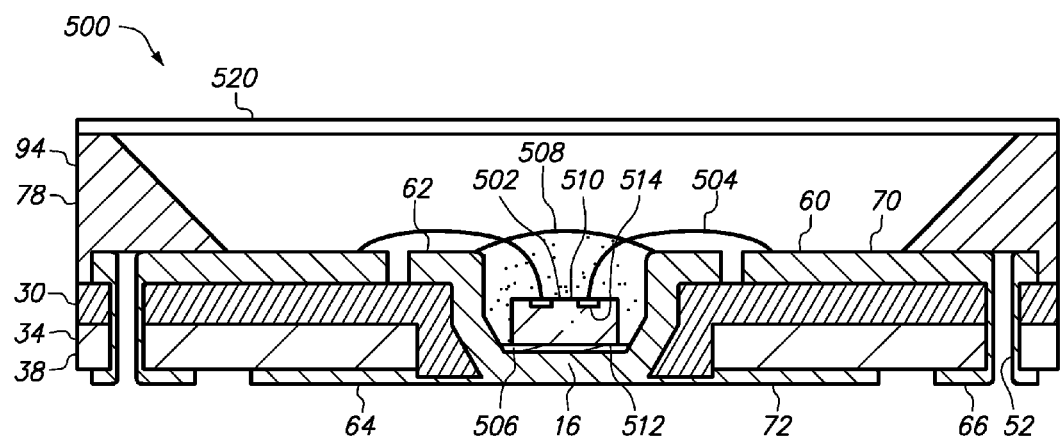
FIGS. 16A, 16B and 16C are cross-sectional, top and bottom views, respectively, of a semiconductor chip assembly that includes a thermal board with a rim, a semiconductor device, an encapsulant and a lid in accordance with an embodiment of the present invention.
Figure 16B:
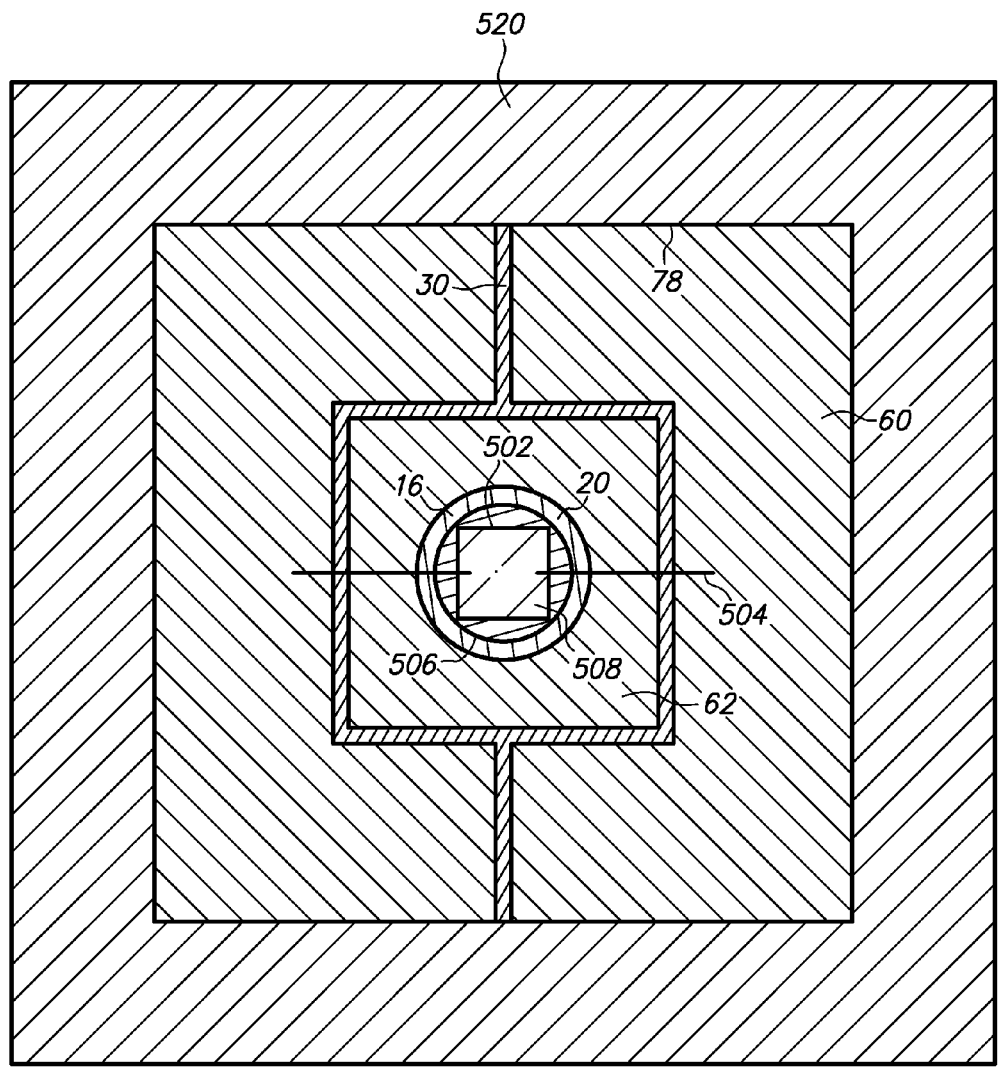
Figure 16C:
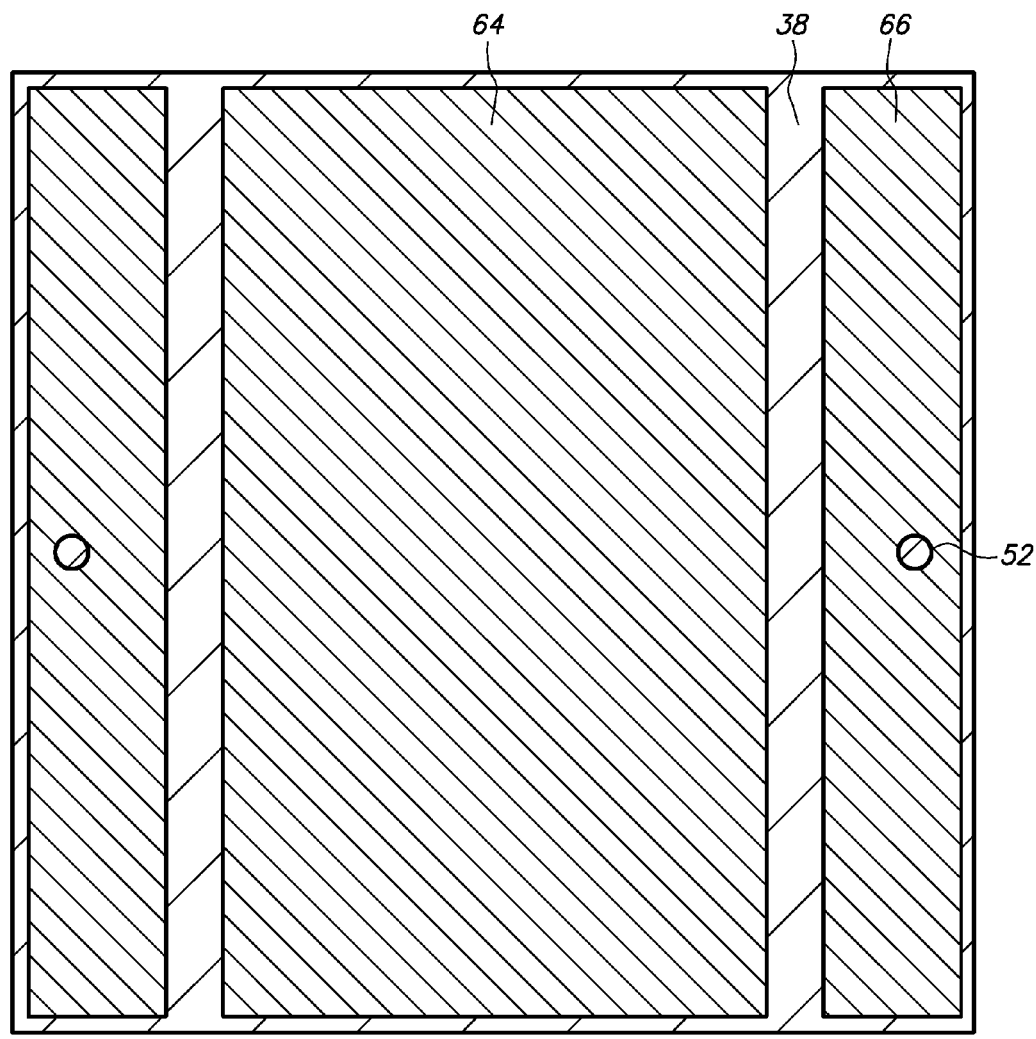

FIGS. 16A, 16B and 16C are cross-sectional, top and bottom views, respectively, of a semiconductor chip assembly that includes a thermal board with a rim, a semiconductor device, an encapsulant and a lid in accordance with an embodiment of the present invention.

In this embodiment, the semiconductor device is covered by a color-shifting encapsulant and a transparent lid. For purposes of brevity, any description of assembly 400 is incorporated herein insofar as the same is applicable, and the same description need not be repeated. Likewise, elements of the assembly similar to those in assembly 400 have corresponding reference numerals indexed at five-hundred rather than four-hundred. For instance, LED chip 502 corresponds to LED chip 402, wire bond 504 corresponds to wire bond 404, etc.

Semiconductor chip assembly 500 includes thermal board 94, LED chip 502, wire bond 504, die attach 506, encapsulant 508 and lid 520. LED chip 502 includes top surface 510, bottom surface 512 and bond pad 514. Top surface 510 is the active surface and includes bond pad 514 and bottom surface 512 is the thermal contact surface.

LED chip 502 is mounted on heat spreader 72, electrically connected to conductive trace 70 and thermally connected to heat spreader 72. In particular, LED chip 502 is mounted on bump 16, is electrically connected to pad 60 by wire bond 504 and is thermally connected to and mechanically attached to bump 16 by die attach 506.

Encapsulant 508 covers LED chip 502 in the upward direction and is almost entirely located within cavity 20.

Lid 520 is a glass sheet mounted on rim 78 that provides environmental protection such as moisture resistance and particle protection for wire bond 504 and encapsulant 508. Lid 520 contacts rim 78, is spaced from adhesive 30, dielectric layer 38, conductive trace 70, heat spreader 72, LED chip 502, wire bond 504, die attach 506 and encapsulant 508 and covers bump 16, flange 62, LED chip 502, wire bond 504, die attach 506 and encapsulant 508 in the upward direction. Furthermore, lid 520 includes transparent glass but is devoid of fluorescent powder and does not color-shift light.

LED chip 502 emits blue light, encapsulant 508 converts the blue light to white light which in turn radiates through lid 520 and assembly 500 is a white light source.

Semiconductor chip assembly 500 can be manufactured by mounting LED chip 502 on bump 16 using die attach 506, then wire bonding pads 60 and 514, then forming encapsulant 508 by depositing and curing using cavity 20 as a dam and then mounting lid 520 on rim 78.

Semiconductor chip assembly 500 is a first-level single-chip package.

Figure 17A:
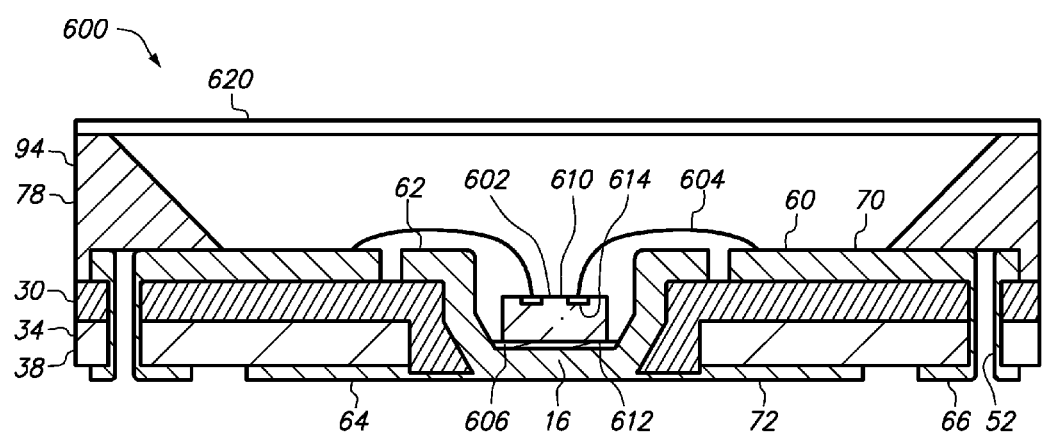
FIGS. 17A, 17B and 17C are cross-sectional, top and bottom views, respectively, of a semiconductor chip assembly that includes a thermal board with a rim, a semiconductor device and a lid in accordance with an embodiment of the present invention.
Figure 17B:
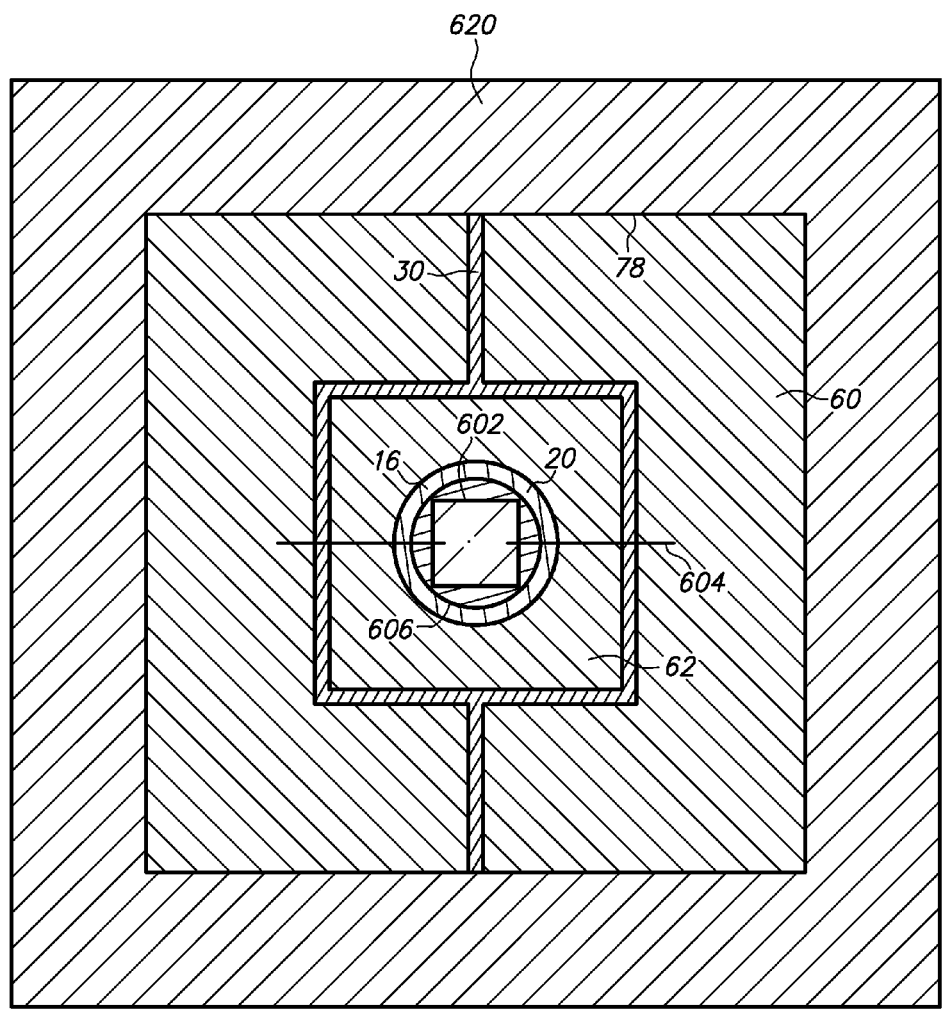
Figure 17C:
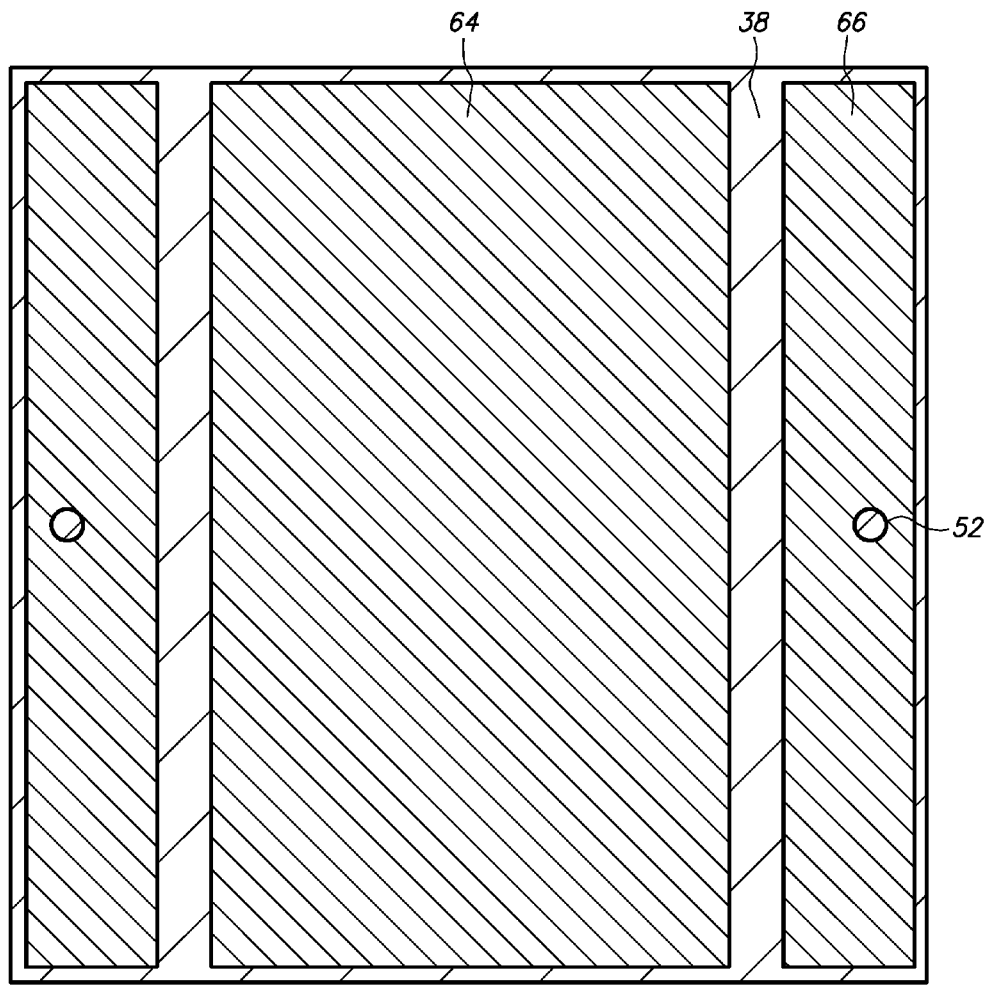

FIGS. 17A, 17B and 17C are cross-sectional, top and bottom views, respectively, of a semiconductor chip assembly that includes a thermal board with a rim, a semiconductor device and a lid in accordance with an embodiment of the present invention.

In this embodiment, the semiconductor device is an LED chip that emits white light and is covered by a transparent lid. For purposes of brevity, any description of assembly 500 is incorporated herein insofar as the same is applicable, and the same description need not be repeated. Likewise, elements of the assembly similar to those in assembly 500 have corresponding reference numerals indexed at six-hundred rather than five-hundred. For instance, LED chip 602 corresponds to LED chip 502, wire bond 604 corresponds to wire bond 504, etc.

Semiconductor chip assembly 600 includes thermal board 94, LED chip 602, wire bond 604, die attach 606 and lid 620. LED chip 602 includes top surface 610, bottom surface 612 and bond pad 614. Top surface 610 is the active surface and includes bond pad 614 and bottom surface 612 is the thermal contact surface.

LED chip 602 is mounted on heat spreader 72, electrically connected to conductive trace 70 and thermally connected to heat spreader 72. In particular, LED chip 602 is mounted on bump 16, is electrically connected to pad 60 by wire bond 604 and is thermally connected to and mechanically attached to bump 16 by die attach 606.

Lid 620 is a glass sheet mounted on rim 78 that provides environmental protection such as moisture resistance and particle protection for LED chip 602 and wire bond 604. Lid 620 contacts rim 78, is spaced from adhesive 30, dielectric layer 38, conductive trace 70, heat spreader 72, LED chip 602, wire bond 604 and die attach 606 and covers bump 16, flange 62, LED chip 602, wire bond 604 and die attach 606 in the upward direction. Furthermore, lid 620 includes transparent glass but is devoid of fluorescent powder and does not color-shift light.

LED chip 602 emits white light which radiates through lid 620 and assembly 600 is a white light source.

Semiconductor chip assembly 600 can be manufactured by mounting LED chip 602 on bump 16 using die attach 606, then wire bonding pads 60 and 614 and then mounting lid 620 on rim 78.

Semiconductor chip assembly 600 is a first-level single-chip package.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the substrate can include single-level conductive traces and multi-level conductive traces. The thermal board can include multiple bumps arranged in an array for multiple semiconductor devices and can include additional conductive traces to accommodate the additional semiconductor devices. The thermal board can also include the solder mask that extends above and selectively exposes the pad, the bump and the flange and the rim mounted on the solder mask. The thermal board can also include the plated through-hole at a peripheral edge and the embedded solder mask. The semiconductor device can be covered in the first vertical direction by a transparent, translucent or opaque encapsulant and/or a transparent, translucent or opaque lid. For instance, the semiconductor device can be an LED chip that emits blue light and is covered by a transparent encapsulant or lid so that the assembly is a blue light source or a color-shifting encapsulant or lid so that the assembly is a green, red or white light source. Likewise, the semiconductor device can be an LED package with multiple LED chips and the thermal board can include additional conductive traces to accommodate the additional LED chips.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the bump and the substrate can include additional conductive traces to receive and route additional wire bonds to the chips. This may be more cost effective than providing a miniature bump for each chip.

The semiconductor chip can be optical or non-optical. For instance, the chip can be an LED, an IR detector, a solar cell, a microprocessor, a controller or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesive, the substrate or elsewhere in the thermal board. As a result, the adhesive can have low thermal conductivity which drastically reduces cost. The heat spreader can include a bump and a flange that are integral with one another and a base that is metallurgically bonded and thermally connected to the bump, thereby enhancing reliability and reducing cost. Furthermore, the bump can be customized for the semiconductor device and the base can be customized for the next level assembly, thereby enhancing the thermal connection from the semiconductor device to the next level assembly. For instance, the bump can have a square or rectangular shape at its floor with the same or similar topography as the thermal contact of the semiconductor device. In any case, the heat spreader can be a wide variety of thermally conductive metallic structures.

The heat spreader can be electrically connected to or isolated from the semiconductor device and the substrate. For instance, the die attach can be electrically conductive, or a routing line above the adhesive and the dielectric layer can electrically connect the pad and the flange, or a routing line below the adhesive and the dielectric layer can electrically connect the base and the terminal to electrically connect the heat spreader to the semiconductor device. Thereafter, the heat spreader can be electrically connected to ground, thereby electrically connecting the semiconductor device to ground.

The bump can be integral with the flange when they are a single-piece metal such as copper or aluminum. The bump can also be integral with the flange when they include a single-piece metal such as copper at their interface as well as additional metal elsewhere such as a plated contact. The bump can also be integral with the flange when they share single-piece metals at their interface such as a copper coating on a nickel buffer layer on an aluminum core.

The base can provide mechanical support for the substrate. For instance, the base can prevent the substrate from warping during metal grinding, chip mounting, wire bonding and encapsulant molding. Furthermore, the base can include fins at its backside that protrude in the downward direction. For instance, the base can be cut at its exposed lateral surface by a routing machine to form lateral grooves that define the fins. In this instance, the base can have a thickness of 500 microns, the grooves can have a depth of 300 microns and the fins can have a height of 300 microns. The fins can increase the surface area of the base, thereby increasing the thermal conductivity of the base by thermal convection when it remains exposed to the air rather than mounted on a heat sink.

The base can be formed by numerous deposition techniques including electroplating, electroless plating, evaporating and sputtering as a single layer or multiple layers after the adhesive is solidified. The base can be the same metal as or a different metal than the bump. Furthermore, the base can extend across the aperture to the substrate or reside within the periphery of the aperture. Thus, the base may contact or be spaced from the substrate. In any case, the base is adjacent to the bump and extends vertically from the bump opposite the cavity.

The adhesive can provide a robust mechanical bond between the heat spreader and the substrate. For instance, the adhesive can extend laterally from the bump beyond the conductive trace to the peripheral edges of the assembly, the adhesive can fill the space between the heat spreader and the substrate and the adhesive can be void-free with consistent bond lines. The adhesive can also absorb thermal expansion mismatch between the heat spreader and the substrate. The adhesive can also be the same material as or a different material than the dielectric layer. Furthermore, the adhesive can be a low cost dielectric that need not have high thermal conductivity. Moreover, the adhesive is not prone to delamination.

The adhesive thickness can be adjusted so that the adhesive essentially fills the gap and essentially all the adhesive is within structure once it is solidified and/or grinded. For instance, the optimal prepreg thickness can be established through trial and error. Likewise, the dielectric layer thickness can be adjusted to achieve this result.

The substrate can be a low cost laminated structure that need not have high thermal conductivity. Furthermore, the substrate can include a single conductive layer or multiple conductive layers. Moreover, the substrate can include or consist of the conductive layer.

The conductive layer alone can be mounted on the adhesive. For instance, the aperture can be formed in the conductive layer and then the conductive layer can be mounted on the adhesive so that the conductive layer contacts the adhesive and is exposed in the upward direction and the bump extends into and is exposed in the upward direction by the aperture. In this instance, the conductive layer can have a thickness of 100 to 200 microns such as 125 microns which is thick enough to handle without warping and wobbling yet thin enough to pattern without excessive etching.

The conductive layer and the dielectric layer can be mounted on the adhesive. For instance, the conductive layer can be provided on the dielectric layer, then the aperture can be formed in the conductive layer and the dielectric layer, and then the conductive layer and the dielectric layer can be mounted on the adhesive so that the conductive layer is exposed in the upward direction, the dielectric layer contacts and is sandwiched between and separates the conductive layer and the adhesive and the bump extends into and is exposed in the upward direction by the aperture. In this instance, the conductive layer can have a thickness of 10 to 50 microns such as 30 microns which is thick enough for reliable signal transfer yet thin enough to reduce weight and cost. Furthermore, the dielectric layer is a permanent part of the thermal board.

The conductive layer and a carrier can be mounted on the adhesive. For instance, the conductive layer can be attached to a carrier such biaxially-oriented polyethylene terephthalate polyester (Mylar) by a thin film, then the aperture can be formed in the conductive layer but not the carrier, then the conductive layer and the carrier can be mounted on the adhesive so that the carrier covers the conductive layer and is exposed in the upward direction, the thin film contacts and is sandwiched between the carrier and the conductive layer, the conductive layer contacts and is sandwiched between the thin film and the adhesive, and the bump is aligned with the aperture and covered in the upward direction by the carrier. After the adhesive is solidified, the thin film can be decomposed by UV light so that the carrier can be peeled off the conductive layer, thereby exposing the conductive layer in the upward direction, and then the conductive layer can be grinded and patterned for the base and the terminal. In this instance, the conductive layer can have a thickness of 10 to 50 microns such as 30 microns which is thick enough for reliable signal transfer yet thin enough to reduce weight and cost, and the carrier can have a thickness of 300 to 500 microns which is thick enough to handle without warping and wobbling yet thin enough to reduce weight and cost. Furthermore, the carrier is a temporary fixture and not a permanent part of the thermal board.

The pad and the terminal can have a wide variety of packaging formats as required by the semiconductor device and the next level assembly.

The pad and the terminal can be formed by numerous deposition techniques including electroplating, electroless plating, evaporating and sputtering as a single layer or multiple layers, either before or after the substrate is mounted on the adhesive. For instance, the conductive layer can be patterned on the substrate to provide the terminal before it is mounted on the adhesive or after it is attached to the bump and the ledge by the adhesive. Likewise, the ledge can be patterned to provide the pad and the flange before the plated through-hole is formed.

The plated contact surface finish can be formed before or after the pad and the terminal are formed. For instance, the plated contacts can be deposited on the plated layers before or after they are etched to form the pad, the terminal, the base and the flange.

The rim can be reflective or non-reflective and transparent or non-transparent. For instance, the rim can include a highly reflective metal such as silver or aluminum with a slanted inner surface which reflects the light directed at it in the upward direction, thereby increasing light output in the upward direction. Likewise, the rim can include a transparent material such as glass or a non-reflective, non-transparent low cost material such as epoxy. Furthermore, a reflective rim can be used regardless of whether it contacts or confines the encapsulant.

The encapsulant (or dual encapsulants) can be numerous transparent, translucent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

The lid can overlap or replace the encapsulant. The lid can provide environmental protection such as moisture resistance and particle protection for the chip and the wire bond in a sealed enclosure. The lid can be numerous transparent, translucent or opaque materials and have various shapes and sizes. For instance, the lid can be transparent glass or silica.

The lens can overlap or replace the encapsulant. The lens can provide environmental protection such as moisture resistance and particle protection for the chip and the wire bond in a sealed enclosure. The lens can also provide a convex refractive surface that focuses the light in the upward direction. The lens can be numerous transparent, translucent or opaque materials and have various shapes and sizes. For instance, a glass lens with a hollow hemisphere dome can be mounted on the thermal board and spaced from the encapsulant, or a plastic lens with a solid hemisphere dome can be mounted on the encapsulant and spaced from the thermal board.

The conductive trace can include additional pads, terminals, plated through-holes, routing lines and vias as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The dielectric layer, plated through-hole, upper and lower plated layers, plated contacts, solder masks, encapsulants, lens, rim and lid are generally desirable but may be omitted in some embodiments. For instance, if single-level signal routing is used then the dielectric layer may be omitted to reduce cost. If the LED chip emits light with the desired color then the color-shifting encapsulant can be omitted. Likewise, if the transparent encapsulant is molded on the thermal board, laterally confined by the cavity or omitted and a reflector is unnecessary then the rim can be omitted.

The thermal board can include a thermal via that is spaced from the bump, extends through the adhesive and the dielectric layer outside the opening and the aperture and is adjacent to and thermally connects the base and the flange to improve heat dissipation from the flange to the base and heat spreading in the base.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single adhesive, a single substrate and a single plated layer and then separated from one another. Likewise, numerous sets of heat spreaders and conductive traces that are each dedicated to a single semiconductor device can be simultaneously batch manufactured for each thermal board in the batch using a single metal plate, a single adhesive, a single substrate and a single plated layer.

For example, multiple bumps can be stamped in the metal plate, then the non-solidified adhesive with openings corresponding to the bumps can be mounted on the ledge such that each bump extends through an opening, then the substrate (with a single conductive layer, a single dielectric layer and apertures corresponding to the bumps) can be mounted on the adhesive such that each bump extends through an opening into an aperture, then the ledge and the substrate can be moved towards one another by platens to force the adhesive into the gaps in the apertures between the bumps and the substrate, then the adhesive can be cured and solidified, then the bumps, the adhesive and the conductive layer can be grinded to form a lateral surface, then the holes can be drilled through the structure, then the plated layer can be plated on the structure to form the upper and lower plated layers and the plated through-holes in the holes, then the ledge and the upper plated layer can be etched to form the flanges corresponding to the bumps and the terminals corresponding to the plated through-holes, the conductive layer and the lower plated layer can be etched to form the bases corresponding to the bumps and the terminals corresponding to the plated through-holes, then the plated contact surface finish can be formed on the bumps, the bases, the flanges, the pads and the terminals and then the substrate and the adhesive can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, die attach paste portions can be deposited in the cavities on the bumps, then the chips can be placed in the cavities on the die attach paste portions, then the die attach paste portions can be simultaneously heated and hardened to provide the die attaches, then the chips can be wired bonded to the corresponding pads outside the cavities, then color-shifting encapsulant portions can be deposited into the cavities on the chips and the wire bonds, then the color-shifting encapsulant portions can be simultaneously heated and hardened to provide the color-shifting encapsulants, then transparent encapsulants can be simultaneously molded over the color-shifting encapsulants and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the bump is adjacent to the base and the flange but not the dielectric layer.

The term "overlap" refers to above and extending within a periphery of an underlying element. Overlap includes extending inside and outside the periphery or residing within the periphery. For instance, in the cavity-up position, the semiconductor device overlaps the bump since an imaginary vertical line intersects the semiconductor device and the bump, regardless of whether another element such as the die attach is between the semiconductor device and the bump and is intersected by the line, and regardless of whether another imaginary vertical line intersects the bump but not the semiconductor device (outside the periphery of the semiconductor device). Likewise, the bump overlaps the base, the pad overlaps the adhesive and the base is overlapped by the bump. Moreover, overlap is synonymous with over and overlapped by is synonymous with under or beneath.

The term "contact" refers to direct contact. For instance, the dielectric layer contacts the terminal but does not contact the bump.

The term "cover" refers to complete coverage in a vertical and/or lateral direction. For instance, in the cavity-up position, the base covers the bump in the downward direction but the bump does not cover the base in the upward direction when the base extends laterally beyond the aperture and contacts the dielectric layer.

The term "layer" refers to patterned and unpatterned layers. For instance, the conductive layer can be an unpatterned blanket sheet on the dielectric layer when the substrate is mounted on the adhesive, and the conductive layer can be a patterned circuit with spaced traces on the dielectric layer when the semiconductor device is mounted on the heat spreader. Furthermore, a layer can include stacked layers.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "plated through-hole" in conjunction with the conductive trace refers to an electrical interconnect that is formed in a hole using plating. For instance, the plated through-hole exists regardless of whether it remains intact in the hole and spaced from peripheral edges of the assembly or is subsequently split or trimmed such that the hole is converted into a groove and the remaining portion is in the groove at a peripheral edge of the assembly.

The term "about" in conjunction with an angle refers to ±2 degrees.

The terms "opening" and "aperture" and "hole" refer to a through-hole and are synonymous. For instance, in the cavity-down position, the bump is exposed by the adhesive in the upward direction when it is inserted into the opening in the adhesive. Likewise, the bump is exposed by the substrate in the upward direction when it is inserted into the aperture in the substrate.

The term "inserted" refers to relative motion between elements. For instance, the bump is inserted into the aperture regardless of whether the bump is stationary and the substrate moves towards the ledge, the substrate is stationary and the bump moves towards the substrate or the bump and the substrate both approach the other. Furthermore, the bump is inserted (or extends) into the aperture regardless of whether it goes through (enters and exits) or does not go through (enters without exiting) the aperture.

The phrase "move towards one another" also refers to relative motion between elements. For instance, the ledge and the substrate move towards one another regardless of whether the ledge is stationary and the substrate moves towards the ledge, the substrate is stationary and the ledge moves towards the substrate or the ledge and the substrate both approach the other.

The phrase "aligned with" refers to relative position between elements. For instance, the bump is aligned with the aperture when the adhesive is mounted on the base, the substrate is mounted on the adhesive, the bump is inserted into and aligned with the opening and the aperture is aligned with the opening regardless of whether the bump is inserted into the aperture or is below and spaced from the aperture.

The phrase "mounted on" includes contact and non-contact with a single or multiple support element(s). For instance, the semiconductor device is mounted on the bump regardless of whether it contacts the bump or is separated from the bump by a die attach.

The phrase "adhesive . . . in the gap" refers to the adhesive in the gap. For instance, adhesive that extends across the dielectric layer in the gap refers to the adhesive in the gap that extends across the dielectric layer. Likewise, adhesive that contacts and is sandwiched between the bump and the dielectric layer in the gap refers to the adhesive in the gap that contacts and is sandwiched between the bump at the inner sidewall of the gap and the dielectric layer at the outer sidewall of the gap.

The phrase "the base extends laterally from the bump" refers to lateral extension where the base is adjacent to the bump. For instance, in the cavity-up position, the base extends laterally from the bump when it contacts the adhesive regardless of whether it extends laterally beyond the bump, extends laterally to the flange or covers the bump in the downward direction. Likewise, the base does not extend laterally beyond the bump when it is coextensive with the bump at its floor.

The term "above" refers to upward extension and includes adjacent and non-adjacent elements as well as overlapping and non-overlapping elements. For instance, in the cavity-up position, the bump extends above, is adjacent to, overlaps and protrudes from the base. Likewise, the bump extends above the dielectric layer even though it is not adjacent to or overlap the dielectric layer.

The term "below" refers to downward extension and includes adjacent and non-adjacent elements as well as overlapping and non-overlapping elements. For instance, in the cavity-up position, the base extends below, is adjacent to and is overlapped by the bump and protrudes from the bump in the downward direction. Likewise, the bump extends below the pad even though it is not adjacent to or overlapped by the pad.

The "first vertical direction" and "second vertical direction" do not depend on the orientation of the semiconductor chip assembly (or the thermal board), as will be readily apparent to those skilled in the art. For instance, the bump extends vertically beyond the base in the first vertical direction and vertically beyond the flange in the second vertical direction regardless of whether the assembly is inverted and/or mounted on a heat sink. Likewise, the flange extends "laterally" from the bump in a lateral plane regardless of whether the assembly is inverted, rotated or slanted. Thus, the first and second vertical directions are opposite one another and orthogonal to the lateral directions, and laterally aligned elements are coplanar with one another at a lateral plane orthogonal to the first and second vertical directions. Furthermore, the first vertical direction is the upward direction and the second vertical direction is the downward direction in the cavity-up position, and the first vertical direction is the downward direction and the second vertical direction is the upward direction in the cavity-down position.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A semiconductor chip assembly, comprising:
a semiconductor device;
an adhesive that includes an opening;
a heat spreader that includes a bump and a flange, wherein (i) the bump includes first, second and third bent corners with the second bent corner between the first and third bent corners, is adjacent to the flange at the first bent corner, is spaced from the flange at the second and third bent corners, is integral with the flange and extends from the flange in a second vertical direction opposite a first vertical direction, (ii) the flange extends laterally from the bump in lateral directions orthogonal to the vertical directions, and (iii) a cavity in the bump faces in the first vertical direction, is covered by the bump in the second vertical direction, is shaped by the first, second and third bent corners and has an entrance at the flange, a first angle between the first and second bent corners and a second angle between the second and third bent corners; and
a conductive trace that includes a pad and a terminal;
wherein the semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction, is electrically connected to the pad and thereby electrically connected to the terminal, and is thermally connected to the bump;
wherein the adhesive contacts the bump and the flange and extends laterally from the bump to or beyond the terminal;
wherein the conductive trace is located outside the cavity;
wherein the bump extends into the opening, covers the semiconductor device in the second vertical direction and provides a recessed die paddle and a reflector for the semiconductor device; and
wherein the cavity extends into the opening.

2. The assembly of claim 1, wherein the semiconductor device is an LED chip, is electrically connected to the pad using a wire bond that extends within and outside the cavity and is thermally connected to the bump using a die attach that is located within the cavity.

3. The assembly of claim 1, wherein the adhesive contacts the conductive trace, laterally covers and surrounds and conformally coats sidewalls of the bump and extends to peripheral edges of the assembly.

4. The assembly of claim 1, wherein the adhesive extends laterally from the bump beyond the conductive trace.

5. The assembly of claim 1, wherein the bump has an irregular thickness characteristic of stamping.

6. The assembly of claim 1, wherein the cavity has a larger diameter at its entrance than at its floor and extends across most of the bump in the vertical and lateral directions.

7. The assembly of claim 1, wherein the pad extends beyond the adhesive in the first vertical direction, the terminal extends beyond the adhesive in the second vertical direction and the conductive trace includes a plated through-hole in an electrically conductive path between the pad and the terminal.

8. The assembly of claim 1, wherein the bump, the flange, the pad and the terminal are the same metals.

9. The assembly of claim 1, wherein the bump, the flange, the pad and the terminal include a gold, silver or nickel surface layer and a buried copper core and are primarily copper.

10. The assembly of claim 1, wherein the heat spreader includes a copper core shared by the bump and the flange and the conductive trace includes a copper core shared by the pad and the terminal.

11. A semiconductor chip assembly, comprising:
a semiconductor device;
an adhesive that includes an opening;
a heat spreader that includes a bump, a base and a flange, wherein (i) the bump includes first, second and third bent corners with the second bent corner between the first and third bent corners, is adjacent to the flange at the first bent corner and is spaced from the flange at the second and third bent corners, is adjacent to the base at the third bent corner and is spaced from the base at the first and second bent corners, is integral with the flange, extends from the base in a first vertical direction and extends from the flange in a second vertical direction opposite the first vertical direction, (ii) the base extends from the bump in the second vertical direction and extends laterally from the bump in lateral directions orthogonal to the vertical directions, (iii) the flange extends laterally from the bump and is spaced from the base, and (iv) a cavity in the bump faces in the first vertical direction, is covered by the bump in the second vertical direction, is spaced from the base by the bump, extends across most of the bump in the vertical and lateral directions, is shaped by the first, second and third bent corners and has an entrance at the flange, a first angle between the first and second bent corners and a second angle between the second and third bent corners; and
a conductive trace that includes a pad and a terminal;
wherein the semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction, is electrically connected to the pad and thereby electrically connected to the terminal, and is thermally connected to the bump and thereby thermally connected to the base;
wherein the adhesive contacts the bump, the base and the flange, is sandwiched between the base and the flange and extends laterally from the bump to or beyond the terminal;
wherein the conductive trace is located outside the cavity;
wherein the bump extends into the opening, covers the semiconductor device in the second vertical direction and provides a recessed die paddle and a reflector for the semiconductor device; and
wherein the cavity extends into the opening.

12. The assembly of claim 11, wherein the semiconductor device is an LED chip, is electrically connected to the pad using a wire bond that extends within and outside the cavity and is thermally connected to the bump using a die attach that is located within the cavity.

13. The assembly of claim 11, wherein the adhesive contacts the conductive trace.

14. The assembly of claim 11, wherein the adhesive laterally covers and surrounds and conformally coats sidewalls of the bump.

15. The assembly of claim 11, wherein the adhesive extends to peripheral edges of the assembly.

16. The assembly of claim 11, wherein the adhesive extends laterally from the bump beyond the conductive trace.

17. The assembly of claim 11, wherein the bump is coplanar with the adhesive at the base.

18. The assembly of claim 11, wherein the bump has an irregular thickness characteristic of stamping.

19. The assembly of claim 11, wherein the bump includes first and second sidewalls and a floor, the first sidewall extends between the first and second bent corners, the second sidewall extends between the second and third bent corners, the floor is adjacent to the base and the third bent corner and is laterally surrounded by the third bent corner and the cavity is shaped by the first and second sidewalls and the floor, has the first angle relative to the floor at the first sidewall and the second angle relative to the floor at the second sidewall.

20. The assembly of claim 11, wherein the cavity has a larger diameter at its entrance than at its floor.

21. The assembly of claim 11, wherein the cavity has a diameter that increases as it extends in the first vertical direction from the third bent corner to the second bent corner and is constant as it extends in the first vertical direction from the second bent corner to the first bent corner.

22. The assembly of claim 11, wherein the first angle is about 90 degrees and the second angle is about 120 degrees.

23. The assembly of claim 11, wherein the base covers the bump, the flange, the adhesive and the conductive trace in the second vertical direction and extends to the peripheral edges of the assembly.

24. The assembly of claim 11, wherein the base covers the flange in the second vertical direction, extends laterally beyond the flange, supports the adhesive and is spaced from the peripheral edges of the assembly.

25. The assembly of claim 11, wherein the flange and the pad have the same thickness and are coplanar with one another at a surface that faces in the first vertical direction.

26. The assembly of claim 11, wherein the base and the terminal have the same thickness where closest to one another, have different thickness where the base is adjacent to the bump and are coplanar with one another at a surface that faces in the second vertical direction.

27. The assembly of claim 11, wherein the pad extends beyond the adhesive in the first vertical direction, the terminal extends beyond the adhesive in the second vertical direction and the conductive trace includes a plated through-hole in an electrically conductive path between the pad and the terminal.

28. The assembly of claim 11, wherein the bump, the base, the flange, the pad and the terminal are the same metals.

29. The assembly of claim 11, wherein the bump, the base, the flange, the pad and the terminal include a gold, silver or nickel surface layer and a buried copper core and are primarily copper.

30. The assembly of claim 11, wherein the heat spreader includes a copper core shared by the bump, the base and the flange and the conductive trace includes a copper core shared by the pad and the terminal.

31. A semiconductor chip assembly, comprising:
a semiconductor device;
an adhesive that includes an opening;
a heat spreader that includes a bump, a base and a flange, wherein (i) the bump includes first, second and third bent corners with the second bent corner between the first and third bent corners, is adjacent to the flange at the first bent corner and is spaced from the flange at the second and third bent corners, is adjacent to the base at the third bent corner and is spaced from the base at the first and second bent corners, is integral with the flange, extends from the base in a first vertical direction and extends from the flange in a second vertical direction opposite the first vertical direction, (ii) the base extends from and covers the bump in the second vertical direction and extends laterally from the bump in lateral directions orthogonal to the vertical directions, (iii) the flange extends laterally from the bump and is spaced from the base, and (iv) a cavity in the bump faces in the first vertical direction, is covered by the bump in the second vertical direction, is spaced from the base by the bump, extends across most of the bump in the vertical and lateral directions, is shaped by the first, second and third bent corners and has an entrance at the flange, a first angle between the first and second bent corners and a second angle between the second and third bent corners;

a substrate that includes a dielectric layer, wherein an aperture extends through the substrate; and a conductive trace that includes a pad and a terminal;

wherein the semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction, is electrically connected to the pad and thereby electrically connected to the terminal, and is thermally connected to the bump and thereby thermally connected to the base;

wherein the adhesive contacts the bump, the base, the flange and the dielectric layer, is sandwiched between the bump and the dielectric layer, between the flange and the dielectric layer and between the base and the flange, extends laterally from the bump to or beyond the terminal and extends to peripheral edges of the assembly;

wherein the conductive trace is located outside the cavity;

wherein the bump extends into the opening and the aperture, covers the semiconductor device in the second vertical direction and provides a recessed die paddle and a reflector for the semiconductor device; and wherein the cavity extends into the opening and the aperture.

32. The assembly of claim 31, wherein the semiconductor device is an LED chip, is electrically connected to the pad using a wire bond that extends within and outside the cavity and is thermally connected to the bump using a die attach that is located within the cavity.

33. The assembly of claim 31, wherein the adhesive contacts the conductive trace.

34. The assembly of claim 31, wherein the adhesive laterally covers and surrounds and conformally coats sidewalls of the bump.

35. The assembly of claim 31, wherein the adhesive conformally coats a surface portion of the base that is adjacent to and extends laterally from the bump and faces in the first vertical direction.

36. The assembly of claim 31, wherein the adhesive extends laterally from the bump beyond the conductive trace.

37. The assembly of claim 31, wherein the bump is coplanar with the adhesive at the base.

38. The assembly of claim 31, wherein the bump has an irregular thickness characteristic of stamping.

39. The assembly of claim 31, wherein the bump includes first and second sidewalls and a floor, the first sidewall extends between the first and second bent corners, the second sidewall extends between the second and third bent corners, the floor is adjacent to the base and the third bent corner and is laterally surrounded by the third bent corner and the cavity is shaped by the first and second sidewalls and the floor, has the first angle relative to the floor at the first sidewall and the second angle relative to the floor at the second sidewall.

40. The assembly of claim 39, wherein the cavity has a larger diameter at its entrance than at the floor.

41. The assembly of claim 40, wherein the cavity has a diameter that increases as it extends in the first vertical direction from the third bent corner to the second bent corner and is constant as it extends in the first vertical direction from the second bent corner to the first bent corner.

42. The assembly of claim 40, wherein the first angle is about 90 degrees and the second angle is about 120 degrees.

43. The assembly of claim 31, wherein the base has a first thickness where it is adjacent to the bump, a second thickness where it is adjacent to the dielectric layer that is larger than the first thickness and a flat surface that faces in the second vertical direction.

44. The assembly of claim 31, wherein the base covers the flange in the second vertical direction, extends laterally beyond the flange, supports the substrate and the adhesive and is spaced from the peripheral edges of the assembly.

45. The assembly of claim 31, wherein the flange and the pad have the same thickness and are coplanar with one another at a surface that faces in the first vertical direction.

46. The assembly of claim 31, wherein the base and the terminal have the same thickness where closest to one another, have different thickness where the base is adjacent to the bump and are coplanar with one another at a surface that faces in the second vertical direction.

47. The assembly of claim 31, wherein the pad contacts the adhesive, is spaced from the dielectric layer and extends beyond the adhesive and the dielectric layer in the first vertical direction, the terminal contacts the dielectric layer, is spaced from the adhesive and extends beyond the adhesive and the dielectric layer in the second vertical direction and the conductive trace includes a plated through-hole that extends through the adhesive and the dielectric layer in an electrically conductive path between the pad and the terminal.

48. The assembly of claim 31, wherein the bump, the base, the flange, the pad and the terminal are the same metals.

49. The assembly of claim 31, wherein the bump, the base, the flange, the pad and the terminal include a gold, silver or nickel surface layer and a buried copper core and are primarily copper.

50. The assembly of claim 31, wherein the heat spreader includes a copper core shared by the bump, the base and the flange and the conductive trace includes a copper core shared by the pad and the terminal.

51. A semiconductor chip assembly, comprising:

a semiconductor device;

an adhesive that includes an opening;

a heat spreader that includes a bump, a base and a flange, wherein (i) the bump includes first, second and third bent corners, first and second sidewalls and a floor, the second bent corner is between the first and third bent corners, the first sidewall extends between the first and second bent corners, the second sidewall extends between the second and third bent corners and the floor is adjacent to the third bent corner, and the bump is adjacent to the flange at the first bent corner and is spaced from the flange at the second and third bent corners, is adjacent to the base at the third bent corner and is spaced from the base at the first and second bent corners, is integral with the flange, extends from the base in a first vertical direction and extends from the flange in a second vertical direction opposite the first vertical direction, (ii) the base extends from and covers the bump in the second vertical direction and extends laterally from the bump in lateral directions orthogonal to the vertical directions, (iii) the flange extends laterally from the bump and is spaced from the base, and (iv) a cavity in the bump faces in the first vertical direction, is covered by the bump in the second vertical direction, is spaced from the base by the bump, extends across most of the bump in the vertical and lateral directions, is shaped by the first, second and third bent corners, the first and second sidewalls and the floor and has an entrance at the flange, a first angle relative to the floor at the first sidewall and a second angle relative to the floor at the second sidewall;

a substrate that includes a dielectric layer, wherein an aperture extends through the substrate; and a conductive trace that includes a pad, a terminal and a plated through-hole, wherein the plated through-hole in is an electrically conductive path between the pad and the terminal;

wherein the semiconductor device is located within the cavity, extends beyond the first bent corner in the second vertical direction but not the first vertical direction, extends beyond the second bent corner in the first and second vertical directions and extends beyond the third bent corner in the first vertical direction but not the second vertical direction, is electrically connected to the pad and thereby electrically connected to the terminal, and is thermally connected to the bump and thereby thermally connected to the base;

wherein the adhesive contacts the dielectric layer inside and outside the aperture, is sandwiched between the bump and the dielectric layer, between the bump and the plated through-hole, between the flange and the dielectric layer and between the base and the flange, extends laterally from the bump to or beyond the terminal and extends to peripheral edges of the assembly;

wherein the conductive trace is located outside the cavity, the pad contacts the adhesive, is spaced from the dielectric layer and extends beyond the adhesive and the dielectric layer in the first vertical direction, the terminal contacts the dielectric layer, is spaced from the adhesive and extends beyond the adhesive and the dielectric layer in the second vertical direction and the plated through-hole contacts and extends through the adhesive and the dielectric layer;

wherein the bump contacts the adhesive, is spaced from the dielectric layer, extends into the opening and the aperture, covers the semiconductor device in the second vertical direction and provides a recessed die paddle and a reflector for the semiconductor device;

wherein the base contacts the adhesive and the dielectric layer, covers the flange in the second vertical direction, extends laterally beyond the flange and extends beyond the adhesive and the dielectric layer in the second vertical direction;

wherein the flange contacts the adhesive, is spaced from the dielectric layer and extends beyond the adhesive and the dielectric layer in the first vertical direction; and wherein the cavity extends into the opening and the aperture.

52. The assembly of claim 51, wherein the semiconductor device is an LED chip, is electrically connected to the pad using a wire bond that extends within and outside the cavity and is thermally connected to the bump using a die attach that is located within the cavity.

53. The assembly of claim 51, wherein the adhesive alone can intersect an imaginary horizontal line between the bump and the dielectric layer, an imaginary horizontal line between the bump and the plated through-hole, an imaginary horizontal line between the bump and the base, an imaginary vertical line between the bump and the base, an imaginary vertical line between the pad and the dielectric layer, an imaginary vertical line between the flange and the dielectric layer and an imaginary vertical line between the flange and the base but the adhesive alone cannot intersect an imaginary line between the bump and the terminal, between the flange and the terminal, between the pad and the base or between the pad and the terminal.

54. The assembly of claim 51, wherein the bump is coplanar with the adhesive at the base, the flange is thicker than the base, the flange and the pad have the same thickness and are coplanar with one another at a surface that faces in the first vertical direction and the base and the terminal have the same thickness where closest to one another, have different thickness where the base is adjacent to the bump and are coplanar with one another at a surface that faces in the second vertical direction.

55. The assembly of claim 51, wherein the bump, the base, the flange, the pad, the terminal and the plated through-hole include a gold, silver or nickel surface layer and are primarily copper, the heat spreader includes a copper core shared by the bump, the base and the flange and the conductive trace includes a copper core shared by the pad, the terminal and the plated through-hole.

56. A semiconductor chip assembly, comprising:

an LED chip;

an adhesive that includes an opening;

a heat spreader that includes a bump, a base and a flange, wherein (i) the bump includes first, second and third bent corners with the second bent corner between the first and third bent corners, is adjacent to the flange at the first bent corner and is spaced from the flange at the second and third bent corners, is adjacent to the base at the third bent corner and is spaced from the base at the first and second bent corners, is integral with the flange, extends from the base in a first vertical direction and extends from the flange in a second vertical direction opposite the first vertical direction, (ii) the base extends from and covers the bump in the second vertical direction and extends laterally from the bump in lateral directions orthogonal to the vertical directions, (iii) the flange extends laterally from the bump and is spaced from the base, and (iv) a cavity in the bump faces in the first vertical direction, is covered by the bump in the second vertical direction, is spaced from the base by the bump, extends across most of the bump in the vertical and lateral directions, is shaped by the first, second and third bent corners and has an entrance at the flange, a first angle between the first and second bent corners and a second angle between the second and third bent corners;

a conductive trace that includes a pad and a terminal; and an encapsulant;

wherein the LED chip is located within the cavity, extends beyond the first bent corner in the second vertical direction but not the first vertical direction, extends beyond the second bent corner in the first and second vertical directions and extends beyond the third bent corner in the first vertical direction but not the second vertical direction, is electrically connected to the pad by a wire bond and thereby electrically connected to the terminal, and is thermally connected to the bump by a die attach and thereby thermally connected to the base;

wherein the encapsulant contacts the LED chip, the wire bond, the die attach and the bump in the cavity, is spaced from the conductive trace, the base and the adhesive and covers the LED chip in the first vertical direction;

wherein the adhesive contacts the bump, the base and the flange, is sandwiched between the base and the flange and extends laterally from the bump to or beyond the terminal;

wherein the die attach is located within the cavity, the wire bond extends within and outside the cavity and the conductive trace is located outside the cavity;

wherein the bump extends into the opening, covers the LED chip in the second vertical direction and provides a recessed die paddle and a reflector for the LED chip; and wherein the cavity extends into the opening.

57. The assembly of claim 56, wherein the adhesive contacts the pad, is spaced from the terminal and extends laterally from the bump beyond the terminal.

58. The assembly of claim 56, wherein the adhesive contacts the conductive trace, laterally covers and surrounds and conformally coats sidewalls of the bump and extends to peripheral edges of the assembly.

59. The assembly of claim 56, wherein the encapsulant is a color-shifting encapsulant.

60. The assembly of claim 59, wherein a transparent encapsulant contacts the color-shifting encapsulant, the flange, the pad and the wire bond outside the cavity, is spaced from the LED chip, the die attach, the base and the terminal and covers the color-shifting encapsulant, the flange and the wire bond in the first vertical direction.

61. The assembly of claim 60, wherein the color-shifting encapsulant includes silicone and phosphor and the transparent encapsulant includes silicone and excludes phosphor.

62. The assembly of claim 56, wherein the bump includes first and second sidewalls and a floor, the first sidewall extends between the first and second bent corners, the second sidewall extends between the second and third bent corners, the floor is adjacent to the base and the third bent corner and is laterally surrounded by the third bent corner and the cavity is shaped by the first and second sidewalls and the floor, has the first angle relative to the floor at the first sidewall and the second angle relative to the floor at the second sidewall.

63. The assembly of claim 56, wherein the bump is coplanar with the adhesive at the base, the flange and the pad have the same thickness and are coplanar with one another at a surface that faces in the first vertical direction and the base and the terminal have the same thickness where closest to one another, have different thickness where the base is adjacent to the bump and are coplanar with one another at a surface that faces in the second vertical direction.

64. The assembly of claim 56, wherein the pad extends beyond the adhesive in the first vertical direction, the terminal extends beyond the adhesive in the second vertical direction and a plated through-hole extends through the adhesive in an electrically conductive path between the pad and the terminal.

65. The assembly of claim 56, wherein the bump, the base, the flange, the pad and the terminal are the same metals, include a gold, silver or nickel surface layer and are primarily copper, the heat spreader includes a buried copper core shared by the bump, the base and the flange and the conductive trace includes a buried copper core shared by the pad and the terminal.

* * * * *